US010483275B2

(12) United States Patent
Tsuda

(10) Patent No.: US 10,483,275 B2
(45) Date of Patent: Nov. 19, 2019

(54) SEMICONDUCTOR DEVICE AND METHOD OF MANUFACTURING THE SAME

(71) Applicant: Renesas Electronics Corporation, Tokyo (JP)

(72) Inventor: Shibun Tsuda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/243,319

(22) Filed: Jan. 9, 2019

(65) Prior Publication Data

US 2019/0148394 A1    May 16, 2019

Related U.S. Application Data

(62) Division of application No. 15/961,334, filed on Apr. 24, 2018, now Pat. No. 10,211,216, which is a
(Continued)

(30) Foreign Application Priority Data

Jul. 8, 2016 (JP) .................................. 2016-135766

(51) Int. Cl.
*H01L 21/762* (2006.01)
*H01L 27/11568* (2017.01)
(Continued)

(52) U.S. Cl.
CPC .. *H01L 27/11568* (2013.01); *H01L 21/28282* (2013.01); *H01L 21/762* (2013.01);
(Continued)

(58) Field of Classification Search
None
See application file for complete search history.

(56) References Cited

U.S. PATENT DOCUMENTS

2005/0145926 A1   7/2005  Lee
2006/0292781 A1   12/2006  Lee
(Continued)

OTHER PUBLICATIONS

United Sates Notice of Allowance dated Oct. 5, 2018, in U.S. Appl. No. 15/961,334.
(Continued)

*Primary Examiner* — Jack S Chen
(74) *Attorney, Agent, or Firm* — McGinn I.P. Law Group, PLLC.

(57) ABSTRACT

A method of manufacturing a semiconductor device includes forming a first insulating film having a first thickness over a main surface of a semiconductor substrate and then forming a second insulating film having a second thickness larger than the first thickness over the first insulating film, sequentially processing the second insulating film, the first insulating film, and the semiconductor substrate to form a plurality of trenches and to form a plurality of projecting portions which include portions of the semiconductor substrate extending in a first direction along the main surface of the semiconductor substrate and are spaced apart from each other in a second direction orthogonal to the first direction along the main surface of the semiconductor substrate, and depositing a third insulating film over the main surface of the semiconductor substrate such that the third insulating film is embedded in the trenches.

5 Claims, 34 Drawing Sheets

Related U.S. Application Data division of application No. 15/498,547, filed on Apr. 27, 2017, now Pat. No. 9,985,043.

(51) Int. Cl.
| | |
|---|---|
| *H01L 27/088* | (2006.01) |
| *H01L 27/11573* | (2017.01) |
| *H01L 29/423* | (2006.01) |
| *H01L 29/78* | (2006.01) |
| *H01L 29/792* | (2006.01) |
| *H01L 21/28* | (2006.01) |
| *H01L 29/66* | (2006.01) |
| *H01L 27/1157* | (2017.01) |
| *H01L 21/8234* | (2006.01) |

(52) U.S. Cl.
CPC ............ *H01L 21/76224* (2013.01); *H01L 21/823431* (2013.01); *H01L 27/0886* (2013.01); *H01L 27/1157* (2013.01); *H01L 27/11573* (2013.01); *H01L 29/42344* (2013.01); *H01L 29/42348* (2013.01); *H01L 29/66833* (2013.01); *H01L 29/7851* (2013.01); *H01L 29/7856* (2013.01); *H01L 29/792* (2013.01); *H01L 29/66545* (2013.01)

(56) References Cited

U.S. PATENT DOCUMENTS

| | | |
|---|---|---|
| 2007/0241420 A1 | 10/2007 | Choi |
| 2008/0057644 A1 | 3/2008 | Kwak et al. |
| 2014/0225219 A1 | 8/2014 | Huang et al. |
| 2014/0346612 A1 | 11/2014 | Adam et al. |
| 2015/0270401 A1 | 9/2015 | Huang et al. |
| 2019/0148394 A1* | 5/2019 | Tsuda ................ H01L 29/66833 |

OTHER PUBLICATIONS

United States Office Action dated Jun. 28, 2018, in U.S. Appl. No. 15/961,334.
Notice of Allowance in U.S. Appl. No. 15/498,547 dated Jan. 31, 2018.
Office Action in U.S. Appl. No. 15/498,547 dated Oct. 5, 2017.
Extended Eurooean Search Report dated Mar. 2, 2018.

* cited by examiner

SEMICONDUCTOR DEVICE AND METHOD OF MANUFACTURING THE SAME

The present application is a Divisional Application of U.S. patent application Ser. No. 15/961,334, filed on Apr. 24, 2018, which is a Divisional Application of U.S. patent application Ser. No. 15/498,547, filed on Apr. 27, 2017, now U.S. Pat. No. 9,985,043 B2, issued on May 29, 2018, which is based on and claims priority from Japanese Patent Application No. 2016-135766, filed on Jul. 8, 2016, the entire contents of which are incorporated herein by reference.

BACKGROUND

The present invention relates to a semiconductor device and a manufacturing method thereof and can be used appropriately for a semiconductor device having, a fin-gape transistor (FINFET: Fin Field Effect Transistor) formed of a fin-shaped semiconductor portion and the manufacturing thereof.

For example, US Patent Application Publication No. 2015/0270401 (Patent Document 1) describes a FINFET in which a channel region is formed of at least two different types of semiconductor materials.

Also, US Patent Application Publication 2014/0346612 (Patent Document 2) describes a technique which forms an isolation region isolating a plurality of fins from each other by thermal oxidation, plasma oxidation, or ion implantation of oxygen. The upper surface of the isolation region has a projecting shape.

RELATED ART DOCUMENTS

Patent Documents

[Patent Document 1]
US Patent Application Publication No. 2015/0270401
[Patent Document 2]
US Patent Application Publication No. 2014/0346612

SUMMARY

With regard to a split-gate memory cell having a fin-type channel beyond a 16-nm node design, the distance between memory cells adjacent to each other is reduced, and there are concerns that the diffusion of charges through a trapping insulating film (charge storage film or charge retention film) which is continuous between the memory cells affects the reliability of the memory cells.

Other problems and novel features of the present invention will become apparent from a statement in the present specification and the accompanying drawings.

A semiconductor device according to an embodiment is provided with a plurality of fins which are portions of a semiconductor substrate extending in a first direction along a main surface of the semiconductor substrate and spaced apart from each other in a second direction orthogonal to the first direction along the main surface of the semiconductor substrate. Between the fins adjacent to each other in the second direction, a portion of an upper surface of an isolation region is at a position higher than a surface obtained by connecting a position of the upper surface of the isolation region which is in contact with a side wall of one of the fins to a position of the upper surface of the isolation region which is in contact with a side wall of the other fin. In a cross section along the second direction, the upper surface of the isolation region has a projecting shape.

A method of manufacturing the semiconductor device according to the embodiment includes the steps of forming a nitride film over the main surface of the semiconductor substrate and sequentially processing the nitride film and the semiconductor substrate to form a plurality of trenches and thus form a plurality of projecting portions which are made of portions of the semiconductor substrate extending in the first direction along the main surface of the semiconductor substrate and spaced apart from each other in the second direction orthogonal to the first direction along the main surface of the semiconductor substrate. The method of manufacturing the semiconductor device further includes the steps of depositing an oxide film over the main surface of the semiconductor substrate such that the oxide film is embedded in the trenches, planarizing an upper surface of the oxide film and an upper surface of the nitride film, removing the nitride film, and performing isotropic dry etching to recess the upper surface and a side surface of the oxide film and expose respective upper surfaces and side walls of the projecting portions from the upper surface of the oxide film. Between the projecting portions adjacent to each other in the second direction, a portion of the upper surface of the oxide film is at a position higher than a surface obtained by connecting a position of the upper surface of the oxide film which is in contact with the side wall of one of the projecting portions to a position of the upper surface of the oxide film which is in contact with the side wall of the other projecting portion. In a cross section along the second direction, the upper surface of the oxide film is formed into a projecting shape.

According to the embodiment, the reliability of the semiconductor device can be improved.

DETAILED DESCRIPTION

Figure 1:
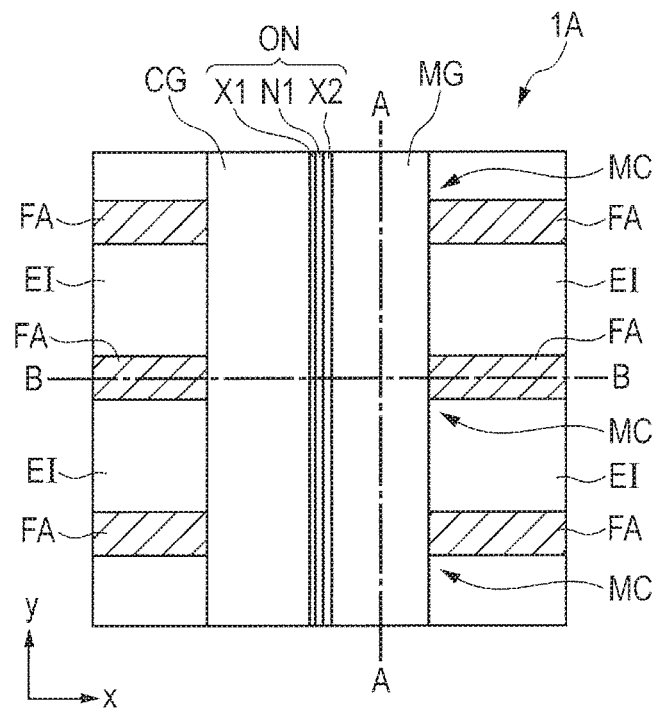
FIG. 1 is a plan view showing a memory cell region in a semiconductor device according to Embodiment 1.

In the following embodiments, if necessary for the sake of convenience, each of the embodiments will be described by being divided into a plurality of sections or embodiments. However, they are by no means irrelevant to each other unless particularly explicitly described otherwise, and one of the sections or embodiments is modifications, details, supplementary explanation, and so forth of part or the whole of the others.

Also, in the following embodiments, when the number and the like (including the number, numerical value, amount, range, and the like) of elements are mentioned, they are not limited to the specified numbers unless particularly explicitly described otherwise or unless they are obviously limited to specified numbers in principle. The number and the like of the elements may be not less than or not more than the specified numbers.

Also, in the following embodiments, it goes without saying that the components thereof (including also elements, steps, and the like) are not necessarily indispensable unless particularly explicitly described otherwise or unless the components are considered to be obviously indispensable in principle.

It will also be appreciated that, when the wording "comprised of A", "comprising A", "having A", or "including A" is used for a component A, it does not exclude a component other than the component A unless it is shown particularly explicitly that the component A is the only one component. Likewise, if the shapes, positional relationships, and the like of the components and the like are mentioned in the following embodiments, the shapes, positional relationships, and the like are assumed to include those substantially proximate or similar thereto and the like unless particularly explicitly described otherwise or unless it can be considered that they obviously do not in principle. The same shall apply in regard to the foregoing numerical value and range.

Note that, throughout all the drawings for illustrating the embodiments, members having the same functions are designated by the same reference numerals, and the repeated description thereof is omitted. In each of a cross-sectional view and a plan view, the sizes of individual portions do not correspond to those in a real device. For improved clarity of illustration, a specific portion may be shown in relatively large size. Even when a cross-sectional view and a plan view correspond to each other, for improved clarity of illustration, a specific portion may be shown in a relatively large size. Even in a cross section, hatching may be omitted for improved clarity of illustration, while even a plan view may be hatched for improved clarity of illustration.

The following will describe the embodiments of the present invention in detail on the basis of the drawings.

Embodiment 1

(Structure of Semiconductor Device)

Figure 2:
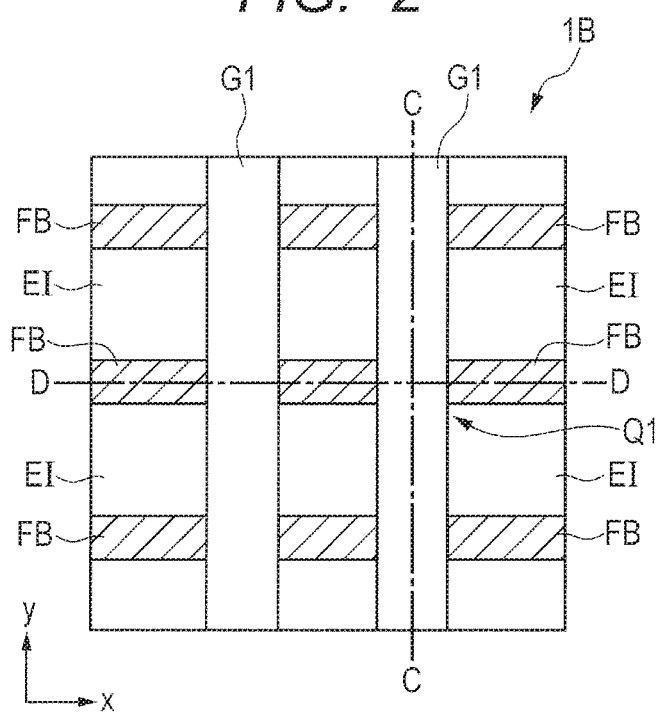
FIG. 2 is a plan view showing a logic region in the semiconductor device according to Embodiment 1.
Figure 3:
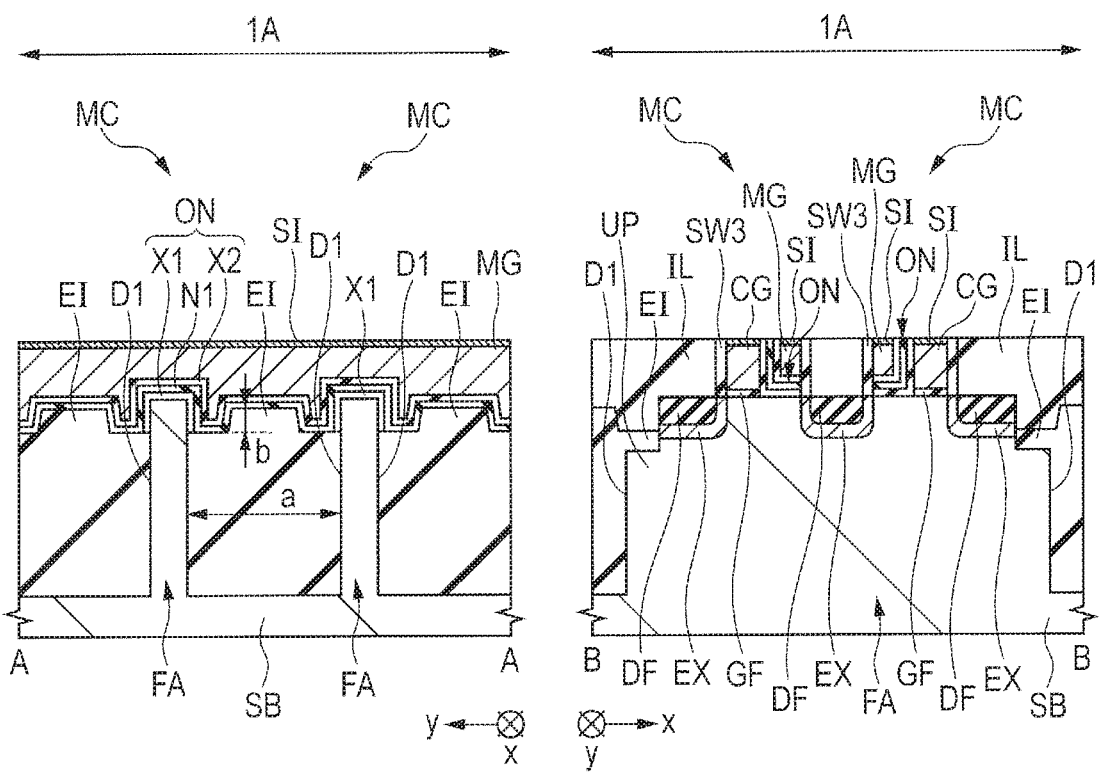
FIG. 3 is a cross-sectional view along the lines A-A and B-B in FIG. 1, which shows the memory cell region in the semiconductor device according to Embodiment 1.
Figure 4:
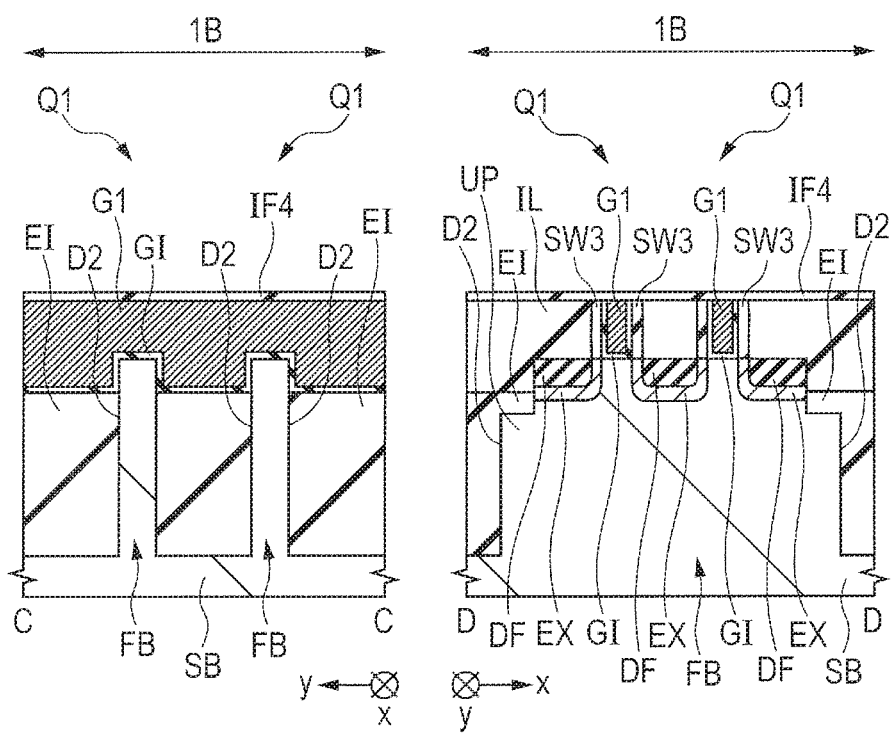
FIG. 4 is a cross-sectional view along the lines C-C and D-D in FIG. 2, which shows the logic region in the semiconductor device according to Embodiment 1.
Figure 5:
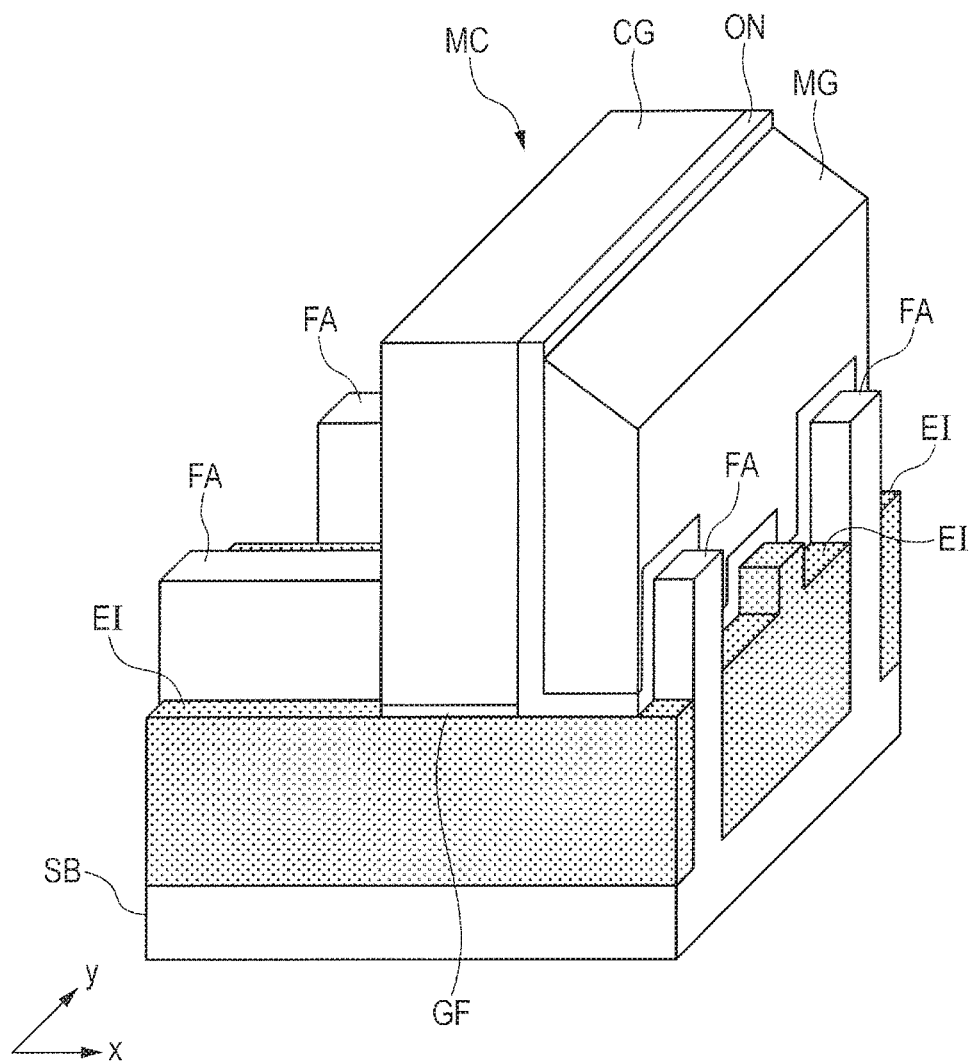
FIG. 5 is a bird's-eye view of a memory cell formed in the memory cell region in the semiconductor device according to Embodiment

A structure of a semiconductor device according to Embodiment 1 will be described using FIGS. 1 to 5. FIG. 1 is a plan view showing a memory cell region in a semiconductor device according to Embodiment 1. FIG. 2 is a plan view showing a logic region in the semiconductor device according to Embodiment 1. FIG. 3 is a cross-sectional view along the lines A-A and B-B in FIG. 1, which shows the memory cell region in the semiconductor device according to Embodiment 1. FIG. 4 is a cross-sectional view along the lines C-C and D-D in FIG. 2, which shows the logic region in the semiconductor device according to Embodiment 1. FIG. 5 is a bird's-eye view of a memory cell formed in the memory cell region in the semiconductor device according to Embodiment 1.

The cross section along the line A-A shown in FIG. 3 is the cross section along the extending direction of each of gate electrodes over fins in the memory cell region. The cross section along the line B-B shown in FIG. 3 is the cross section along the extending direction of each of the fins in the memory cell region. The cross section along the line C-C shown in FIG. 4 is the cross section along the extending direction of each of gate electrodes over fins in the logic region. The cross section along the line D-D shown in FIG. 4 is the cross section along the extending direction of each of the fins in the logic region. Note that, in FIGS. 1 and 2, the illustration of source/drain regions, interlayer insulating films, silicide layers over the respective gate electrodes, and the like is omitted. Also, in FIG. 5, the illustration of sidewalls is omitted.

In the semiconductor device according to Embodiment 1, in the same semiconductor chip, split-gate memory cells each including two FINFETs and, e.g., n-type lower-breakdown-voltage FINFETs are mounted. The memory cells are placed in the memory cell region, while the lower-breakdown-voltage FINFETs are placed in the logic region. The memory cell region and the logic region are arranged in a direction along the main surface of a semiconductor substrate.

As shown in the memory cell region 1A in each of FIGS. 1, 3, and 5, memory cells (nonvolatile storage elements) MC are formed in and over the upper parts of plate-like fins FA which are portions of a semiconductor substrate SB and formed in the upper part of the semiconductor substrate SB. As also shown in the logic region 1B in FIGS. 2 and 4, transistors Q1 as the lower-breakdown-voltage FINFETs are formed in and over the upper parts of plate-like fins FB which are portions of the semiconductor substrate SB and formed in the upper part of the semiconductor substrate SB.

Each of the fins FA and FB is a pattern of a semiconductor layer extending along an x-direction (first direction) along the main surface of the semiconductor substrate SB. The respective widths of the fins FA and FB in a y-direction (second direction) orthogonal to the x-direction and extending along the main surface of the semiconductor substrate SB are significantly smaller than the respective widths of the fins FA and FB in the x-direction. The semiconductor substrate SB is made of, e.g., monocrystalline silicon.

The plurality of fins FA and the plurality of fins FB are disposed to be arranged and spaced apart from each other in the y-direction. Each of FIGS. 1 and 2 shows only the three fins FA and the three fins FB which are arranged in the y-direction. However, a larger number of the fins FA and a larger number of the fins FB may also be disposed to be arranged in the y-direction.

In the memory cell region 1A, the plurality of fins FA may also be disposed to be arranged in the x-direction. Each of the fins FA may have any shape as long as the fin FA is a projecting portion having a length, a width, and a height. For example, a pattern meandering in plan view may also be included in the category of the fins FA. The fins FA may also be disposed in any arrangement. Likewise, in the logic region 1B, the plurality of fins FB may also be disposed to be arranged in the x-direction. Each of the fins FB may have any shape as long as the fin FB is a projecting portion having a length, a width, and a height. For example, a pattern meandering in plan view may also be included in the category of the fins FB. The fins FB may also be disposed in any arrangement.

Between the plurality of fins FA, trenches D1 formed in the upper surface of the semiconductor substrate SB are formed. Between the plurality of fins FB, trenches D2 formed in the upper surface of the semiconductor substrate SB are formed.

As shown in FIG. 3, the respective end portions of the two fins FA adjacent to each other in the y-direction are portions of the semiconductor substrate SB and coupled to each other by a lower pattern UP covered with an isolation regions EI. The lower pattern. UP may have any shape as long as the lower pattern UP extends from the respective end portions of the two fins FA in the y-direction and couples the fins FA to each other. Likewise, as shown in FIG. 4, the respective end portions of the two fins FB adjacent to each other in the y-direction are portions of the semiconductor substrate SB and coupled to each other by the lower pattern UP covered with the isolation regions EI. The lower pattern UP extends from the respective ends of the two fins FB in the y-direction and may have any shape as long as the lower pattern UP couples the fins FB to each other.

The respective side walls of the fins FA and the lower pattern UP coupled to the fins FA form the side walls of the trenches D1. The respective side walls of the fins FB and the lower pattern UP coupled to the fins FB form the side walls of the trenches D2. The lower pattern UP coupled to each of the fins FA and FB also need not be formed. That is, the region where the lower pattern UP is formed may also be a portion of the isolation region EI which is embedded in each of the trenches D1 and D2.

As shown in FIGS. 3 and 4, the isolation regions EI are insulating films embedded in the respective trenches D1 and D2. However, the trenches D1 and D2 are not fully filled with the isolation regions EI, and portions of the fins FA and FB project above the upper surfaces of the isolation regions EI. The respective heights of the fins FA and FB exposed from the upper surfaces of the isolation regions EI are, e.g., about 40 nm to 60 nm. The isolation regions EI cover the entire lower pattern UP. The isolation regions EI are made of, e.g., silicon dioxide.

In Embodiment 1, a plate-like semiconductor layer including an upper-layer pattern which is the pattern forming a portion of the semiconductor substrate SB in the memory cell region 1A and is exposed from the isolation region EI to extend in the x-direction and a lower-layer pattern which extends from the upper-layer pattern immediately thereunder to reach the bottom portion of the trench D1 is referred to as the fin FA. Likewise, a plate-like semiconductor layer including an upper-layer pattern which is the pattern forming a portion of the semiconductor substrate SB in the logic region and is exposed from the isolation region EI to extend in the x-direction and a lower-layer pattern which extends from the upper-layer pattern immediately thereunder to reach the bottom portion of the trench D2 is referred to as the fin FB.

That is, each of the fins is the semiconductor pattern projecting upwardly from the upper surface of the semiconductor substrate SB, which is, e.g., a projecting portion extending in the x-direction in each of FIGS. 1 and 2. A description will be given herein on the assumption that the lower pattern UP is not a portion of each of the fins FA and FB. In the respective upper surfaces of the fins FA and FB, p-type wells containing a p-type impurity (e.g., boron (B)) are formed deeper than the source/drain regions described later.

As shown in FIGS. 3 and 5, in the memory cell region 1A, the upper surface of each of the isolation regions EI has a projecting shape in a cross section along the y-direction. In other words, between the fins FA adjacent to each other in the y-direction, a portion of the upper surface of the isolation region EI is at a position higher than the position of a surface obtained by connecting the position of the upper surface of the isolation region EI which is in contact with the side wall of one of the fins FA to the position of the upper surface of the isolation region EI which is in contact with the side wall of the other fin FA.

However, when the projecting portion of the surface of each of the isolation regions EI is excessively a level difference in the upper surface of the isolating region EI is increased so that a processing process after the formation of the isolation regions EI is difficult. Accordingly, the height of the projecting portion of the upper surface of the isolation region EI is preferably, e.g., about 20 nm to 30 nm. For example, when the space between the fins FA adjacent to each other in the y-direction is a and the height of the projecting portion is b, b/a is preferably about 0.2 to 0.5. The height of the projecting portion mentioned herein is the distance from the surface obtained by connecting the position of the upper surface of the isolation region EI which is in contact with the side wall of one of the fins FA adjacent to each other in the y-direction the position the upper surface of the isolation region EI which is in contact with the side wall of the other fin FA to the highest position of the upper surface of the isolation region EI between the adjacent fins FA.

By thus forming the upper surface of each of the isolation regions EI in the memory cell region 1A into the projecting shape, the path of the trapping insulating film included in an ONO (Oxide-Nitride-Oxide) film ON described later between the memory cells MC adjacent to each other in the y-direction is longer than in the case where the upper surface of the isolation region EI has a planar shape. This can suppress the influence of charge diffusion.

On the other hand, as shown in FIG. 4, in the logic region 1B, when the space between the fins FB adjacent to each other in the y-direction is as small as, e.g., 50 nm or less, the upper surface of the isolation region EI does not have a projecting shape in a cross section along the y-direction, but is substantially planar. That is, the planarity of the upper surface of the isolation region EI in the logic region 1B is lower than the planarity of the upper surface of the isolation region EI in the memory cell region 1A.

By contrast, when the space between the fins FB adjacent to each other in the y-direction is as large as, e.g., 60 nm or more, the upper surface of the isolation region EI has a projecting shape in a cross section along the y-direction. However, in the logic region 1B, the problem of charge diffusion which may arise in the memory cell region 1A does not arise. In addition, when the upper surface of the isolation region EI has a projecting portion, the processing process after the formation of the isolation regions EI in the logic region 1B is difficult. Accordingly, in the logic region 1B, the upper surface of the isolation region EI is preferably planar.

As shown in FIGS. 1, 3, and 5, in the memory cell region 1A, the control gate electrodes CG extending in the y-direction and the memory gate electrodes MG extending in the y-direction are formed immediately over the plurality of fins FA arranged in the y-direction so as to pass over the fins FA.

The control gate electrodes CB are formed over the upper surfaces and side walls of the fins FA exposed from the upper surfaces of the isolation regions EI via gate insulating films GF. The gate insulating films GF are made of, e.g., silicon dioxide. The control gate electrodes CG are made of, e.g., polysilicon.

One of the side walls of each of the control gate electrodes CB in the x-direction is covered with a sidewall SW3 while, over the other side wall thereof, the memory gate electrode MG is formed via the ONO film ON. The sidewall SW3 is made of, e.g., silicon nitride, silicon dioxide, or a multi-layer film including silicon nitride and silicon dioxide. The ONO film ON is a multi-layer film in which a silicon dioxide film X1, a silicon nitride film N1, and a silicon dioxide film X2 are stacked in order of increasing distance from the semiconductor substrate SB and the control gate electrode CG. The memory gate electrodes MG are made of, e.g., polysilicon. The nitride silicon film N1 is the trapping insulating film (charge storage film or charge retention film). By performing an operation to the memory cell MC and thus changing the charge storage state in the silicon nitride film N1, the threshold voltage of the memory cell MC can be changed.

The memory gate electrodes MG are formed over the upper surfaces and side walls of the fins FA exposed from the upper surfaces of the isolation regions EI via the ONO films ON. That is, each of the ONO films ON has an L-shaped cross section formed continuously along the upper surfaces of the fins FA and the side walls of the control gate electrodes CG. The memory gate electrodes MG are insulated from the control gate electrodes CG and the fins FA by the ONO films ON.

The side walls of the memory gate electrodes MG in the x-direction which are not in contact with the ONO films ON are covered with the sidewalls SW3. In the respective upper surfaces of the control gate electrodes CG and the memory gate electrodes MG, silicide layers SI are formed. The silicide layers SI are made of, e.g., nickel silicide (NiSi) or cobalt silicide (CoSi). The silicide layers SI are provided so as to reduce the coupling resistance between contact plugs (not shown) coupled to the respective upper surfaces of the control gate electrodes CG and the memory gate electrodes MG and the control gate electrodes CG or the memory gate electrodes MG.

Immediately over each of the fins FA in the memory cell region 1A, a pair of patterns each including the control gate electrode CG and the memory gate electrode MG which are adjacent to each other via the ONO film ON are formed to be arranged in the x-direction. The pair of patterns are spaced apart from each other. To the respective facing surfaces of the two control gate electrodes CG included in the pair of patterns, the memory gate electrodes MG are adjacent.

In the upper surface of each of the fins FA on both lateral sides of the patterns in the x-direction, the pair of source/drain regions are formed. The source/drain regions are formed of two n-type semiconductor regions in which an n-type impurity (e.g., phosphorus (P) or arsenic (As)) is introduced, i.e., extension regions EX and diffusion layers DF. The extension regions EX have n-type impurity concentrations lower than those of the diffusion layers DF. The extension regions EX formed herein are deeper than the diffusion layers DF. The extension regions EX are disposed at positions closer to the positions immediately under the control gate electrodes CG and the memory gate electrodes CG than the diffusion layers DF adjacent thereto. Thus, each of the source/drain regions has an LDD (Lightly Doped Drain) structure including the extension region EX having a lower impurity concentration and the diffusion layer DF having a higher impurity concentration.

Each of the control gate electrodes CG and the pair of source/drain regions formed in the upper surface of the fin FA on both sides of the control gate electrode CG are included in a first transistor (control transistor) having a MISFET (Metal insulator Semiconductor Field Effect Transistor) structure. On the other hand, each of the memory gate electrodes MG and the pair of source/drain regions formed in the upper surface of the fin FA on both sides of the memory gate electrode MG are included in a second transistor (memory transistor) having the MISFET structure. Each one of the memory cells MC according to Embodiment 1 includes the first and second transistors sharing the source/drain regions. That is, the memory cell MC has the control gate electrode CG, the memory gate electrode MG, the ONO film ON, the drain region in the vicinity of the control gate electrode CG, and the source region in the vicinity of the memory gate electrode MG.

Over each one of the fins FA, the two memory cells MC are formed. The two memory cells MC share the common source region. The upper surface of the fin FA immediately under each of the control gate electrode CG and the memory gate electrode MG includes a channel region where a channel is formed during an operation to the memory cell MC. The channel is a fin-type channel. Each of the memory cells MC is a nonvolatile memory which is electrically rewritable in each of a write operation and an erase operation.

As shown in FIGS. 2 and 4, in the logic region 1B, over the plurality of fins FB arranged in the y-direction, gate electrodes G1 extending in the y-direction are formed so as to pass over the fins FB.

The gate electrodes G1 are formed over the upper surfaces and side walls of the fins FB exposed from the upper surfaces of the isolation regions EI via respective gate insulating films GI.

The gate insulating films GI also continuously cover the bottom surfaces and both side walls of the gate electrodes G1. That is, the surfaces of the gate electrodes G1 other than the upper surfaces thereof are surrounded by the gate insulating films GI. Note that, between the gate insulating films GI and the fins FB, e.g., silicon dioxide films may also be formed as portions of the gate insulating films GI. As each of the gate insulating films GI, a metal oxide film such as, e.g., a hafnium oxide ($HfO_2$) film, a zirconium oxide ($ZrO_2$) film, an aluminum oxide $Al_2O_3$) (film, a tantalum oxide ($Ta_2O_5$) film, or a lanthanum oxide ($La_2O_3$) film can be used. The gate insulating film GI is a so-called high-k film having a dielectric constant higher than that of a silicon dioxide film.

The gate electrodes G1 are made of, e.g., aluminum (Al). Each of the gate electrodes G1 may also have a multi-layer structure including, e.g., titanium aluminum (TiAl) and aluminum (Al) which are stacked in this order over the semiconductor substrate SB.

The both side walls of the gate electrodes G1 in the x-direction are covered with the sidewalls SW3. In the upper surfaces of the gate electrode G1, the silicide layers SI are not formed. When the gate electrodes G1 are coupled to the contact plugs (not shown) provided thereover, each of the gate electrodes G1 made of the metal film has a resistance lower than that of a silicon film. This allows the gate electrode G1 to be coupled in an ohmic manner to the contact plug without intervention of the silicide layer SI.

Immediately over the fins FB in the logic region 1B, the pair of gate electrodes G1 are formed to be arranged in the x-direction. The pair of gate electrodes G1 are spaced apart from each other.

In the upper surfaces of the fins FB on both lateral sides of each of the gate electrodes G1 in the x-direction, the pair of source/drain regions are formed. Each of the source/drain regions includes two n-type semiconductor regions in which an n-type impurity (e.g., phosphorus (P) or arsenic (As)) is introduced, i.e., the extension region EX and the diffusion layer DF, similarly to each of the source/drain regions in the memory cell region 1A. Note that the impurity concentration of each of the source/drain regions in the logic region 1B is lower than the impurity concentration of each ref the source/drain regions in the memory cell region 1A.

Each of the gate electrodes G1 and the pair of source/drain regions formed in the upper surface of the fin FB on both sides of the gate electrode G1 are included in the lower-breakdown-voltage transistor Q1 having a MISFET structure.

Over each one of the fins FB, the two transistors Q1 are formed. The upper surface of the fin FB immediately under each of the gate electrodes G1 includes a channel region where a channel is formed during the operation of the transistor Q1. The channel is a fin-type channel. The two transistors Q1 each having the pair of source/drain regions share one of the pair of source/drain regions therebetween.

In Embodiment 1, each of the first and second transistors having the portions of the fins FA as the channel regions and formed in and over the upper part of each of the fins FA and the transistors Q1 is referred to as a FINFET. Each of the first and second transistors included in the memory cells MC is driven with a voltage higher than that for driving each of the lower-breakdown-voltage transistors Q1 included in a logic circuit and is therefore required to have a withstand performance higher than that required of the transistor Q1.

As also shown in FIGS. 3 and 4, in the memory cell region 1A and the logic region 1B, the upper surfaces of the isolation regions EI, the respective upper surfaces and side walls of the fins FA and FB, the side walls of the sidewalls SW3, and the like are covered with interlayer insulating films IL. The interlayer insulating films IL are made of, e.g., silicon dioxide. Note that, between the interlayer insulating films IL and the upper surfaces of the isolation regions EI, the respective upper surfaces and side walls of the fins FA and FB, and the side walls of the sidewalls SW3, thin insulating films are formed, though not shown. The insulating films are made of, e.g., silicon nitride. The respective upper surfaces of the interlayer insulating films IL, the sidewalls SW3, the gate electrodes G1, the ONO films ON, the control gate electrodes CG, and the memory gate electrodes MG are planarized at generally the same plane.

The respective upper portions of the interlayer insulating films IL, the memory cells MC, and the transistors Q1 are covered with interlayer insulating films, though not shown. Also, the plurality of contact plugs are formed to extend through the interlayer insulating films IL and the interlayer insulating films over the interlayer insulating film IL. The contact plugs are electrically coupled to the gate electrodes G1, the control gate electrode CG, the memory gate electrodes MG, and the source/drain regions, though not shown. Also, over the contact plugs, wires are formed, though not shown.

<Characteristic Features and Effects of Semiconductor Device>

The main characteristic feature of the semiconductor device according to Embodiment 1 is that the upper surface of each of the isolation regions EI in the memory cell region 1A is formed into a projecting shape.

In the split-gate memory cell MC beyond a 16-nm node design, the distance between the memory cells MC adjacent to each other in the y-direction is reduced to reduce the distance between the respective ONO films ON of the memory cells MC adjacent to each other in the y-direction. Consequently, charges are diffused through the silicon nitride film N1 as the trapping insulating film included in the ONO film ON to conceivably affect the reliability of each of the memory cells MC.

However, in the semiconductor device according to Embodiment 1, the upper surface of each of the isolation regions EI in the memory cell region 1A is formed into the projecting shape to elongate the path of the silicon nitride film N1 (trapping insulating film) between the memory cells MC adjacent to each other in the y-direction. That is, when the projecting portion is formed, the path of the silicon nitride film N1 is longer and a charge diffusion distance is longer than when the projecting portion is not formed. This can suppress a data variation via the path of the silicon nitride film N1 between the memory cells MC adjacent to each other in the y-direction. Therefore, the reliability of the semiconductor device can be improved.

(Operation of Semiconductor Device)

A description will be given mainly of the nonvolatile memory included in the semiconductor device according to Embodiment 1.

The memory cell according to Embodiment 1 has a MISFET structure. A charge storage state in a trapping insulating film in the gate electrode of a MISFET is used as stored information and read as the threshold voltage of the MISFET. The trapping insulating film refers to an insulating film capable of storing charges therein, and examples thereof include a silicon nitride film. By injection/release of charges into/from such a charge storage region, the threshold of the MISFET is shifted to allow the MISFET to operate as a storage element. Examples of a nonvolatile semiconductor storage device using a trapping insulating film include a split-gate MONOS (Metal-Oxide-Nitride-Oxide-Semiconductor) memory, such as the memory cell according to Embodiment 1.

Examples of an operation method for performing a "Write Operation" and an "Erase Operation" to a memory cell include a SSI (Source Side Injection) method, a BTBT (Band To Band Tunneling) method, and a FN (Fowler Nordheim) method.

The SSI method can be regarded as an operation method which injects hot electrons into a trapping insulating film to perform a write operation to a memory cell. The BTBT method can be regarded as an operation method which injects hot holes into a trapping insulating film to perform an erase operation to a memory cell. The FN method can be regarded as an operation method which uses the tunneling of electrons or holes to perform a write operation or an erase operation. In other words, a write operation in accordance with the FN method can be regarded as an operation method which injects electrons into the trapping insulating film using a FN tunnel effect to perform a write operation to the memory cell, while an erase operation in accordance with the FN method can be regarded as an operation method which injects holes into the trapping insulating film using the FN tunnel effect to perform an erase operation to the memory cell.

The following will describe the case where a write operation is performed in accordance with the SSI method and an erase operation is performed in accordance with the FN method. That is, the injection of electrons into a trapping insulating film (e.g., silicon nitride film N1 as the charge storage portion in the insulating ONO film ON shown in FIG. 3) is defined as a "Write" operation, and the injection of holes into the trapping insulating film is defined as an "Erase" operation.

In the write operation in accordance with the SSI method, write operation voltages are applied to the individual portions of the selected memory cell to which the write operation is to be performed to inject hot electrons into the trapping insulating film of the selected memory cell and thus perform the write operation.

At this time, hot electrons are generated in the channel region (between the source/drain regions) under the space between the two gate electrodes (memory gate electrode MG and control gate electrode CG) and injected into the trapping insulating film under the memory gate electrode MG. The injected hot electrons are trapped by the trap level in the trapping insulating film, resulting in an increase in the threshold voltage of the selected transistor. That is, the selected transistor is brought into a written state.

An erase operation in accordance with the FN method is performed by applying erase operation voltages to the individual portions of the selected memory cell to which the erase operation is to be performed and causing the tunneling of holes from the memory gate electrode MG and the injection thereof into the trapping insulating film in the selected memory. At this time, the holes are injected from the memory gate electrode MG into the trapping insulating film by FN tunneling (under the FN tunnel effect) and trapped by the trap level in the trapping insulating film, resulting in a reduction in the threshold voltage of the selected transistor. That is, the selected transistor is brought into the erased state.

During a read operation, read operation voltages are applied to the individual portions of the selected memory cell to which the read operation is to be performed. By setting the voltage to be applied to the memory gate electrode MG during the read operation to a value between the threshold voltage in the written state and the threshold voltage in the erased state, the written state or the erased state can be determined.

(Manufacturing Method of Semiconductor Device)

Figure 6:
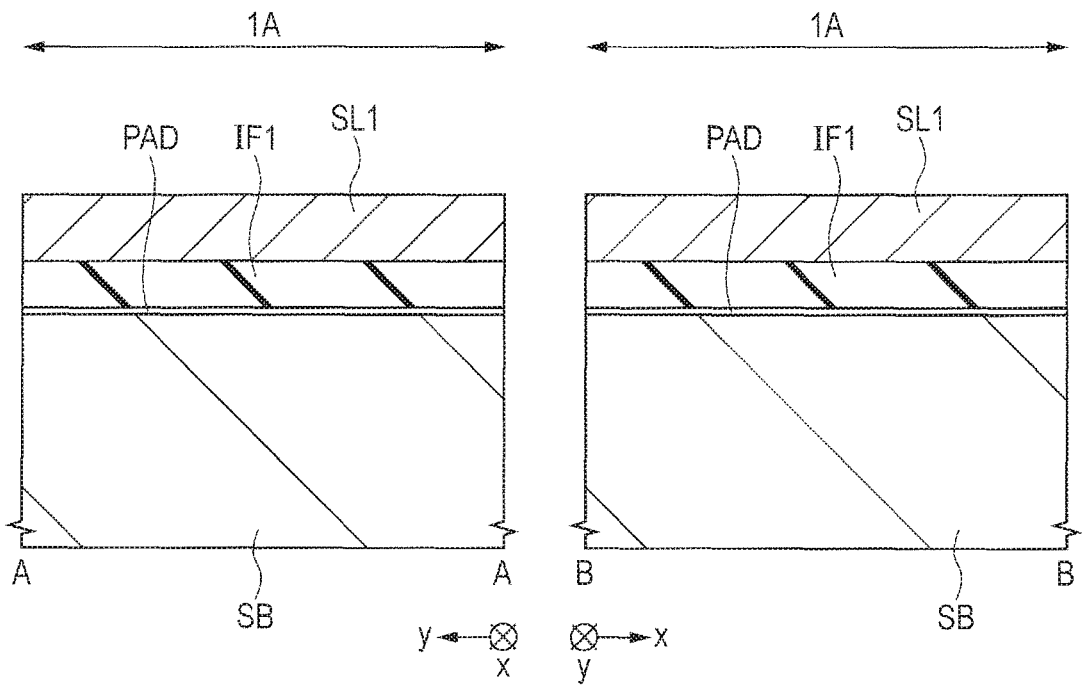
FIG. 6 is a cross-sectional view along the lines A-A and B-B in FIG. 1, which illustrates the manufacturing process of the semiconductor device (memory cell region) according to Embodiment 1.
Figure 57:
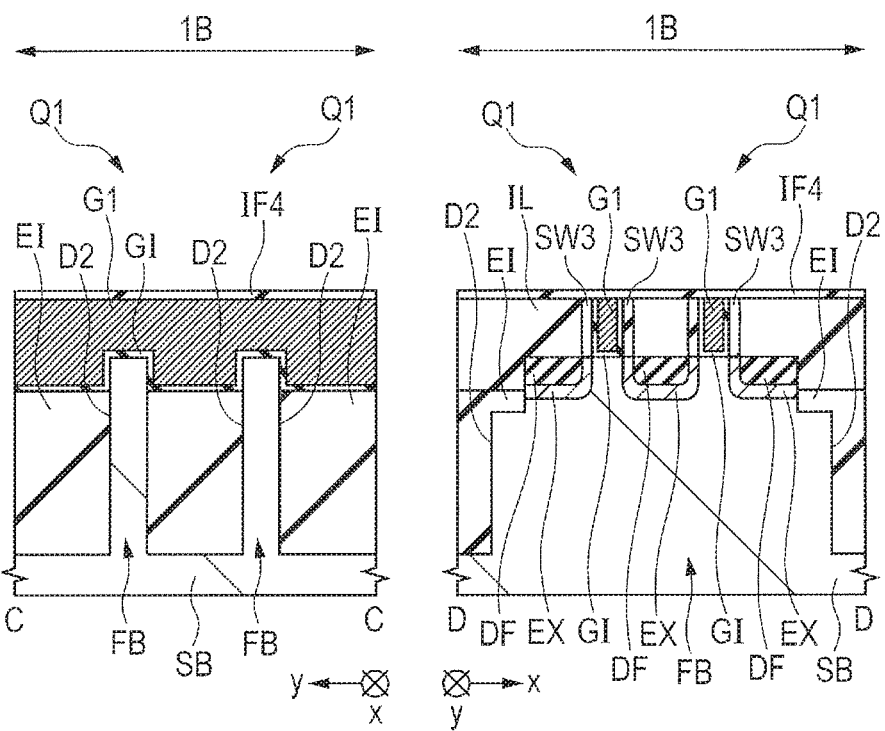
FIG. 57 is a cross-sectional view illustrating the manufacturing process of the semiconductor device, which is subsequent to FIG. 55.

A description will be given of a manufacturing method of the semiconductor device according to Embodiment 1 using FIGS. 6 to 57. FIGS. 6 to 57 are cross-sectional views illustrating the manufacturing method of the semiconductor device according to Embodiment 1.

The even-numbered ones of FIGS. 6 to 22 and FIGS. 28 to 56 are cross-sectional views along the lines A-A and B-B in the memory cell region shown in FIG. 1. The odd-numbered ones of FIGS. 7 to 23 and FIGS. 29 to 57 are cross-sectional views along the lines C-C and D-D in the logic region shown in FIG. 2. FIGS. 24 to 27 are cross-sectional views along the line A-A in the memory cell region shown in FIG. 1.

Figure 7:
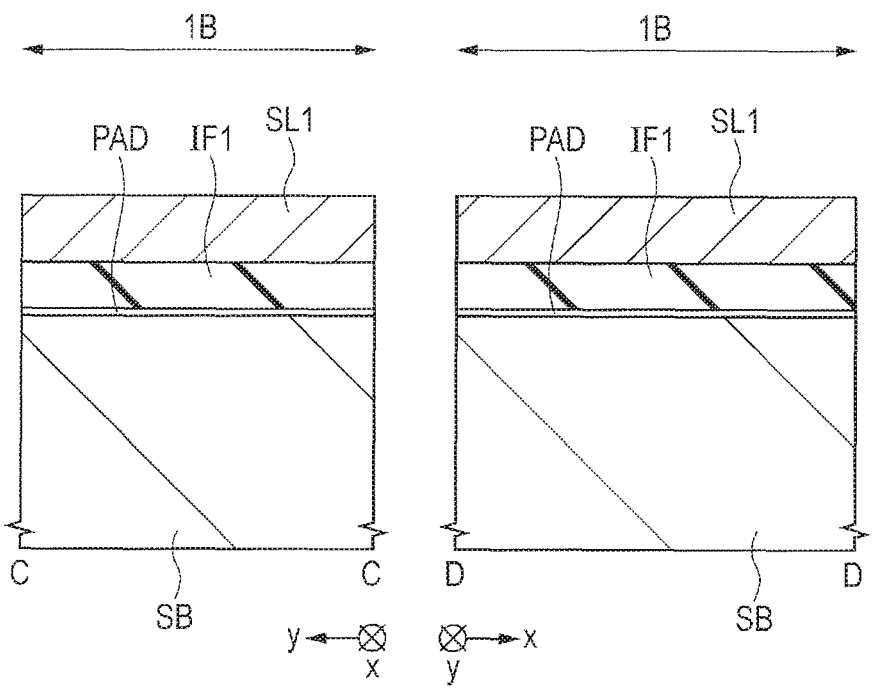
FIG. 7 is a cross-sectional view along the lines C-C and D-D in FIG. 2, which illustrates the manufacturing process of the semiconductor device (logic region) according to Embodiment 1.

First, as shown in FIGS. 6 and 7, the semiconductor substrate SB is provided and, over the semiconductor substrate SB, an oxide film PAD is formed using, e.g., a thermal oxidation method. The oxide film PAD is made of, e.g., silicon dioxide and has a thickness of, e.g., about 10 nm. Subsequently, over the oxide film PAD, an insulating film IF1 is formed using, e.g., a CVD (Chemical Vapor Deposition) method. The insulating film IF1 is made of, e.g., silicon nitride and has a thickness of, e.g., about 90 nm to 120 nm. Subsequently, over the insulating film IF1, an amorphous silicon film SL1 is formed using, e.g., a CVD method. The amorphous silicon film SL1 has a thickness of, e.g., about 160 nm.

Figure 8:
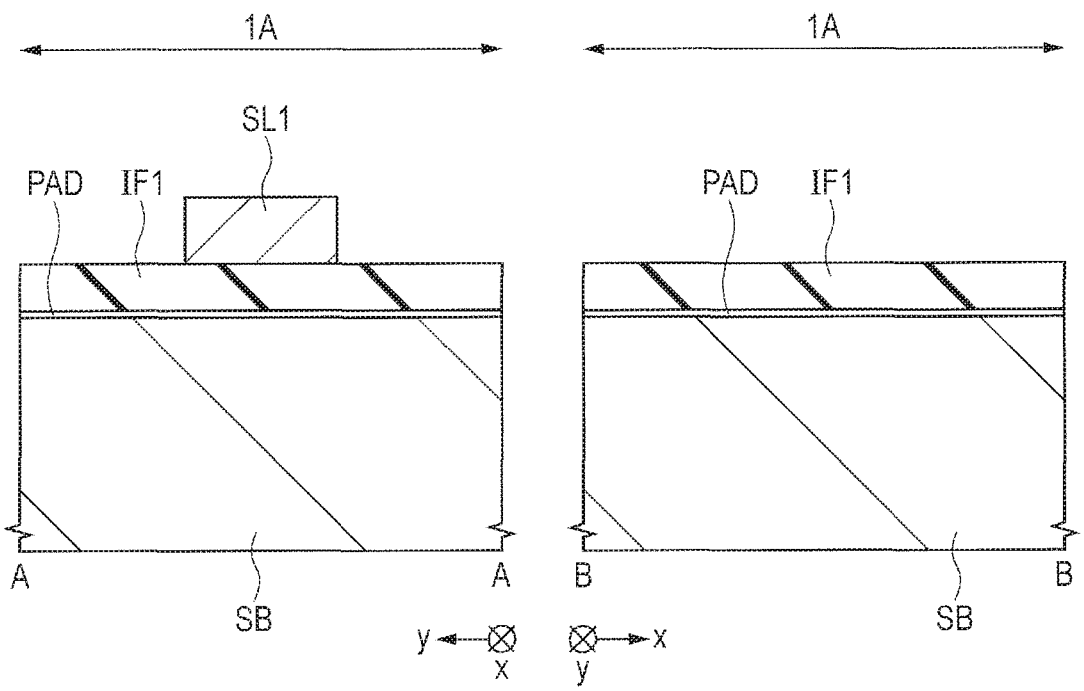
FIG. 8 is a cross-sectional view illustrating the manufacturing process of the semiconductor device, which is subsequent to FIG. 6.
Figure 9:
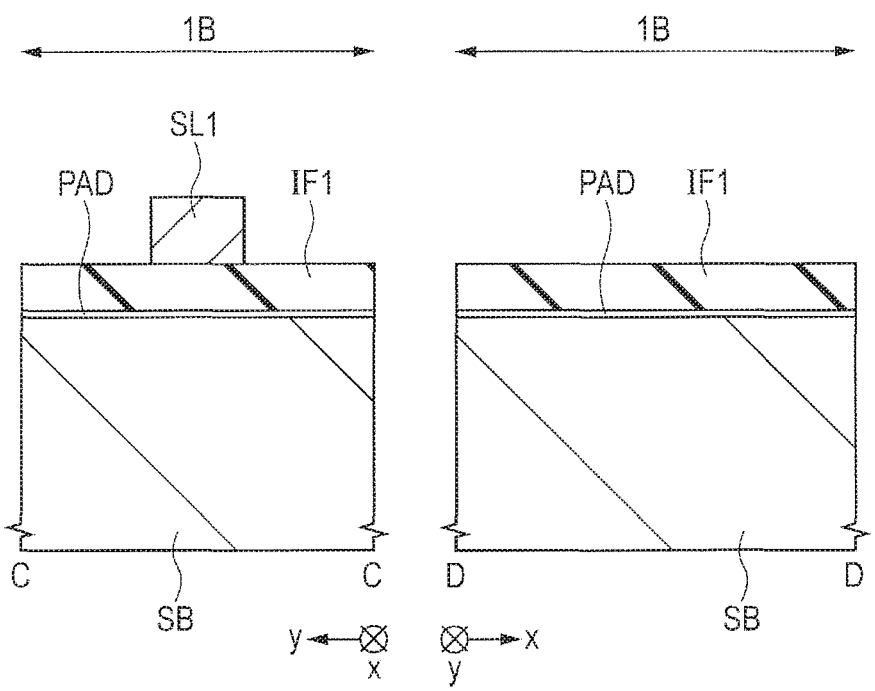
FIG. 9 is a cross-sectional view illustrating the manufacturing process of the semiconductor device, which is subsequent to FIG. 7.

Next, as shown in FIGS. 8 and 9, the amorphous silicon film SL1 is processed by dry etching using a resist pattern as a mask. As a result, the amorphous silicon film SL1 has a rectangular shape extending in the x-direction in plan view. Each of FIGS. 8 and 9 shows a pattern of the amorphous silicon film SL1 in each of the memory cell region 1A and the logic region 1B. However, in each of the memory cell region 1A and the logic region 1B including the regions not shown, a plurality of the amorphous silicon films SL1 are disposed in rows and columns in plan view. The width of each of the amorphous silicon films SL1 in the y-direction in the memory cell region 1A is larger than the width of each of the amorphous silicon films SL1 in the y-direction in the logic region 1B.

Figure 10:
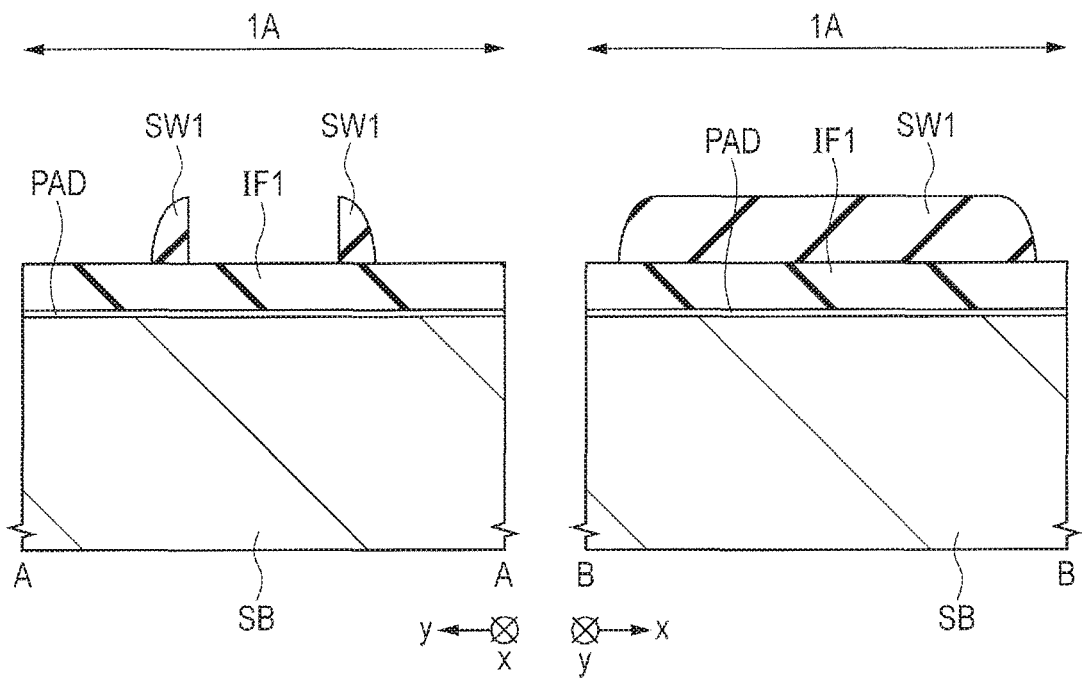
FIG. 10 is a cross-sectional view illustrating the manufacturing process of the semiconductor device, which is subsequent to FIG. 8.
Figure 11:
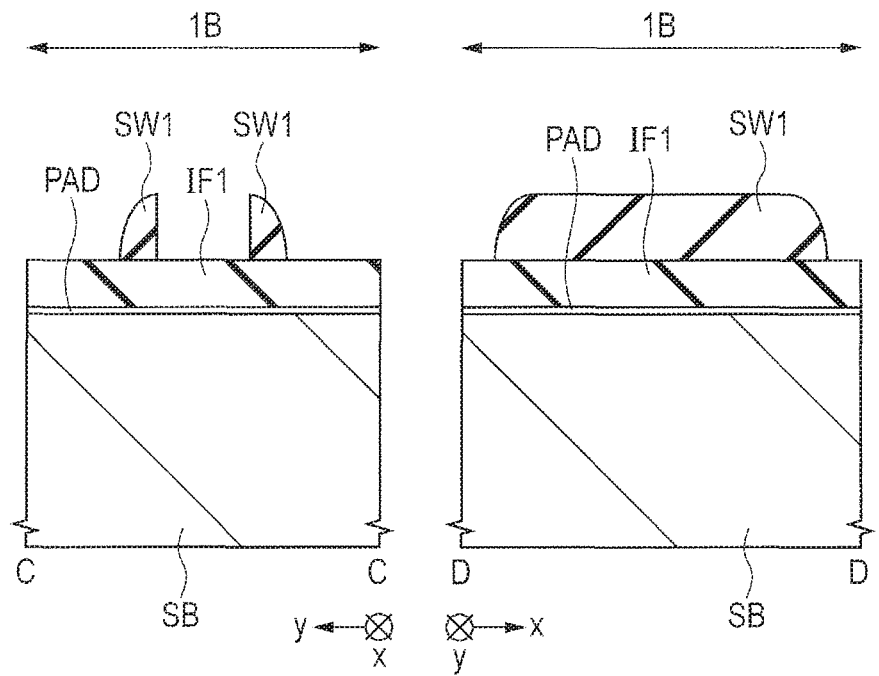
FIG. 11 is a cross-sectional view illustrating the manufacturing process of the semiconductor device, which is subsequent to FIG. 9.

Next, as shown in FIGS. 10 and 11, over the amorphous silicon film SL1 and the insulating film IF1, a silicon dioxide film is deposited using, e.g., a CVD method and then etched back to form sidewalls SW1 made of silicon dioxide. The width of each of the sidewalls SW1 in the y-direction is, e.g., about 20 nm to 50 nm. That is, in the etch-back process, the upper surface of the amorphous silicon film SL1 and the upper surface of the insulating film IF1 are exposed.

Subsequently, the amorphous silicon film SL1 is removed by, e.g., wet etching. As a result, over the insulating film IF1 located in each of the memory cell region 1A and the logic region 1B, the sidewalls SW1 covering the side walls of the amorphous silicon films SL1 and having rectangular frame shapes in plan view are left.

Figure 12:
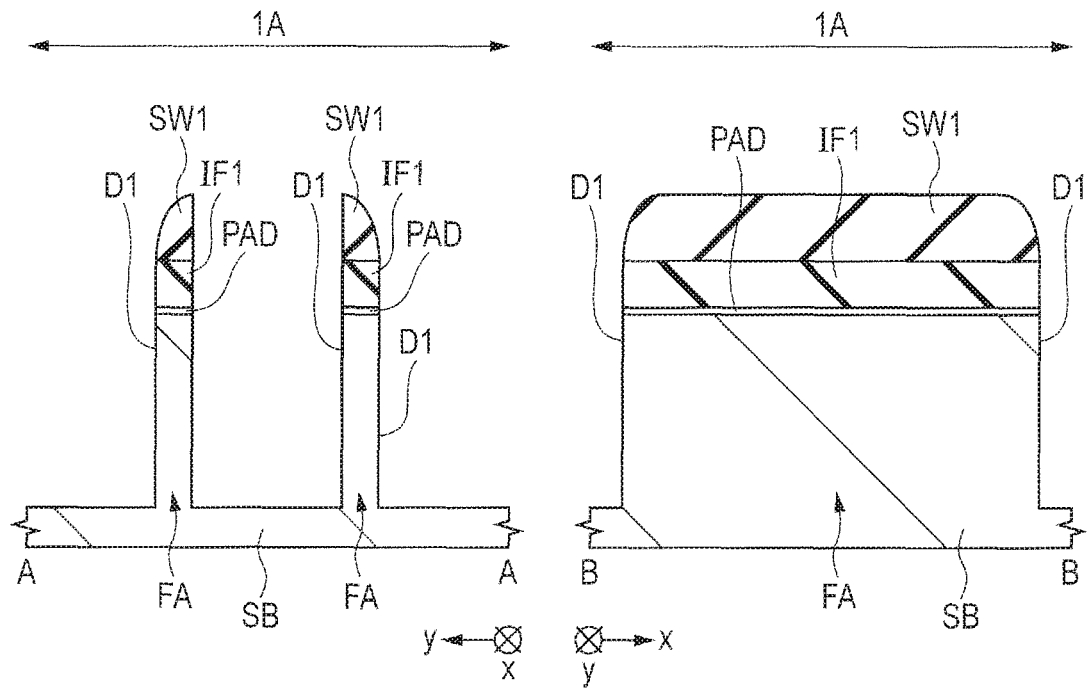
FIG. 12 is a cross-sectional view illustrating the manufacturing process of the semiconductor device, which is subsequent to FIG. 10.
Figure 13:
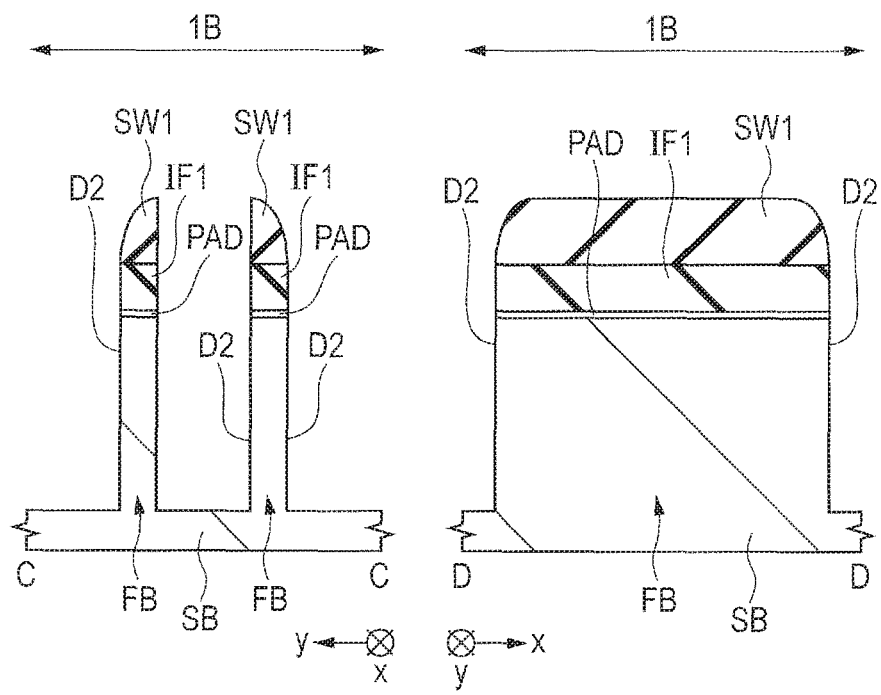
FIG. 13 is a cross-sectional view illustrating the manufacturing process of the semiconductor device, which is subsequent to FIG. 11.

Next, as shown in FIGS. 12 and 13, by dry etching using the sidewalls SW1 as a mask, the insulating film IF1, the oxide film PAD, and portions of the upper surface of the semiconductor substrate SB are processed. Thus, in the memory cell region 1A, the fins FA made of portions of the semiconductor substrate SB including the upper surface thereof and the trenches D1 around the fins FA are formed while, in the logic region 1B, the fins FB made of portions of the semiconductor substrate SB including the upper surface thereof and the trenches D2 around the fins FB are formed Each of the trenches D1 and S2 has a depth of, e.g., about 120 nm to 250 nm.

That is, by processing the insulating film IF1 exposed from the sidewalls SW1 and portions of the upper surface of the semiconductor substrate SB in the memory cell region 1A, the plate-like fins FA projecting upwardly from the upper surface of the semiconductor substrate SB are formed plate-like pattern as a portion of the upper surface of the semiconductor substrate SB includes the two fins FA extending in the x-direction and has an annular structure which is rectangular in plan view.

Also, by processing the insulating film IF1 exposed from the sidewalls SW1 and portions of the upper surface of the semiconductor substrate SB in the logic region 1B, the plate-like fins FB projecting upwardly from the upper surface of the semiconductor substrate SB are formed. The plate-like pattern as the portion of the upper surface of the semiconductor substrate SB includes the two fins FB extending in the x-direction and has an annular structure which is rectangular in plan view.

Figure 14:
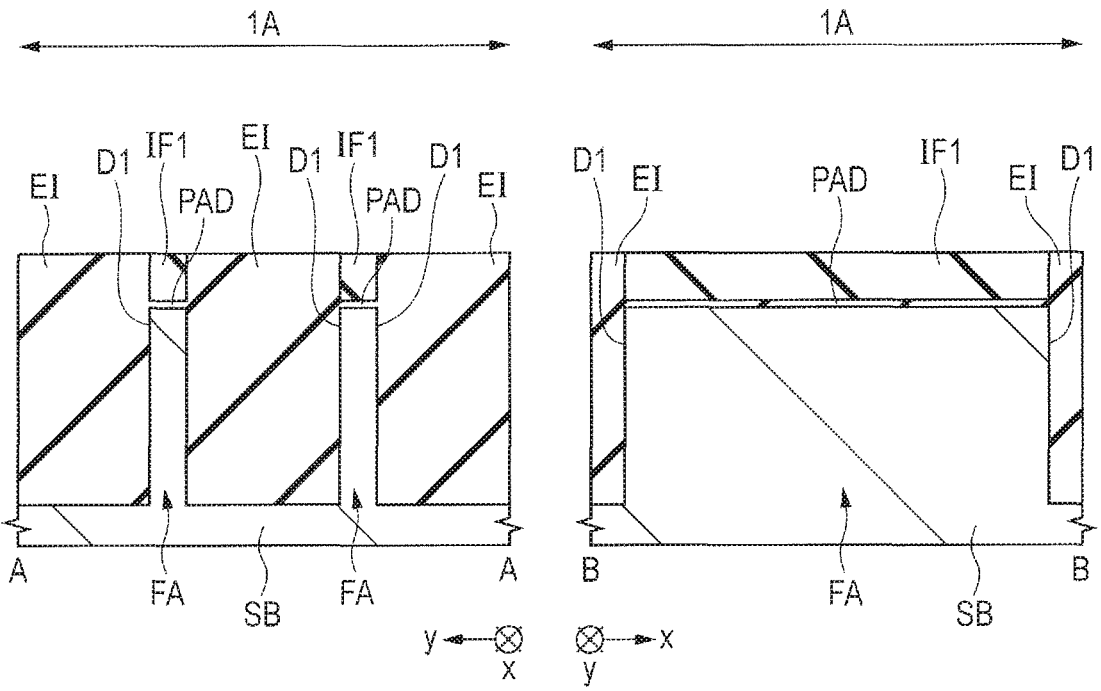
FIG. 14 is a cross-sectional view illustrating the manufacturing process of the semiconductor device, which is subsequent to FIG. 12.
Figure 15:
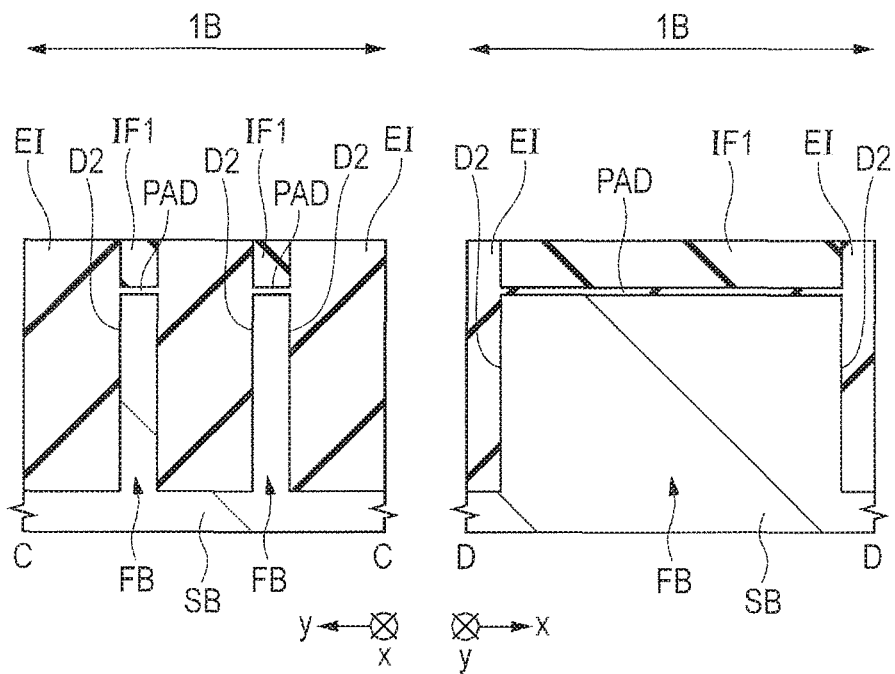
FIG. 15 is a cross-sectional view illustrating the manufacturing process of the semiconductor device, which is subsequent to FIG. 13.

Next, as shown in FIGS. 14 and 15, an insulating film is embedded in each of the trenches D1 and D2 using, e.g., a CVD method. The insulating film is made of, e.g., silicon dioxide. Then, using, e.g., a CMP (Chemical Mechanical Polishing) method, the insulating film and the sidewalls SW1 are polished. This exposes the upper surface of the insulating film IF1 in each of the memory cell region 1A and the logic region 1B and planarizes the upper surface of the insulating film IF1 and the upper surface of the foregoing insulating film embedded in each of the trenches D1 and D2. By the polishing, the sidewalls SW1 are removed. The foregoing insulating film embedded in each of the trenches D1 and D2 forms the isolation region EI.

Figure 16:
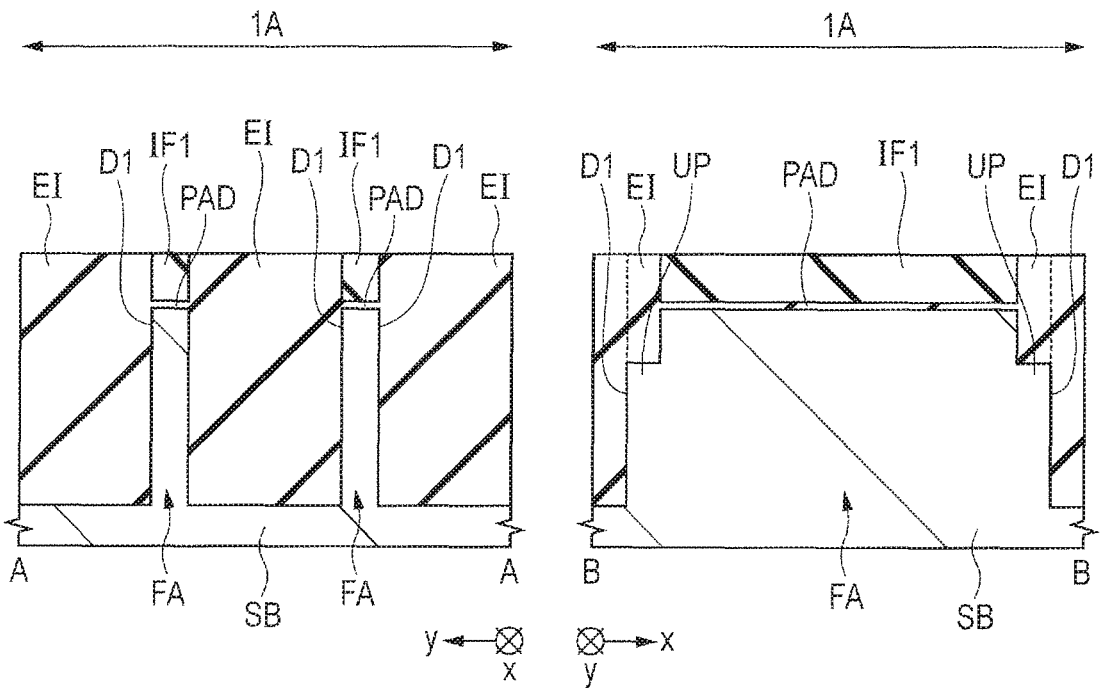
FIG. 16 is a cross-sectional view illustrating the manufacturing process of the semiconductor device, which is subsequent to FIG. 14.
Figure 17:
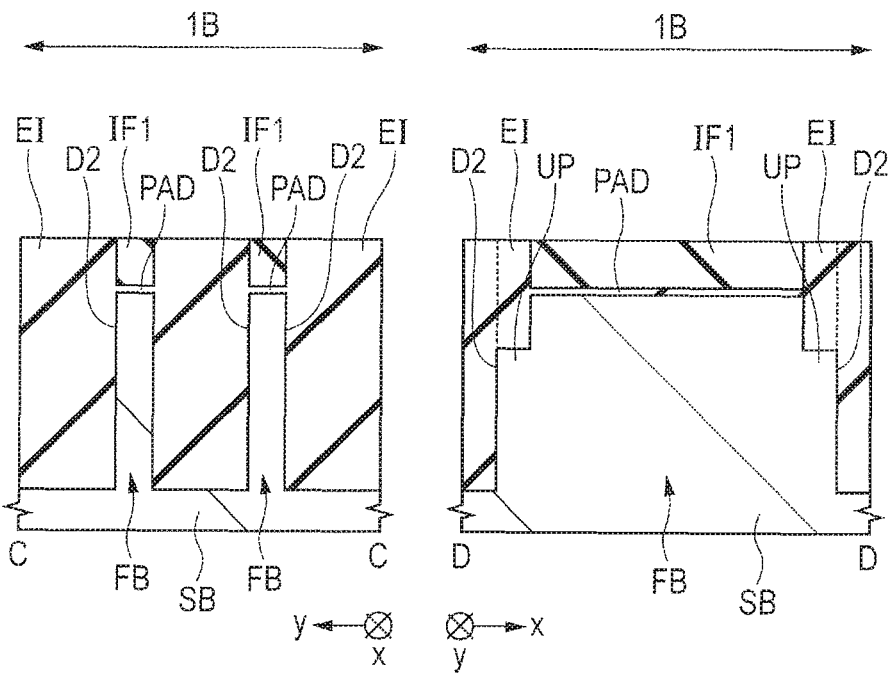
FIG. 17 is a cross-sectional view illustrating the manufacturing process of the semiconductor device, which is subsequent to FIG. 15.

Next, as shown in FIGS. 16 and 17, by dry etching using a resist pattern as a mask, portions of the insulating film IF1 exposed from the upper surfaces of the isolation regions EI and portions of the plate-like pattern including the upper surface of the semiconductor substrate SB are removed.

That is, in the memory cell region 1A, e.g., the portions of the plate-like pattern having the rectangular annular structure which extend in the y-direction, i.e., the portions coupling the respective end portions of the two fins FA arranged in the y-direction are removed by processing. As a result, portions of the upper part of the pattern extending in the y-direction and forming the plate-like pattern are removed. In this step, in the logic region 1B, e.g., the portions of the plate-like pattern having the rectangular annular structure which extend in the y-direction, i.e., the portions coupling the respective end portions of the two fins FE arranged in the y-direction are similarly removed by the processing. As a result, portions of the upper part of the pattern extending in the y-direction and forming the plate-like pattern are removed.

Thus, the lower pattern UP coupling the respective end portions of the fins FA adjacent to each other in the y-direction is formed. Likewise, the lower pattern UP coupling the respective end portions of the fins FB adjacent to each other in the y-direction is formed. The pattern to be removed is arbitrary and, by the removal step, the arbitrary fins FA and FB for finally forming a circuit are formed.

Subsequently, in the regions from which portions of the insulating film IF1 and portions of the plate-like patterns have been removed in the foregoing step, using a CVD method or the like, an insulating film made of, e.g., silicon dioxide is embedded. Then, using, e.g., a CMP method, polishing is performed to planarize the upper surface of the insulating film and expose the upper surface of the insulating film IF1.

Note that, in FIGS. 16 and 17, the boundary between the insulating film and the insulating film embedded in each of the trenches D1 and D2 in the step described using FIGS. 14 and 15 is shown by the dotted line. These insulating films form the isolation regions EI.

Figure 18:
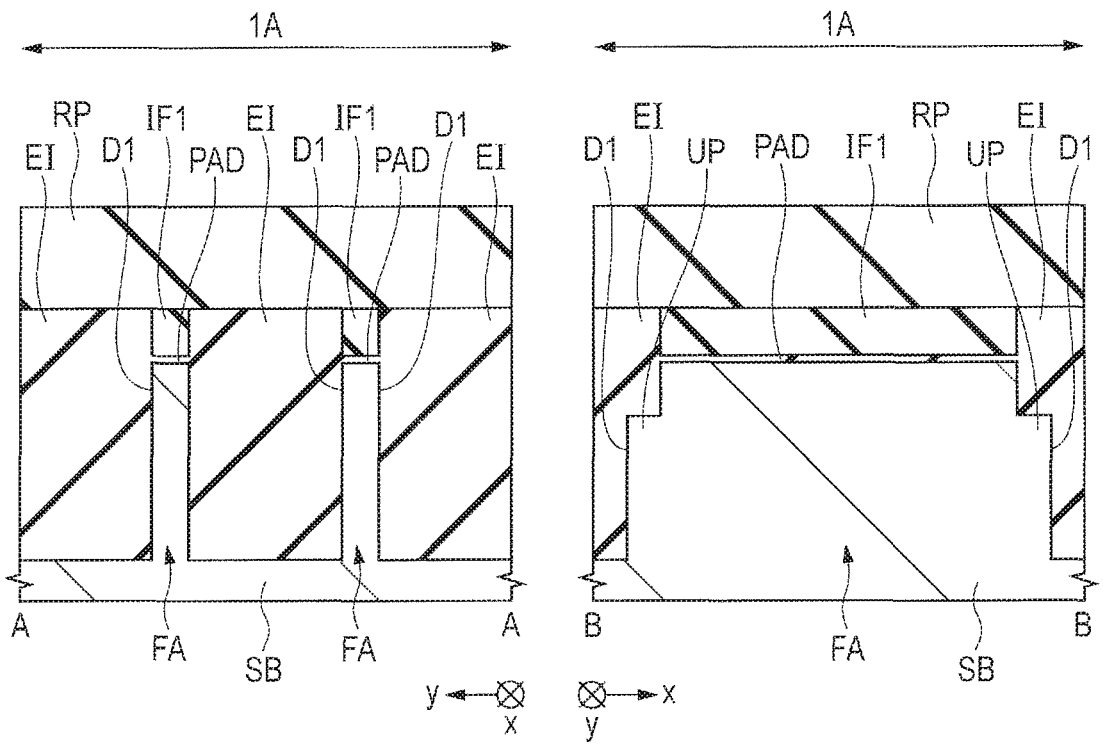
FIG. 18 is a cross-sectional view illustrating the manufacturing process of the semiconductor device, which is subsequent to FIG. 16.
Figure 19:
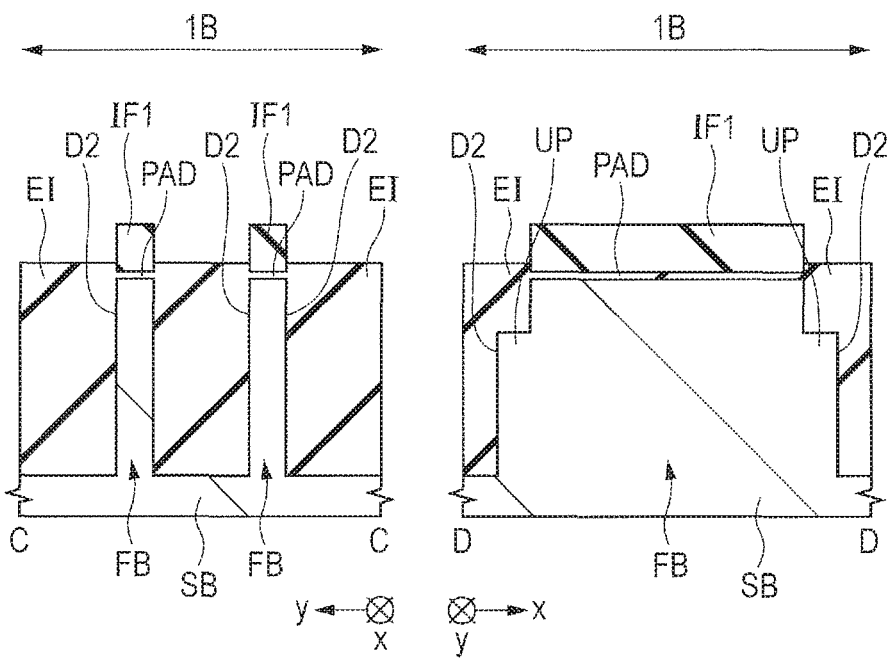
FIG. 19 is a cross-sectional view illustrating the manufacturing process of the semiconductor device, which is subsequent to FIG. 17.

Next, as shown in FIGS. 18 and 19, a resist pattern RP exposing the logic region 1B and covering the memory cell region 1A is formed. Then, by recessing the upper surfaces of the isolation regions EI in the logic region 1B by an etch-back process, the side walls of the insulating film IF1 are exposed from the isolation regions EI. For the etch-back process, either wet etching or dry etching may be used.

Figure 20:
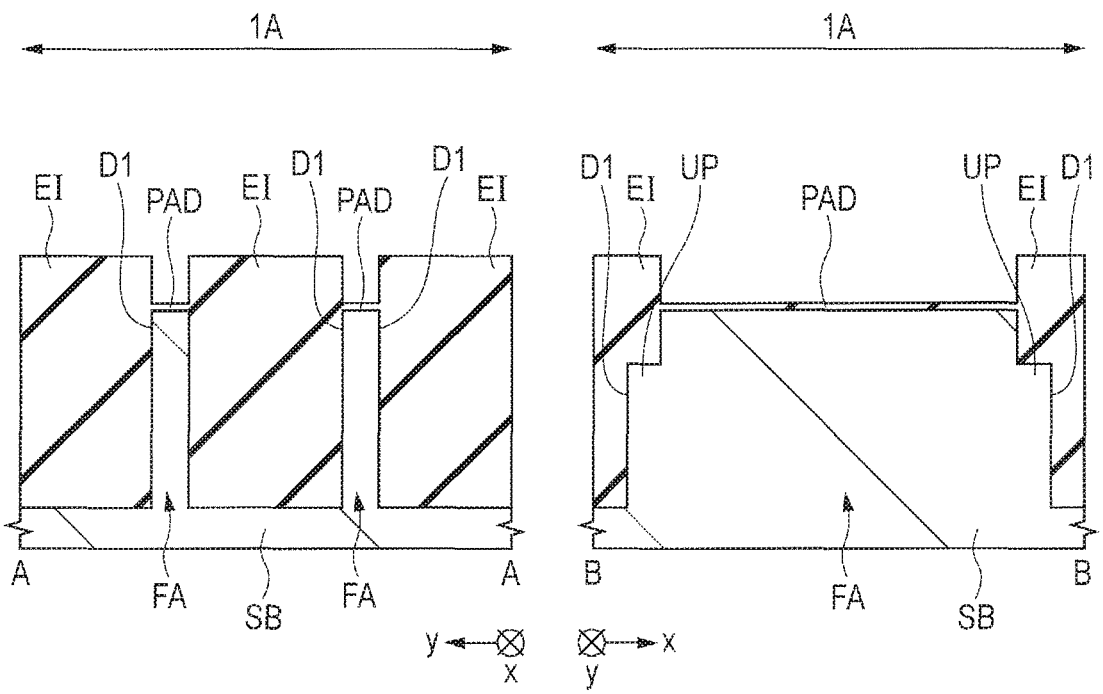
FIG. 20 is a cross-sectional view illustrating the manufacturing process of the semiconductor device, which is subsequent to FIG. 18.
Figure 21:
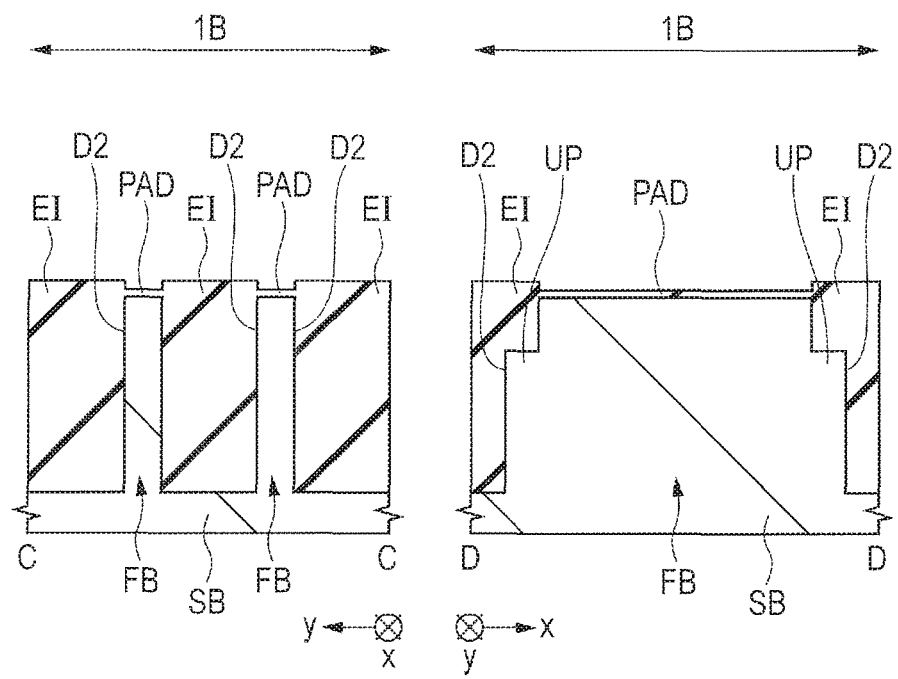
FIG. 21 is a cross-sectional view illustrating the manufacturing process of the semiconductor device, which is subsequent to FIG. 19.

Next, as shown in FIGS. 20 and 21, the insulating film IF1 is removed by wet etching to expose the oxide films PAD over the respective upper surfaces of the fins FA and FB. At this process stage, in the memory cell region 1A, the width of each of the fins FA in the y-direction is, e.g., about 20 nm to 50 nm and the width of each of the isolation regions EI in the y-direction is, e.g., 90 nm. Also, in the memory cell region 1A, the height of each of the isolation regions EI protecting from the upper surfaces of the fins FA is, e.g., about 50 nm to 70 nm. On the other hand, in the logic region 1B, the height of each of the isolation regions EI projecting from the upper surfaces of the fins FB is, e.g., about 10 nm to 20 nm.

Figure 22:
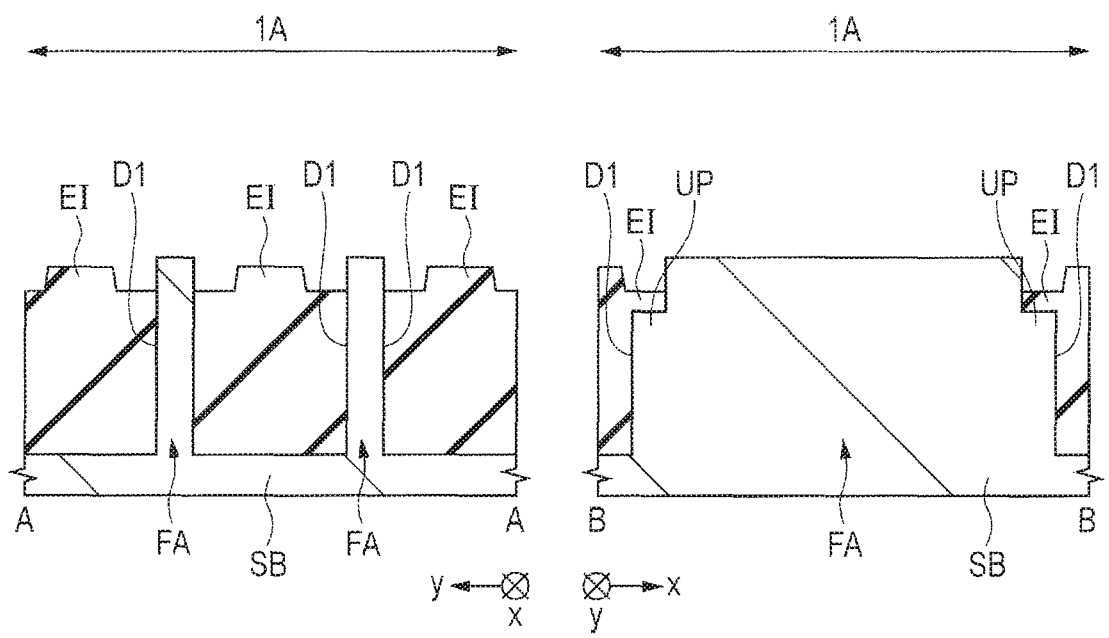
FIG. 22 is a cross-sectional view illustrating the manufacturing process of the semiconductor device, which is subsequent to FIG. 20.
Figure 23:
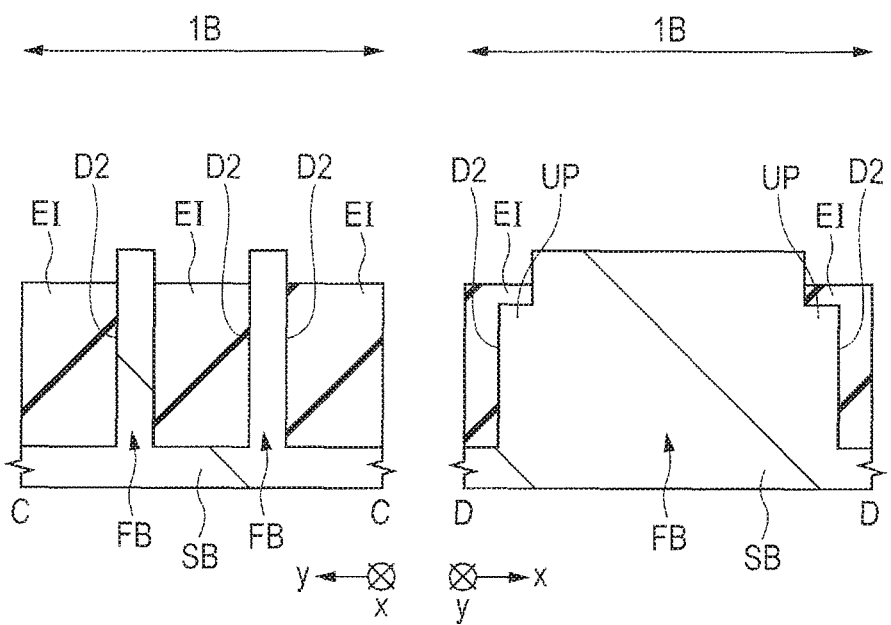
FIG. 23 is a cross-sectional view illustrating the manufacturing process of the semiconductor device, which is subsequent to FIG. 21.
Figure 24:
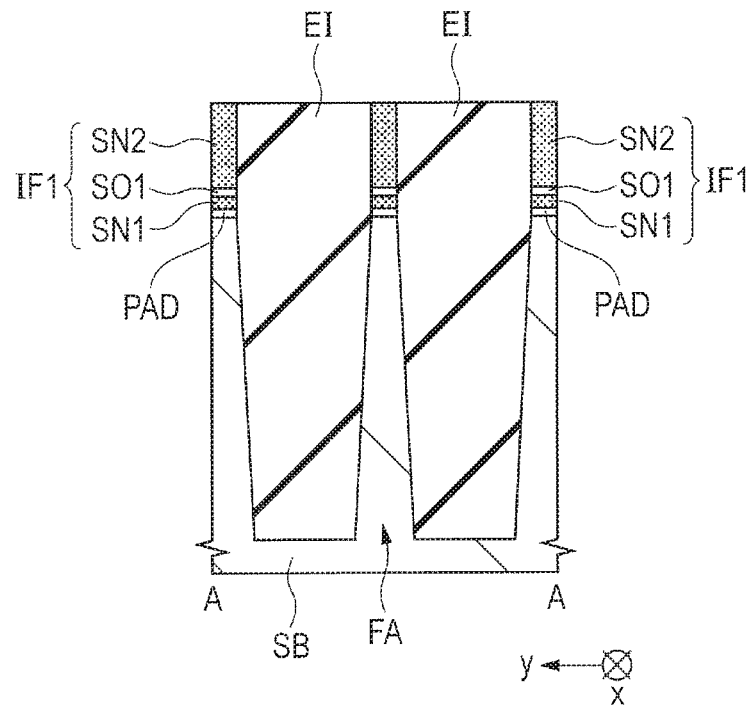
FIG. 24 is a cross-sectional view along the line A-A in FIG. 1, which shows the memory cell region in the semiconductor device according to Embodiment 1.
Figure 25:
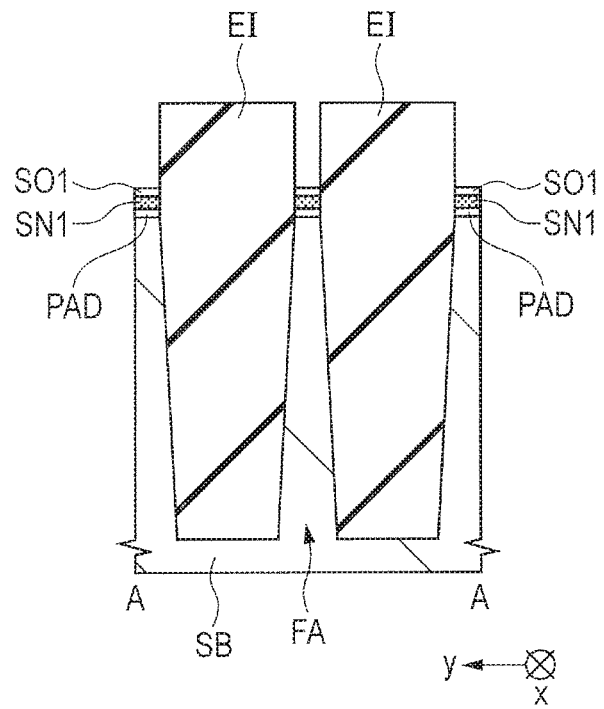
FIG. 25 is a cross-sectional view along the line A-A in FIG. 1, which shows the memory cell region in the semiconductor device according to Embodiment 1.

Next, as shown in FIGS. 22 and 23, the upper surfaces of the isolation regions EI are recessed using isotropic dry etching to remove the oxide films PAD and expose the respective side walls of the fins FA and FB from the isolation regions EI. At this time, the lower pattern UP as the portion of the plate-like pattern extending in the y-direction is not exposed from the isolation regions EI. That is, only the fins FA and FB extending in the x-direction are exposed as the portions of the semiconductor substrate SB exposed from the upper surfaces of the isolation regions EI.

In the memory cell region 1A, as a result of recessing the upper surfaces of the isolation regions EI using the isotropic dry etching, the upper surfaces of the isolation regions EI have projecting shapes in a cross section along the y-direction. This is because, in the memory cell region 1A, the etching proceeds downwardly from the upper surfaces of the exposed isolation regions EI and laterally from the side surfaces thereof. However, when the projecting portions of the upper surfaces of the isolation regions EI are excessively high, the level difference in each of the upper surfaces of the isolation regions EI increases and a processing process after the formation of the isolation regions EI is difficult. Therefore, the height of each of the projecting portions of the upper surfaces of the isolation regions EI is preferably, e.g., about 20 nm to 30 nm. The height of each of the fins FA exposed from the upper surfaces of the isolation regions EI is, e.g., about 40 nm to 60 nm.

On the other hand, in the logic region 1B, the upper surfaces of the isolation regions EI do not have projecting shapes and are substantially planar. That is, the planarity of the upper surface of each of the isolation regions EI in the logic region 1B is lower than the planarity of the upper surface of each of the isolation regions EI in the memory cell region 1A.

This is because, since the height of each of the isolation regions EI projecting from the upper surfaces of the fins FB is lower than the height of each of the isolation regions EI projecting from the upper surfaces of the fins FA and the space between the fins FB adjacent to each other in the y-direction is smaller than the space between the fins FA adjacent to each other in the y-direction before the isotropic dry etching is performed, the etching proceeds mainly downwardly from the upper surface of the isolation region EI in the logic region 1B.

However, when the space between the fins FB adjacent to each other in the y-direction increases, in the logic region 1B also, the upper surface of each of the isolation regions EI has a projecting shape in a cross section along the y-direction.

Note that the isotropic dry etching for the upper surfaces of the isolation regions EI may also be performed individually with respect to the memory cell region 1A and the logic region 1B. In this case, the etching is performed with the region not to be subjected to the etching being covered with a resist pattern. Thus, it may also be possible to form the upper surface of each of the isolation regions EI into a projecting shape in the memory cell region 1A and form the upper surface of each of the isolation regions EI into a planar shape in the logic region 1B.

One of the main characteristic features of Embodiment 1 is that, by forming the upper surface of each of the isolation regions EI in the memory cell region 1A into the projecting shape, the path of the trapping insulating film between the memory cells adjacent to each other in the y-direction in the memory cell region 1A is elongated to suppress the influence of charge diffusion.

Examples of a method for adjusting the height and width of the projecting portion include the following methods.

(1) By changing the thickness of the insulating film IF1, the height of the projecting portion can be changed.

(2) By uniformly recessing the upper surfaces of the isolation regions EI in the memory cell region 1A before the upper surfaces of the isolation regions EI are recessed using the isotropic dry etching, the height of the projecting portion can be changed. For example, after the step described using FIG. 14, the upper surfaces of the isolation regions EI are recessed using wet etching.

(3) By changing the thickness of the oxide film PAD, the width of the projecting portion can be changed. For example, when the oxide film PAD is thick, a starting point for the isotropic dry etching is further away from the upper surface of the semiconductor substrate SB so that an etching time until each of the fins FA has an intended height increases. As a result, the projecting portion has a smaller width.

(4) By changing the configuration of the insulating film IF, the width of the projecting portion can be changed.

By way of example, the following will describe the case where the insulating film IF1 has a multi-layer structure including a lower-layer silicon nitride film SN1, a silicon dioxide film SO1, and an upper-layer silicon nitride film SN2 using FIGS. 24 to 27.

Figure 26:
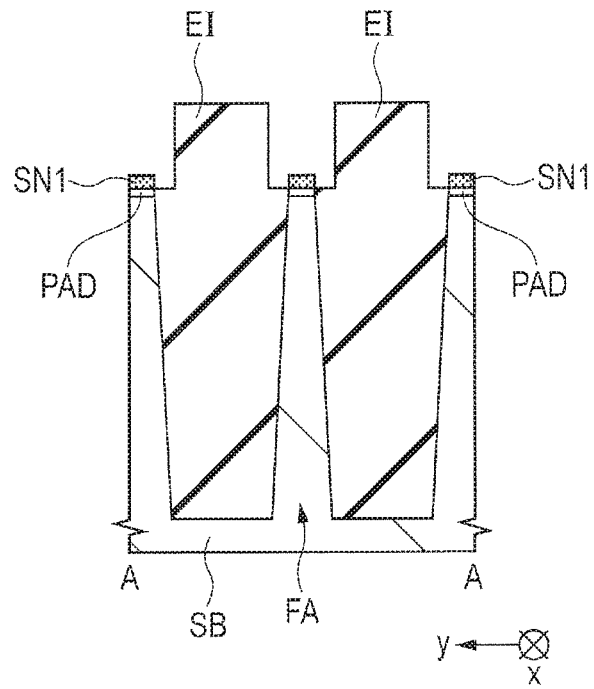
FIG. 26 is a cross-sectional view along the line A-A in FIG. 1, which shows the memory cell region in the semiconductor device according to Embodiment 1.
Figure 27:
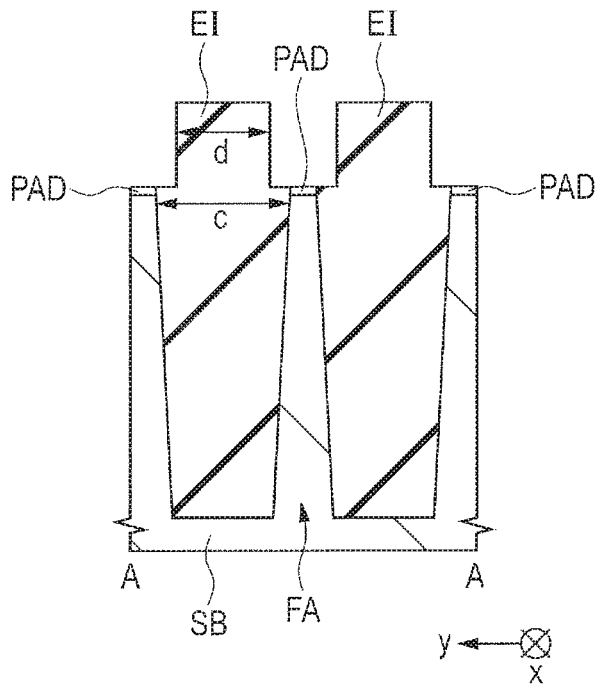
FIG. 27 is a cross-sectional view along the line A-A in FIG. 1, which shows the memory cell region in the semiconductor device according to Embodiment 1.

After the upper surfaces of the isolation regions EI are planarly processed (FIG. 24), the upper-layer silicon nitride film SN2 is removed (FIG. 25), and the upper and side surfaces of the isolation regions EI are further recessed using the isotropic dry etching (FIG. 26). At this time, the silicon dioxide film SO1 is removed. Subsequently, the lower-layer silicon nitride film SN1 is removed (FIG. 27). This allows the isolation regions EI each having a width d smaller than a distance c between the fins FA adjacent to each other in the y-direction to be formed above the upper surfaces of the fins FA. Then, using the isotropic dry etching, the upper surfaces of the isolation regions EI are recessed to expose the fins FA and thus allow a reduction in the width of each of the projecting portions.

Figure 28:
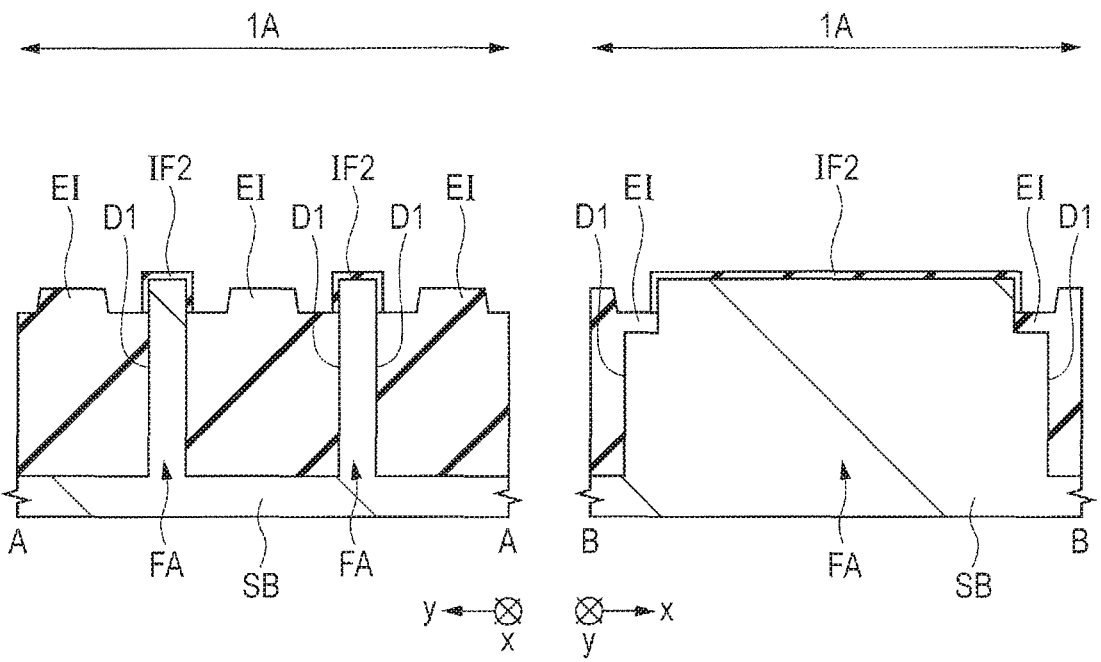
FIG. 28 is a cross-sectional view illustrating the manufacturing process of the semiconductor device, which is subsequent to FIG. 22.
Figure 29:
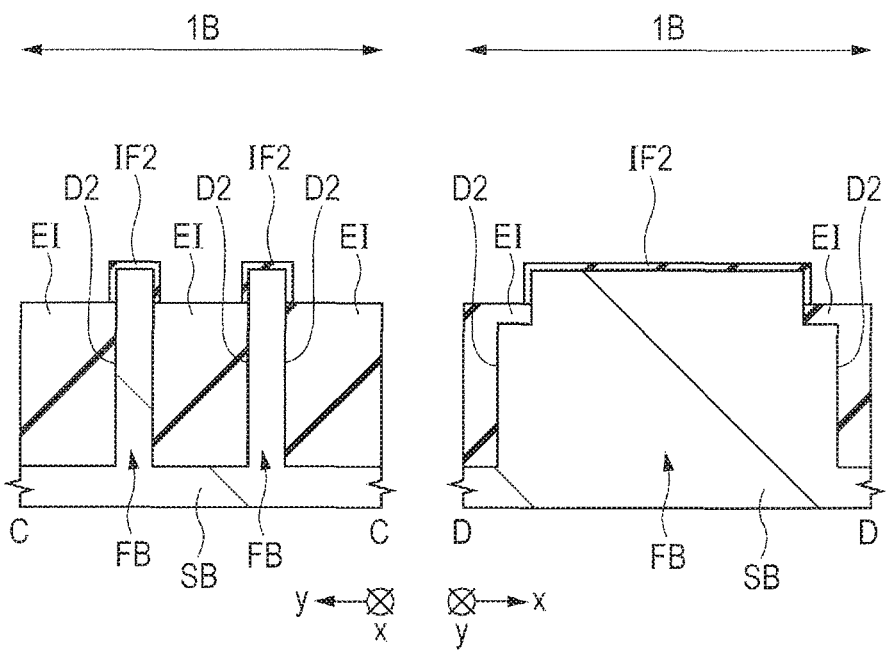
FIG. 29 is a cross-sectional view illustrating the manufacturing process of the semiconductor device, which is subsequent to FIG. 23.

Next, as shown in FIGS. 28 and 29, insulating films IF2 covering the respective top surfaces of the fins FA and FB exposed from the upper surfaces of the isolation regions ET are formed. The insulating films IF2 can be formed using, e.g., a thermal oxidation method and are made of, e.g., silicon dioxide. The insulating films IF2 cover the respective upper surfaces and side walls of the fins FA and FE, and the upper surfaces of the isolation regions EI are exposed from the insulating films IF2. Each of the insulating films IF2 has a thickness of, e.g., about 1 nm to 2 nm.

Figure 30:
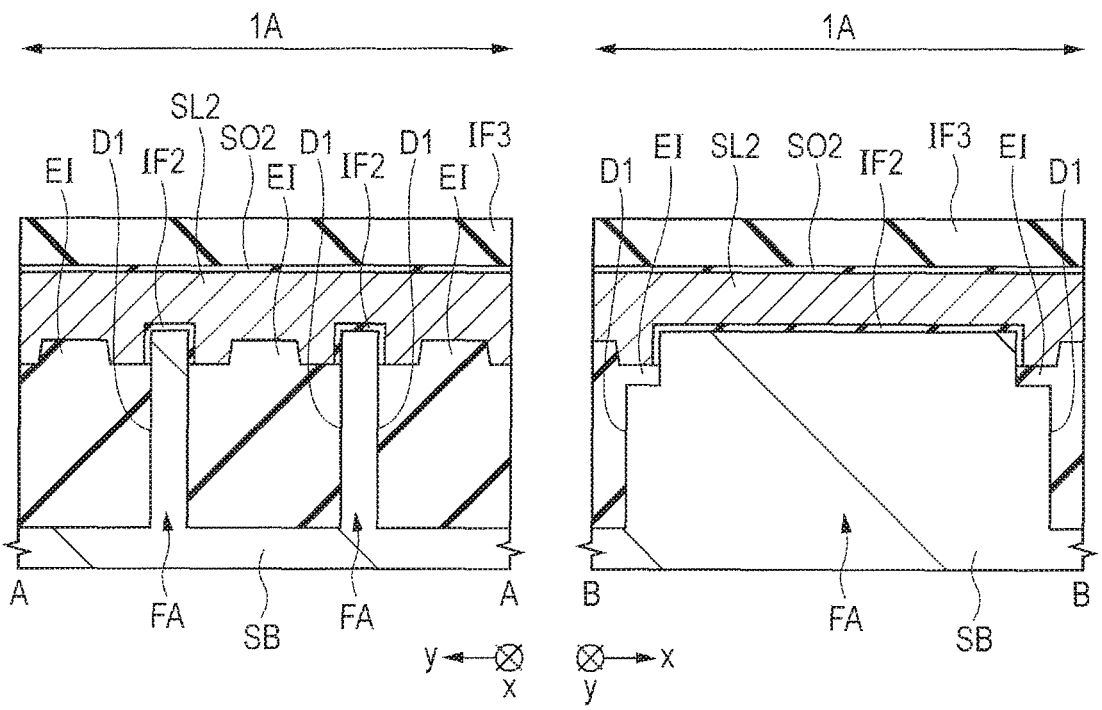
FIG. 30 is a cross-sectional view illustrating the manufacturing process of the semiconductor device, which is subsequent to FIG. 28.
Figure 31:
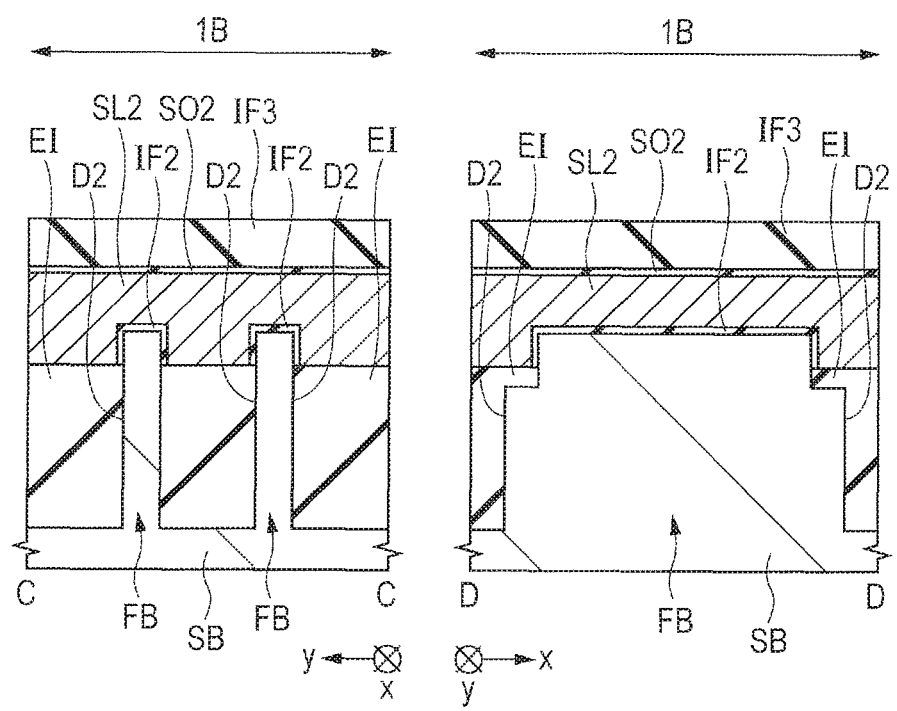
FIG. 31 is a cross-sectional view illustrating the manufacturing process of the semiconductor device, which is subsequent to FIG. 29.

Next, as shown in FIGS. 30 and 31, over the isolation regions EI and the insulating films IF2, a polysilicon film SL2 is formed using, e.g., a CVD method. Then, the upper surface of the polysilicon film SL2 is polished by a CMP method or the like. The thickness of the polysilicon film SL2 from the upper surface of each of the fins FA and FB to the upper surface of the polysilicon film SL2 is, e.g., about 60 nm to 150 nm.

Subsequently, the upper surface of the polysilicon film SL2 is thermally oxidized to form a silicon dioxide film SO2 covering the upper surface thereof. The silicon dioxide film SO2 has a thickness of, e.g., about 6 nm to 10 nm. Subsequently, over the silicon dioxide film SO2, an insulating film IF3 is formed using, e.g., a CVD method. The insulating film IF3 is made of, e.g., silicon nitride and has a thickness of, e.g., about 90 nm.

Figure 32:
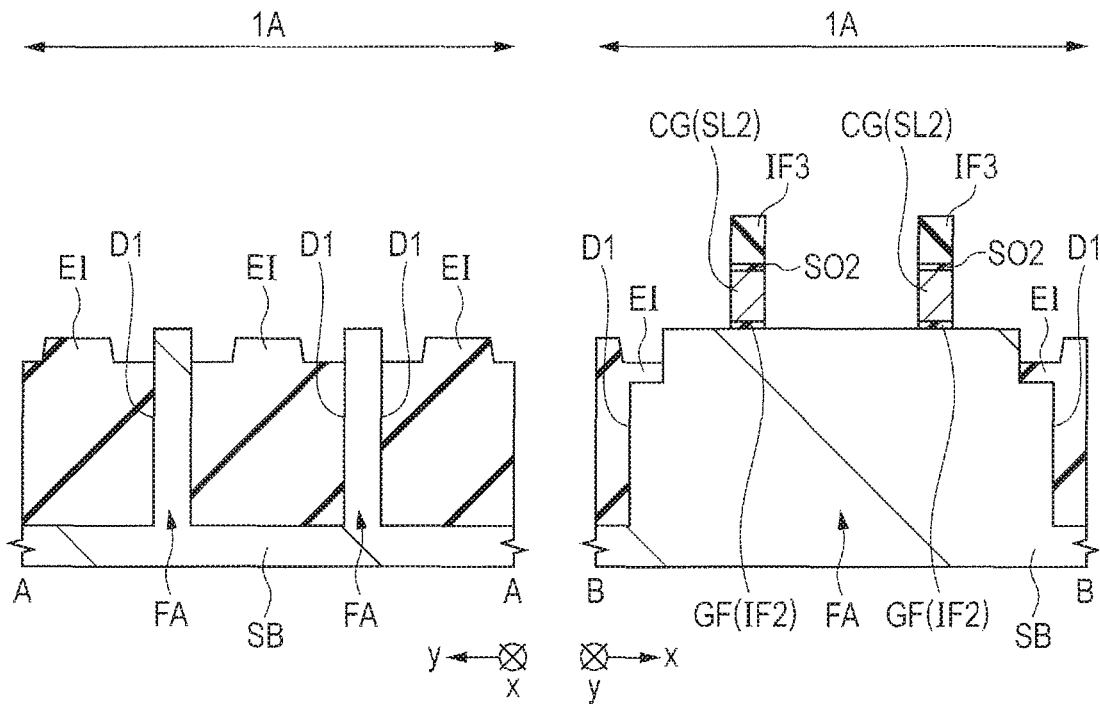
FIG. 32 is a cross-sectional view illustrating the manufacturing process of the semiconductor device, which is subsequent to FIG. 30.
Figure 33:
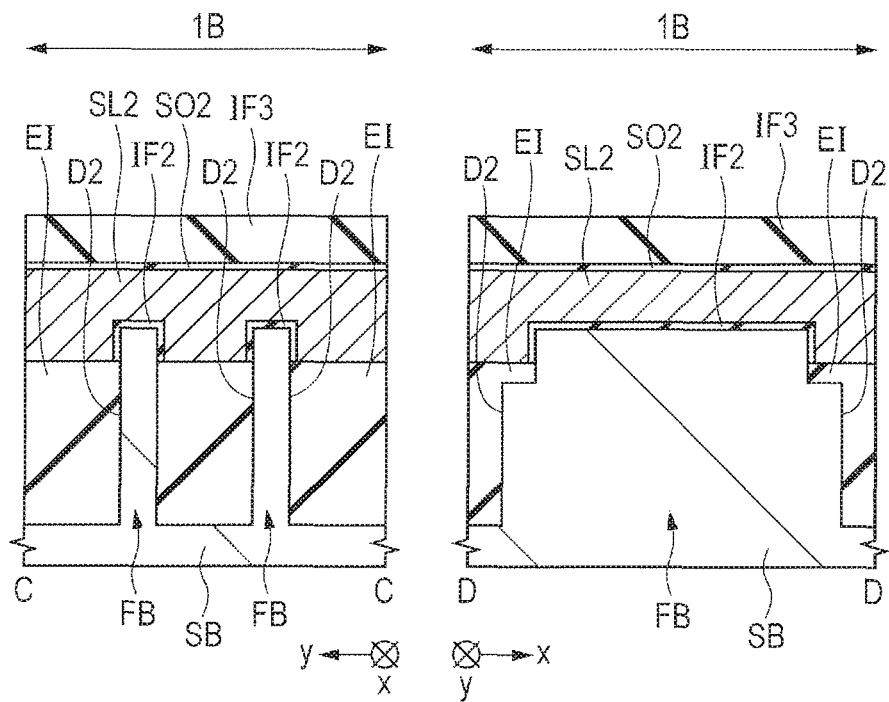
FIG. 33 is a cross-sectional view illustrating the manufacturing process of the semiconductor device, which is subsequent to FIG. 31.

Next, as shown in FIGS. 32 and 33, by dry etching using a resist pattern as a mask, the insulating film IF3, the oxide film SO2, the polysilicon film SL2, and the insulating film IF2 in the memory cell region 1A are processed. That is, with the logic region 1B being covered with a resist pattern (not shown), patterning is performed. The resist pattern is removed after the patterning. Thus, immediately over the fins FA, multi-layer patterns each including the insulating film IF3, the oxide film SO2, the polysilicon film SL2, and the insulating film IF2 are formed to be arranged in the x-direction. By the patterning, the control gate electrodes CG made of the polysilicon film SL2 are formed, and the gate insulating films GF made of the insulating film IF2 are formed.

The multi-layer patterns each including the insulating film IF3 and the control gate electrode CG are disposed so as to extend in the y-direction and pass over the plurality of fins FA and the gate insulating films GF. In the area of the memory cell region 1A other than the portions thereof where the multi-layer patterns are formed, the insulating film IF3, the oxide film SO2, the polysilicon film SL2, and the insulating film IF2 in the memory cell region 1A are removed therefrom by the foregoing etching. As a result, the top surfaces of the fins FA and the upper surfaces of the isolation regions EI are exposed.

Figure 34:
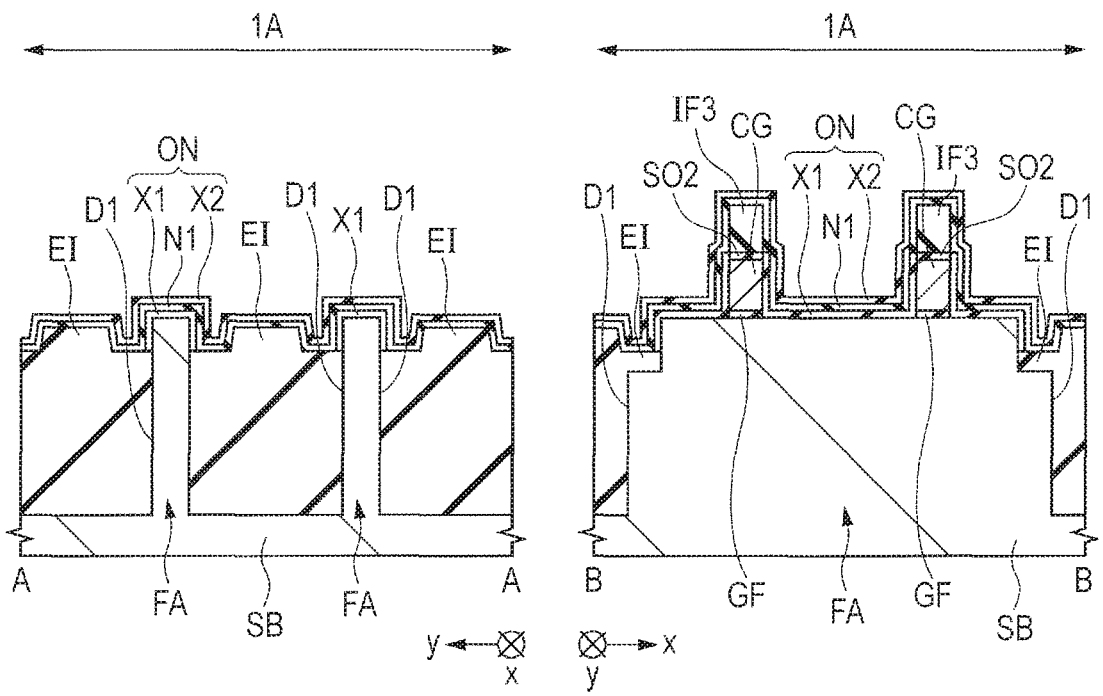
FIG. 34 is a cross-sectional view illustrating the manufacturing process of the semiconductor device, which is subsequent to FIG. 32.
Figure 35:
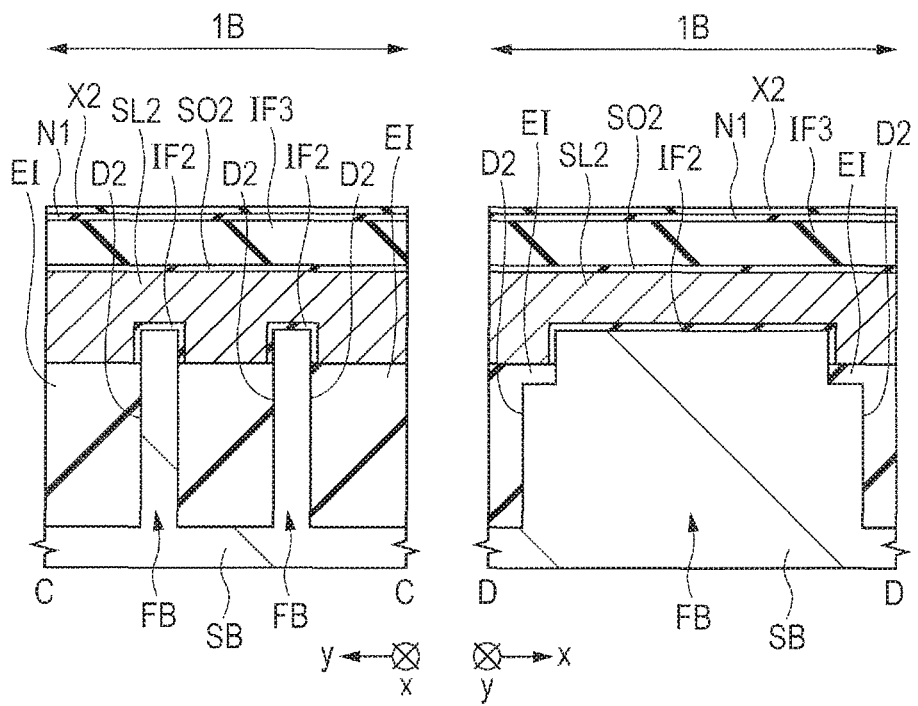
FIG. 35 is a cross-sectional view illustrating the manufacturing process of the semiconductor device, which is subsequent to FIG. 33.

Next, as shown in FIGS. 34 and 35, using a thermal oxidation method, the upper surfaces and side walls of the fins FA and the side wall of the control gate electrodes CG which are exposed from the gate insulating films GF are oxidized using a thermal oxidation method. Thus, the silicon dioxide film (bottom oxide film) X1 covering the upper surfaces and side walls of the fins FA and the side wall of the control gate electrodes CG is formed. In FIG. 34, the silicon dioxide film X1 formed continuously from the upper surfaces of the fins FA to over the side wall of the control gate electrodes CS is shown, but the silicon dioxide films X1 need not be formed over the side walls of the gate insulating films GF.

Subsequently, using, e.g., a CVD method, over the silicon dioxide film X1, the insulating films IF3, and the isolation regions EI, the silicon nitride film N1 is formed. The silicon nitride film N1 functions as the trapping insulating film for storing charges in the memory cell formed later. Note that the description has been given heretofore of the formation of the silicon nitride film N1 as the trapping insulating film. However, the trapping insulating film is not limited to the silicon nitride film N1. For example, an insulating film made of hafnium silicate (HfSiO) may also be formed. Subsequently, using, e.g., a CVD method, the silicon dioxide film (top oxide film) X2 is formed over the silicon nitride film N1.

A multi-layer film including the silicon dioxide film X1, the silicon nitride film N1, and the silicon dioxide film X2 which are stacked in order of increasing distance from the semiconductor substrate SB forms the ONO film ON. The ONO film ON in contact with the side wall of each of the control gate electrodes CG includes the silicon dioxide film X1, the silicon nitride film N1, and the silicon dioxide film X2 which are formed in order of increasing distance from each of the control gate electrodes CG in the x-direction. The material of the top oxide film formed herein in the uppermost layer of the ONO film ON is not limited to silicon dioxide and may also be alumina ($Al_2O_3$).

Note that, in principle, the ONO film ON refers to the multi-layer film including the silicon dioxide film X1, the silicon nitride film N1, and the silicon dioxide film X2. However, for the convenience of description, a multi-layer film including the silicon nitride film N1 and the silicon dioxide film X2 may also be referred to as the ONO film ON.

Figure 36:
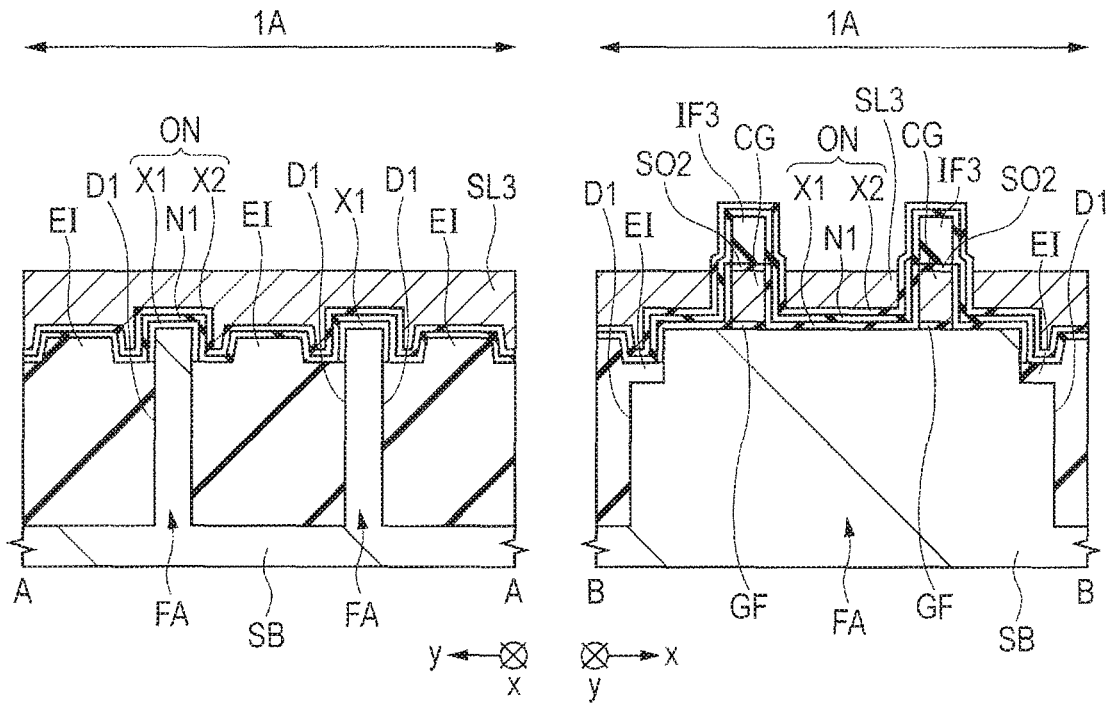
FIG. 36 is a cross-sectional view illustrating the manufacturing process of the semiconductor device, which is subsequent to FIG. 34.
Figure 37:
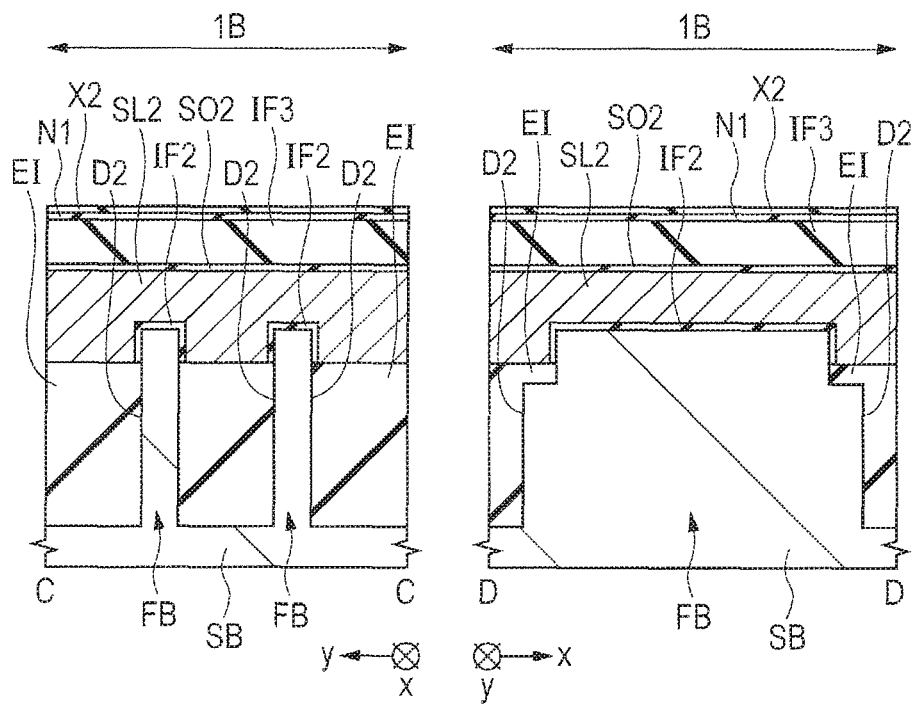
FIG. 37 is a cross-sectional view illustrating the manufacturing process of the semiconductor device, which is subsequent to FIG. 35.

Next, as shown in FIGS. 36 and 37, over the ONO film ON, a polysilicon film SL3 is formed using, e.g., a CVD method. The polysilicon film SL3 has a thickness of at least not less than the thickness of each of the control gate electrodes CG. The polysilicon film SL3 is formed herein to have a film thickness larger than the film thickness of the multi-layer film including the control gate electrode CG, the silicon dioxide film SO2, and the insulating film IF3, thus covering a multi-layer film including the control gate electrode CG, the silicon dioxide film SO2, the insulating film IF3, and the ONO film ON. Then, using a CMP method or the like, the upper surface of the polysilicon film SL3 is planarized.

Subsequently, an etch-back process is performed to recess the upper surface of the polysilicon film SL3 and thus allow, e.g., the height of the upper surface of the polysilicon film SL3 to be equal to the height of the upper surface of the control gate electrode CG. As a result, the insulating film IF3 and the ONO film ON covering the insulating film IF3 project over the upper surface of the polysilicon film SL3. By the planarizing step and the etch-back step each for the foregoing polysilicon film SL3, the polysilicon film SL3 is removed from the logic region 1B.

Figure 38:
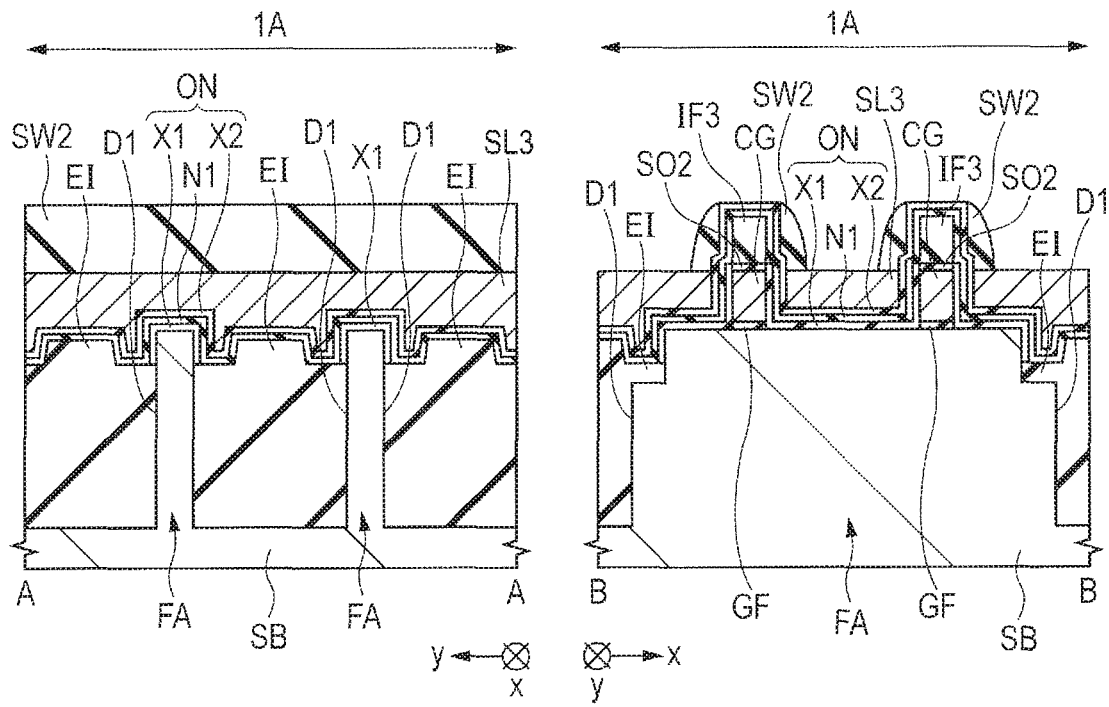
FIG. 38 is a cross-sectional view illustrating the manufacturing process of the semiconductor device, which is subsequent to FIG. 36.
Figure 39:
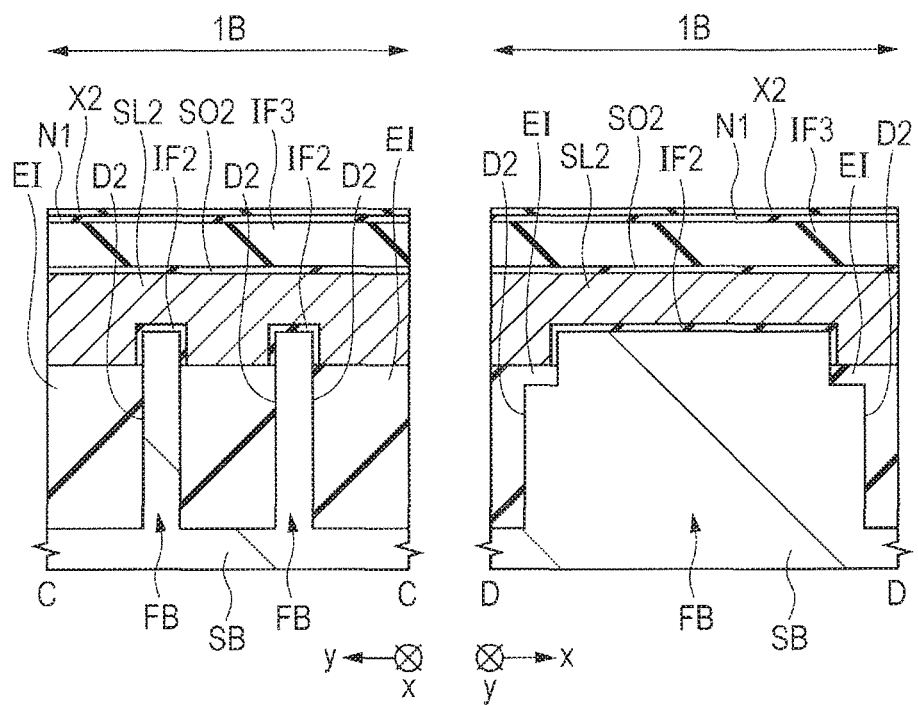
FIG. 39 is a cross-sectional view illustrating the manufacturing process of the semiconductor device, which is subsequent to FIG. 37.

Next, as shown in FIGS. 38 and 39, over the ONO film ON and the polysilicon film SL3, an insulating film is formed using, e.g., a CVD method. The insulating film is made of, e.g., silicon nitride and has a thickness of, e.g., 10 to 50 nm. Subsequently, by dry etching, the upper surface of the polysilicon film SL3 and the upper surface of the ONO film ON immediately over the insulating films IF3 are exposed from the insulating film. Consequently, over the side walls of the insulating films IF3, sidewalls SW2 made of the insulating film are formed via the ONO film ON. By the dry etching step, the insulating film is removed from the logic region 1B.

Figure 40:
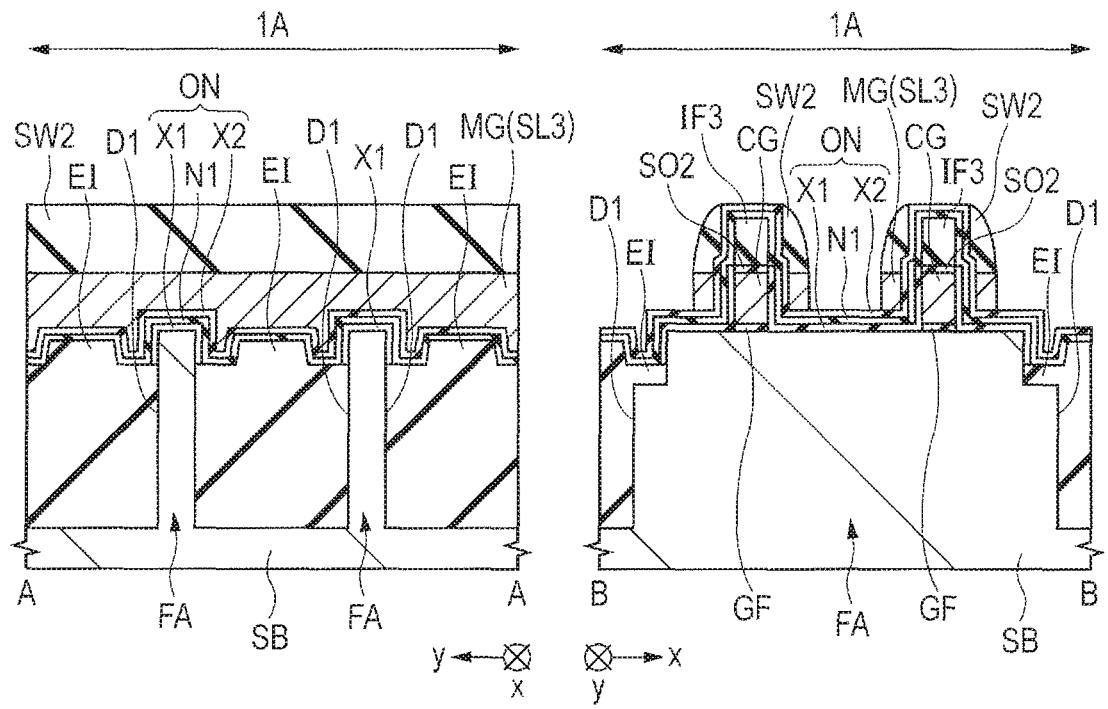
FIG. 40 is a cross-sectional view illustrating the manufacturing process of the semiconductor device, which is subsequent to FIG. 38.
Figure 41:
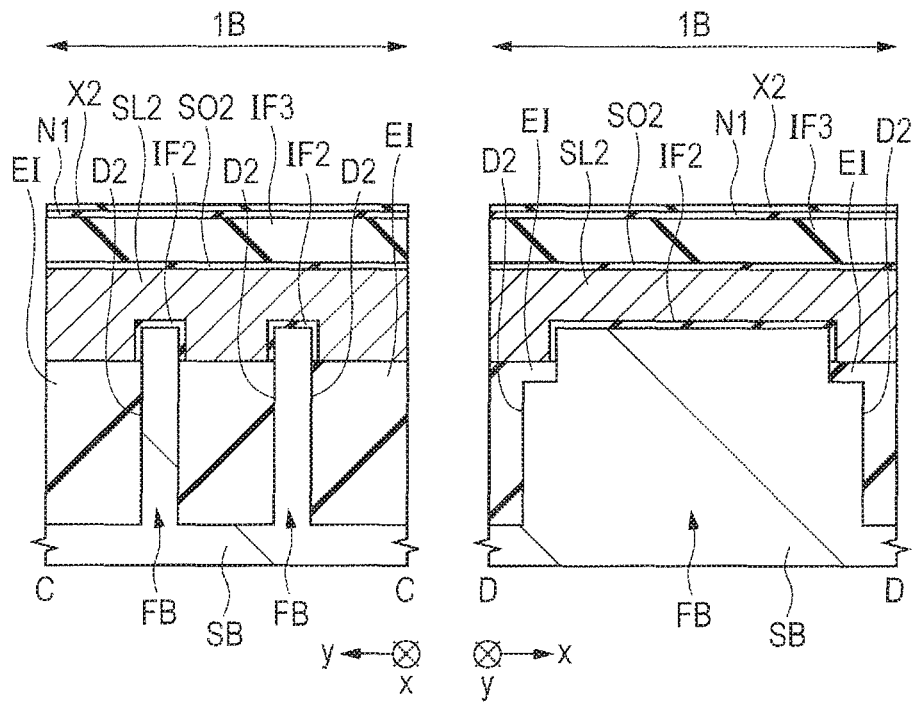
FIG. 41 is a cross-sectional view illustrating the manufacturing process of the semiconductor device, which is subsequent to FIG. 39.

Next, as shown in FIGS. 40 and 41, by dry etching using the sidewalls SW2 as a hard mask, the polysilicon film SL3 is processed. As a result, the upper surface of the ONO film ON in contact with the upper surfaces and side walls of the fins FA is exposed from the polysilicon film SL3. On both lateral sides of each of the control gate electrodes CG, the memory gate electrodes MG each made of the pattern of the polysilicon film SL3 are formed via the ONO films ON. However, the memory gate electrode MG adjacent to one of the side walls of each of the control gate electrodes CG is in the pattern to be removed in the subsequent process step and is not left in the finished semiconductor device.

Figure 42:
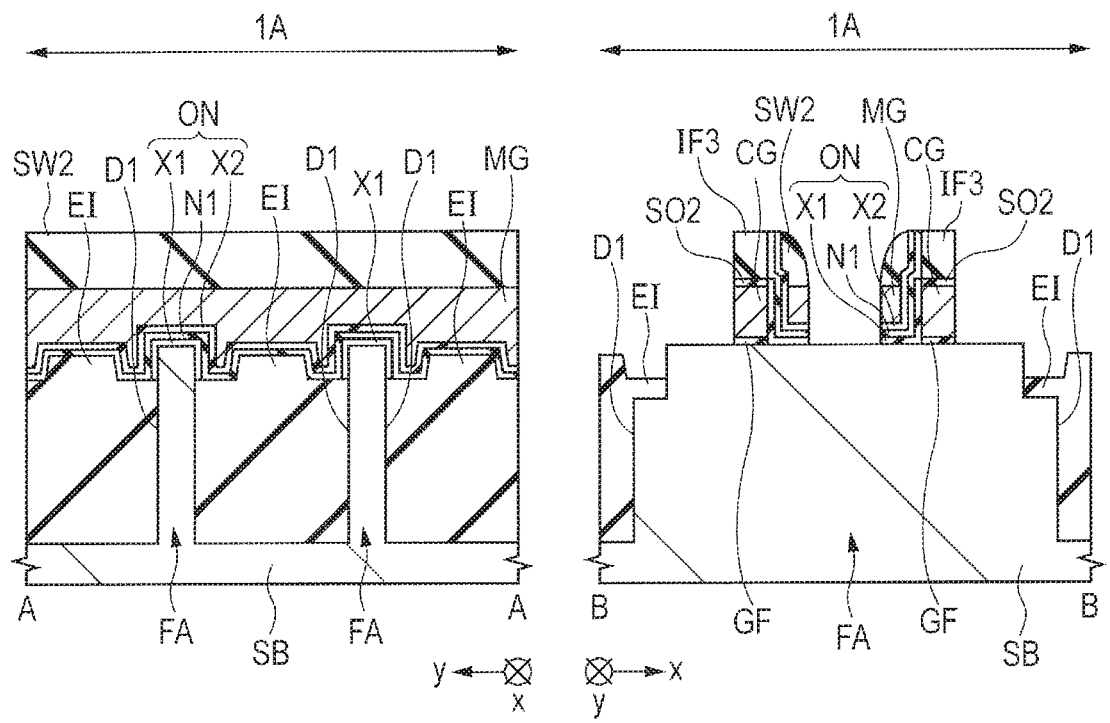
FIG. 42 is a cross-sectional view illustrating the manufacturing process of the semiconductor device, which is subsequent to FIG. 40.
Figure 43:
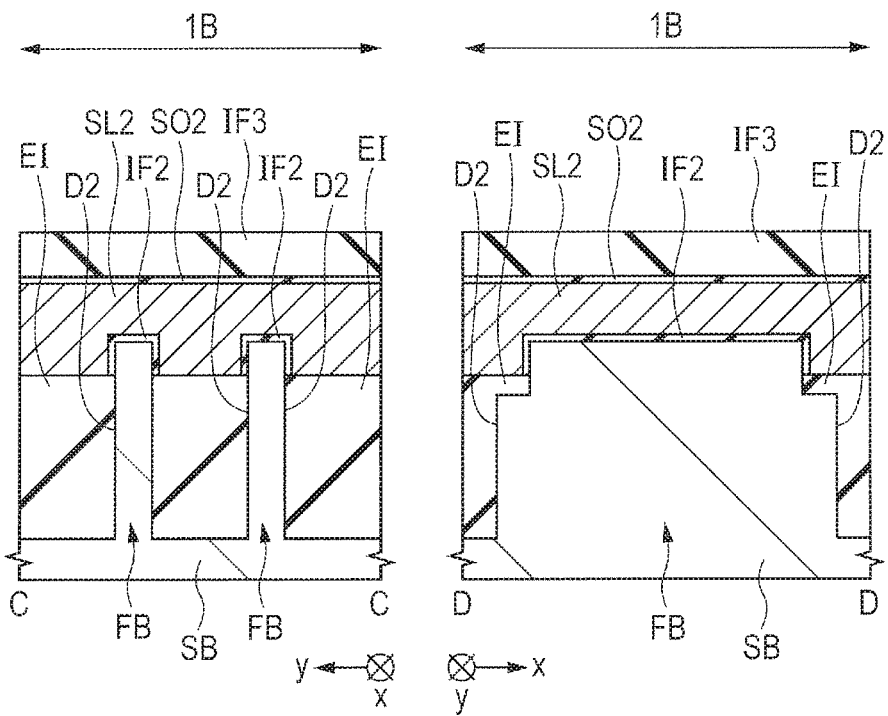
FIG. 43 is a cross-sectional view illustrating the manufacturing process of the semiconductor device, which is subsequent to FIG. 41.

Next, as shown in FIGS. 42 and 43, by dry etching using a resist pattern as a mask, the memory gate electrode MG and the sidewall SW2 immediately over the memory gate electrode MG which are adjacent to one of the side walls of each of multi-layer films including the control gate electrodes CG and the insulating films IF3 are removed. As a result, the memory gate electrode MG adjacent to the other side wall of each of the control gate electrodes CG is left. Subsequently, the ONO film ON exposed from each of the control gate electrodes CG and the memory gate electrodes MG is removed.

That is, the ONO film ON remains only between the memory gate electrodes MG and the fins FA, between the memory gate electrodes MG and the control gate electrodes CG, and between the sidewalls SW2 and the insulating films IF3. Consequently, in the areas of the memory cell region 1A which are exposed from the control gate electrodes CG and the memory gate electrodes MG, the upper surfaces and side walls of the fins FA and the upper surfaces of the isolation regions EI are exposed. Also, in the memory cell region 1A, the upper surface and one of the side walls of each of the insulating films IF3 are exposed while, in the logic region 1B, the upper surface of each of the insulating films IF3 is exposed.

The upper surface of each of the fins FA, i.e., the ONO film ON extending along the semiconductor substrate SB and the ONO film ON extending along the side wall of each of the control gate electrodes CG are formed continuously to have an L-shaped cross section. Over each of the fins FA, a pair of patterns having the control gate electrodes CG and the memory gate electrodes MG adjacent to the control gate electrodes CG are formed via the ONO films ON. Between the pair of control gate electrodes CG, the pair of memory gate electrodes MG face each other. Subsequently, an oxidation process may also be performed on the upper surfaces and side walls of the fins FA so as to prevent the fins FA from being damaged in the impurity implantation step performed later with respect to the fins FA.

Figure 44:
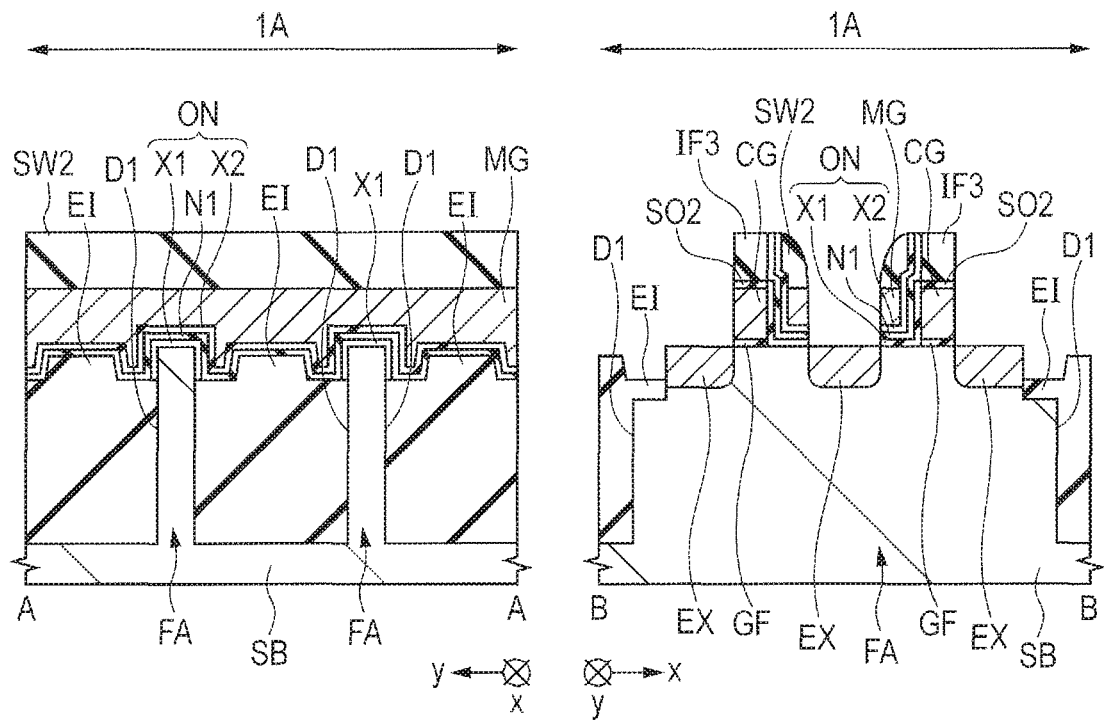
FIG. 44 is a cross-sectional view illustrating the manufacturing process of the semiconductor device, which is subsequent to FIG. 42.
Figure 45:
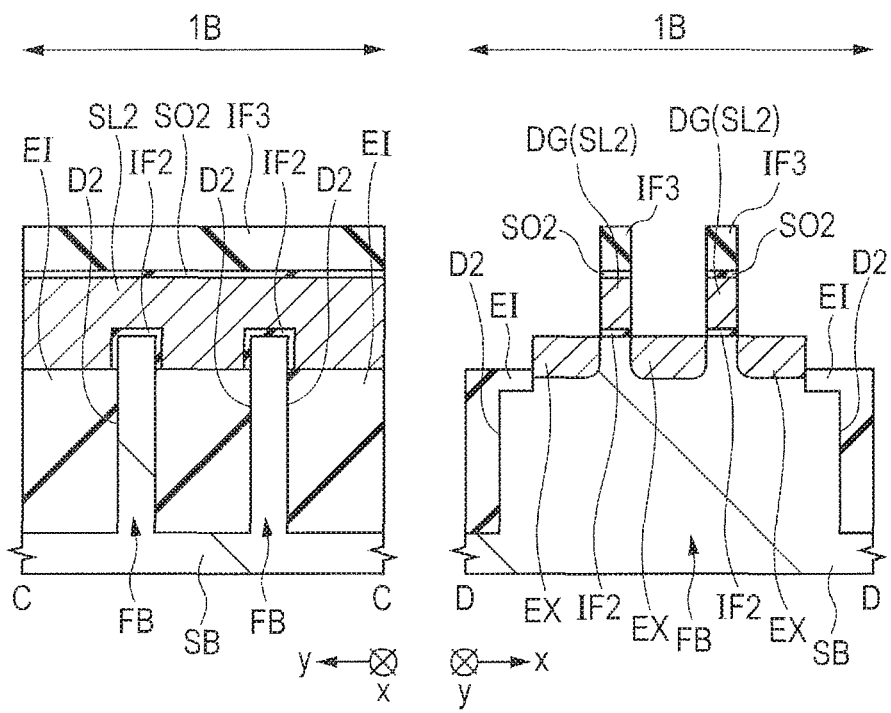
FIG. 45 is a cross-sectional view illustrating the manufacturing process of the semiconductor device, which is subsequent to FIG. 43.

Next, as shown in FIGS. 44 and 45, a resist pattern (not shown) covering the memory cell region 1A and exposing portions of the logic region 1B is formed. Then, by dry etching using the resist pattern as a mask, the insulating film IF3, the oxide film SO2, the polysilicon film SL2, and the insulating films IF2 in the logic region 1B are processed. As a result, immediately over each of the fins FB, a pair of multi-layer films each including the insulating film IF2, the dummy gate electrode DG made of the polysilicon film the oxide film SO2, and the insulating film IF3 are formed to be arranged in the x-direction. In the regions lateral to these multi-layer films, the respective upper surfaces of the fin FE and the isolation regions EI are exposed. That is, over the fin FB, the dummy gate electrodes DG, the oxide films SO2, and the insulating films IF3 are formed via the insulating films IF2. The dummy gate electrodes DG are pseudo gate electrodes to be removed in the subsequent process step and are not left in the finished semiconductor device.

Subsequently, after the foregoing resist pattern is removed, by performing an ion implantation step using the insulating films IF3 and the sidewalls SW2 as a mask, an n-type impurity (e.g., phosphorus (P)) or arsenic (As)) is implanted into the respective upper surfaces of the fins FA and FB. Thus, the plurality of extension regions EX as n-type semiconductor regions each having a relatively low impurity concentration are formed. The extension regions EX in the memory cell region 1A are formed in the upper surface of each of the fins FA lateral to the patterns each having the control gate electrode CG and the memory gate electrode MG adjacent to the control gate electrode CG via the ONO film ON. The extension regions EX in the logic region 1B are formed in the upper surface of the fin FB lateral to the dummy gate electrodes G. As necessary, implantation of a p-type impurity (e.g., boron (B)) may also be performed herein as halo implantation with respect to each of the fins FA and FB.

Figure 46:
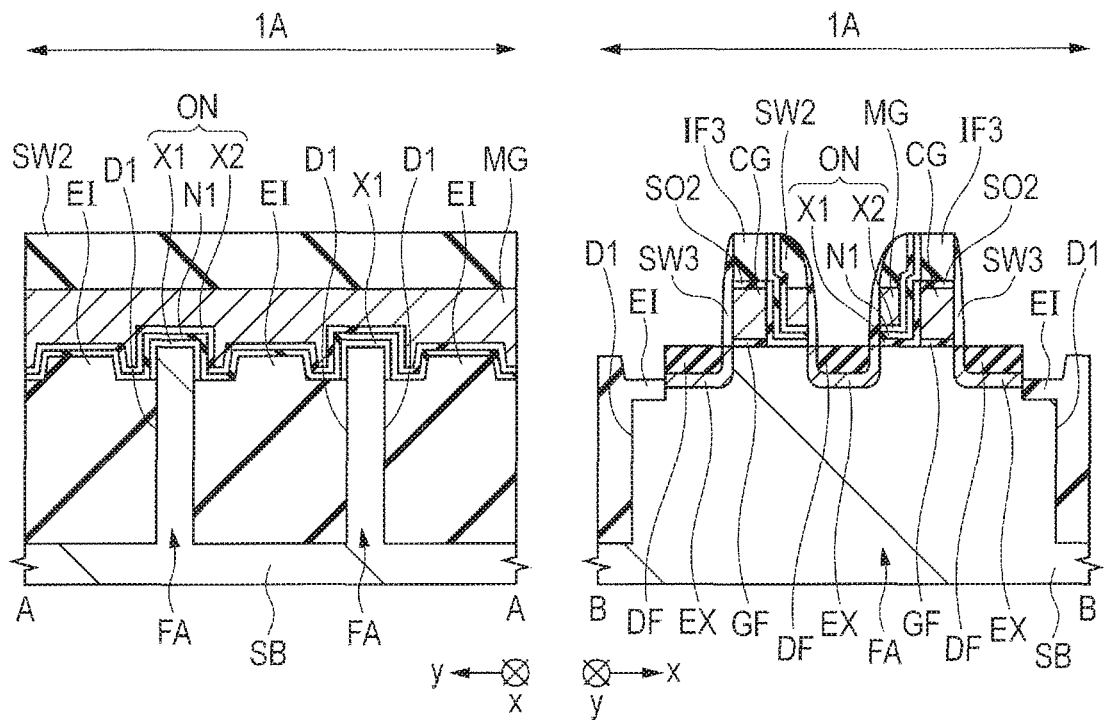
FIG. 46 is a cross-sectional view illustrating the manufacturing process of the semiconductor device, which is subsequent to FIG. 44.
Figure 47:
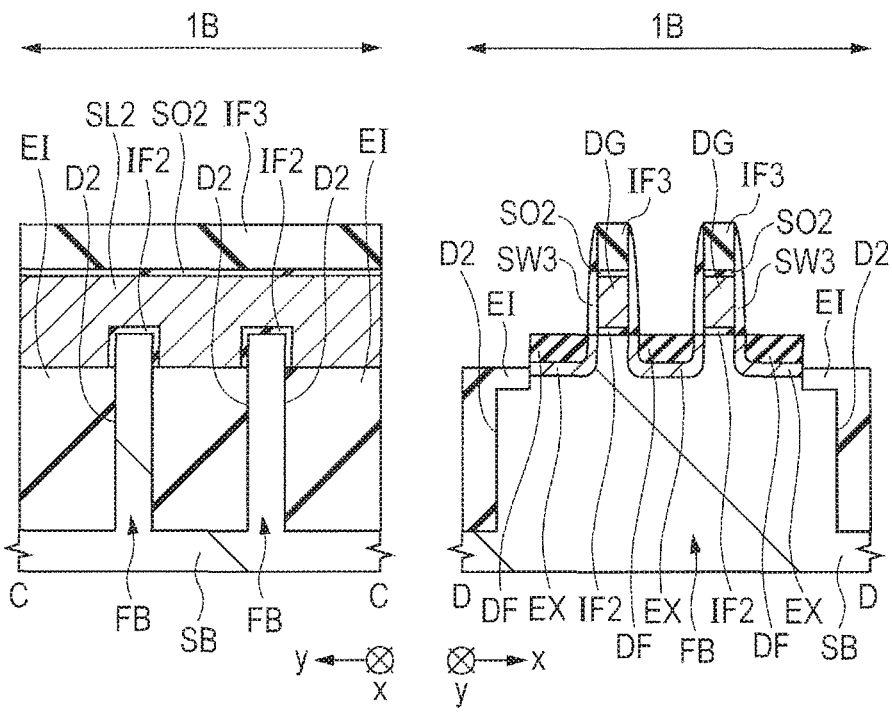
FIG. 47 is a cross-sectional view illustrating the manufacturing process of the semiconductor device, which is subsequent to FIG. 45.

Next, as shown in FIGS. 46 and 47, over the semiconductor substrate SB, an insulating film is formed using, e.g., a CVD method. The insulating film is made of, e.g., silicon dioxide, silicon nitride, or a multi-layer film including silicon dioxide and silicon nitride film. Subsequently, by dry etching, the respective upper surfaces of the fins FA and FB and the insulating films IF3 are exposed from the insulating film. As a result, in the memory cell region 1A, over the both side walls of the patterns each including the control gate electrode CG, the memory gate electrode MG, the ONO film ON, the oxide film SO2, the insulating film IF3, and the side wall SW2, the sidewalls SW3 made of the foregoing insulating film are formed. Also, in the logic region 1B, over the both side walls of the multi-layer films each including the dummy gate electrode DG, the silicon dioxide film SO2, and the insulating film IF3, the sidewalls SW3 made of the foregoing insulating film are formed.

Subsequently, by performing an ion implantation step using each of the insulating films IF3 and the sidewalls SW2 and SW3 as a mask, an n-type impurity (e.g., phosphorus (P) or arsenic (As)) is implanted into the respective upper surfaces of the fins FA and FB. Thus, the plurality of diffusion layers DF as n-type semiconductor regions each having a relatively high impurity concentration are formed. The diffusion layers DF in the memory cell region 1A are formed in the upper surface of each of the fins FA lateral to the patterns each having the control gate electrode CG and the memory gate electrode MG adjacent to the control gate electrode CS via the ONO film ON. The diffusion layers DF in the logic region 1B are formed in the upper surface of each of the fins FB lateral to the dummy gate electrodes DG.

The diffusion layers DF are formed at positions further away from the control gate electrodes CG, the memory gate electrodes MG, or the dummy gate electrodes DG in the x-direction than the extension regions EX in contact with the diffusion layers DF. The diffusion layers DF are formed shallower than the extension regions EX and have n-type impurity concentrations higher than those of the extension regions EX. The extension regions EX and the diffusion layers DF which are in contact with each other form the source/drain regions of the transistors. Then, to activate the impurities in the extension regions EX and the diffusion layers DF, heat treatment is performed as necessary.

The description has been given heretofore of the formation of the respective source/drain regions in the memory cell region 1A and the logic region 1B in the same process step. However, it can be considered that, in the memory cell region 1A where memory cells having breakdown voltages higher than those of the transistors formed in the logic region 1B are formed, the impurity concentrations of the source/drain regions are set higher than the impurity concentrations of the source/drain regions in the logic region 1B. Accordingly, it may also be possible to individually perform the step of forming the extension regions EX and the diffusion layers DF in the memory cell region 1A and the step of forming the extension regions EX and the diffusion layers DF in the logic region 1B. The description has also been given heretofore of the formation of the source/drain regions by ion implantation. However, instead of performing ion implantation, epitaxial layers in which an impurity is introduced may also be formed in the respective upper surfaces and side walls of the fins FA and FB lateral to the individual gate electrodes using an epitaxial growth method.

Figure 48:
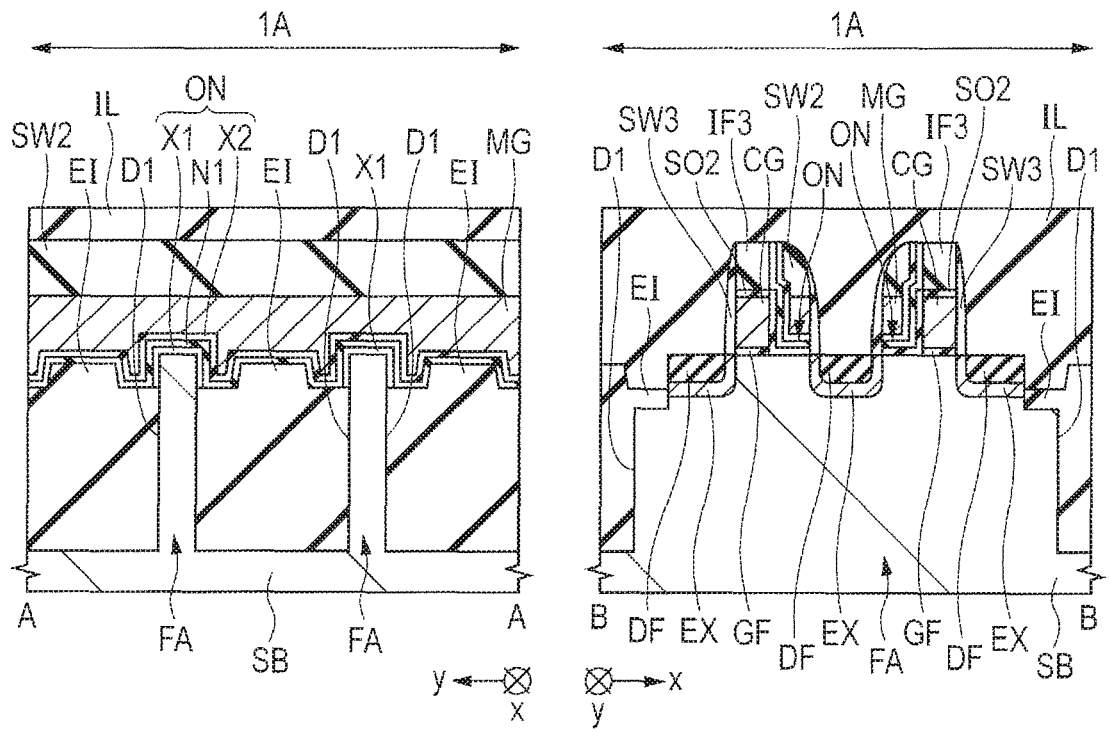
FIG. 48 is a cross-sectional view illustrating the manufacturing process of the semiconductor device, which is subsequent to FIG. 46.
Figure 49:
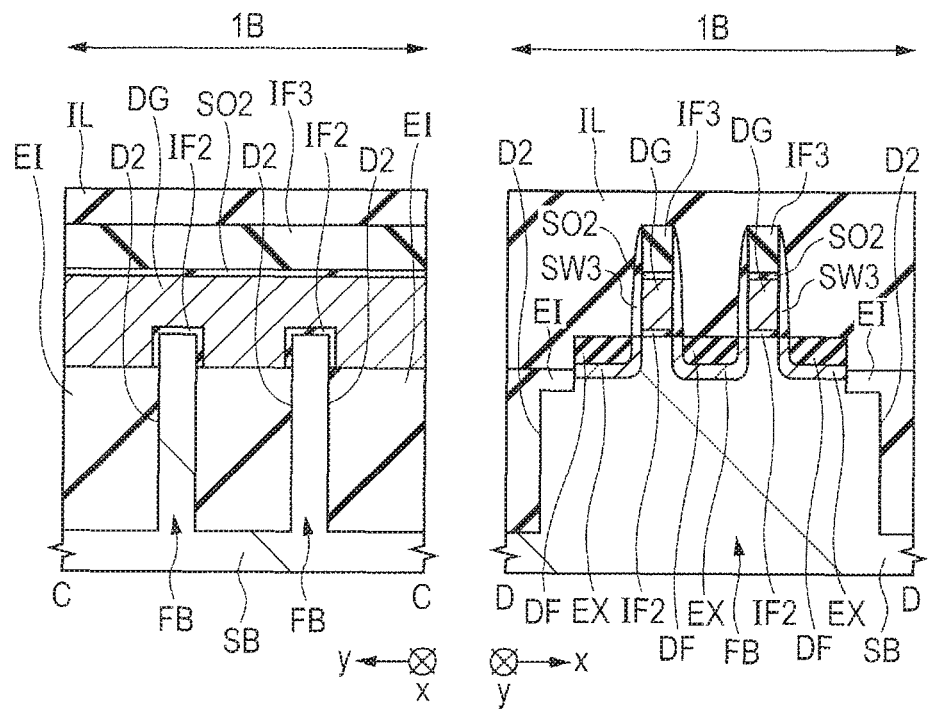
FIG. 49 is a cross-sectional view illustrating the manufacturing process of the semiconductor device, which is subsequent to FIG. 47.

Next, as shown in FIGS. 48 and 49, over the semiconductor substrate SB, an insulating film (not shown) made of silicon nitride and having a film thickness of, e.g., 5 nm to 20 nm and the interlayer insulating film IL made of, e.g., silicon dioxide are successively formed using, e.g., a CVD method. The interlayer insulating film IL has a film thickness at least larger than the film thickness of each of the control gate electrodes CG. The interlayer insulating film IL formed herein has a film thickness larger than that of each of the multi-layer films including the gate insulating film GF, the control gate electrode CG, the silicon dioxide film 502, and the insulating film IF3.

Figure 50:
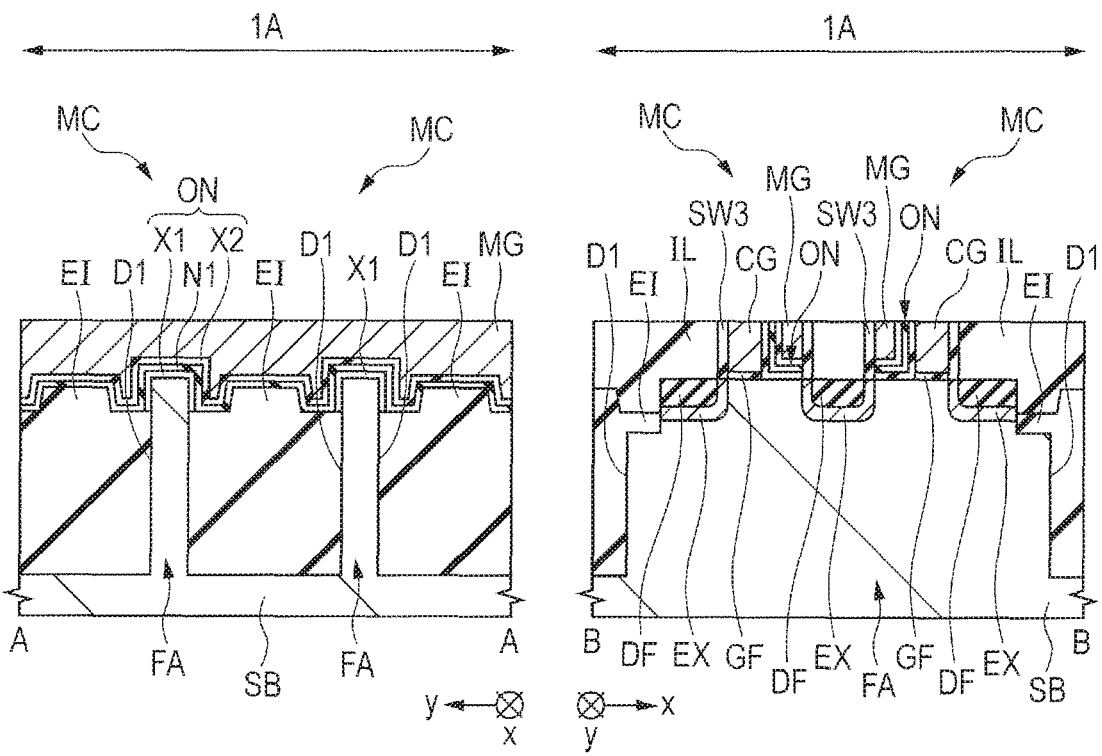
FIG. 50 is a cross-sectional view illustrating the manufacturing process of the semiconductor device, which is subsequent to FIG. 48.
Figure 51:
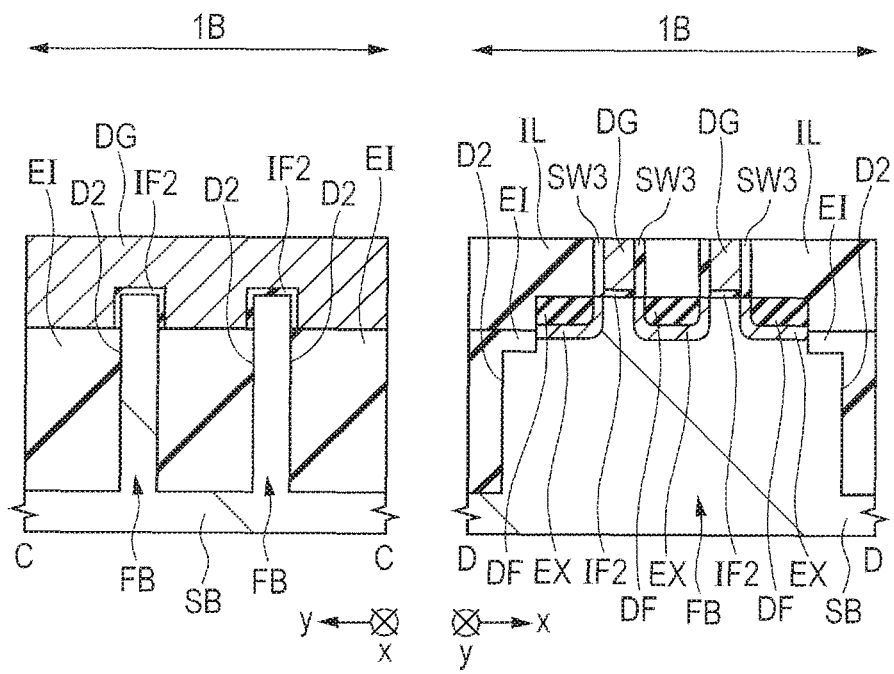
FIG. 51 is a cross-sectional view illustrating the manufacturing process of the semiconductor device, which is subsequent to FIG. 49.

Next, as shown in FIGS. 50 and 51, the upper surface of the interlayer insulating film IL 1 is polished using, e.g. a CMP method to be planarized. In the polishing step, the insulating films IF3 and the sidewalls SW2 are entirely removed and portions of the respective upper parts of the sidewalls SW3 and the ONO films ON are removed to expose the respective upper surfaces of the control gate electrodes CG, the memory gate electrodes MG, and the dummy gate electrodes DG. That is, the respective upper surfaces of the control gate electrodes CG, the memory gate electrodes MG, the dummy gate electrodes DG, the ONO films ON, the sidewalls SW3, and the interlayer insulating film IL are planarized at generally the same plane to have equal heights.

As a result, the control gate electrodes CG and the memory gate electrodes MG which have the exposed upper surfaces and the source/drain regions including the extension regions EX and the diffusion layers DF which are formed on both sides of the patterns each including the control gate electrode CG and the memory gate electrode MG form the split-gate memory cells MC. That is, each of the memory cells MC forms a MONOS nonvolatile memory including the first transistor including the control gate electrode CG and the second transistor including the memory gate electrode MG.

As shown in FIG. 50, the control gate electrodes CG in the memory cell region 1A extend in the y-direction so as pass over the upper parts of the plurality of fins FA immediately over the fins FA and the isolation regions EI. The control gate electrodes CG are formed so as to be embedded in the spaces between the plurality of fins FA projecting from the isolation regions EI. As shown in FIG. 51, the dummy gate electrodes DG in the logic region 1B extend in the y-direction so as to pass over the upper parts of the plurality of fins FB immediately over the fins FB and the isolation regions EI. The dummy gate electrodes DG are formed so as to be embedded in the spaces between the plurality of fins FB projecting from the isolation regions EI.

Figure 52:
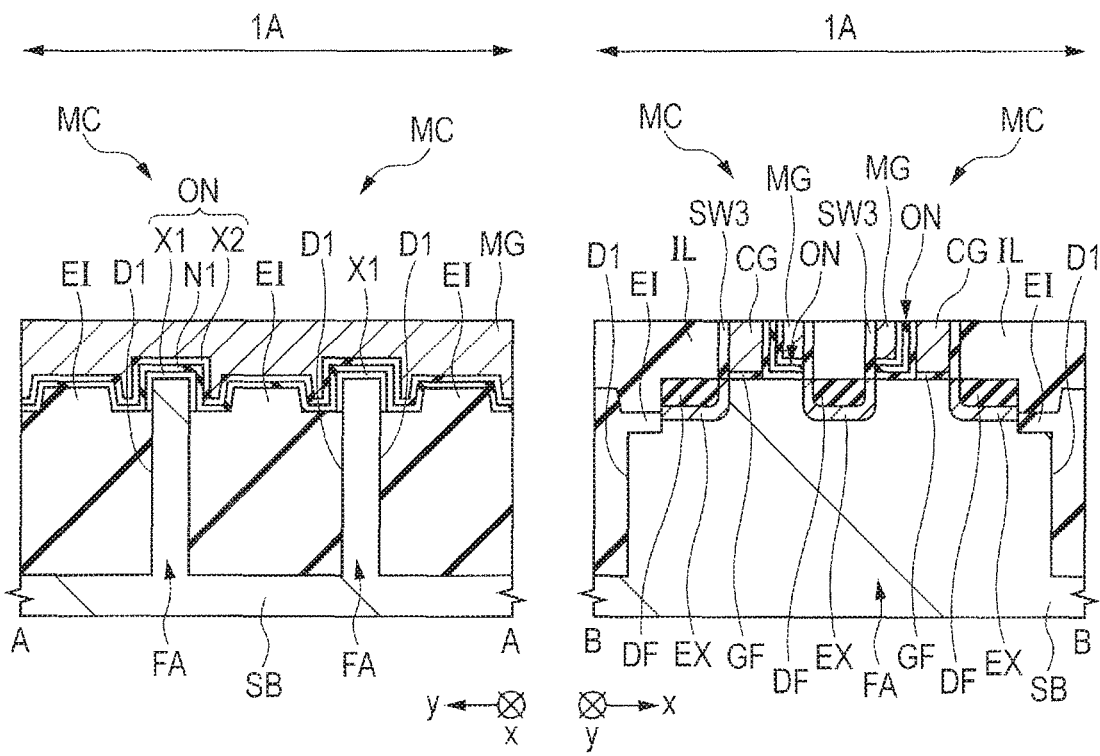
FIG. 52 is a cross-sectional view illustrating the manufacturing process of the semiconductor device, which is subsequent to FIG. 50.
Figure 53:
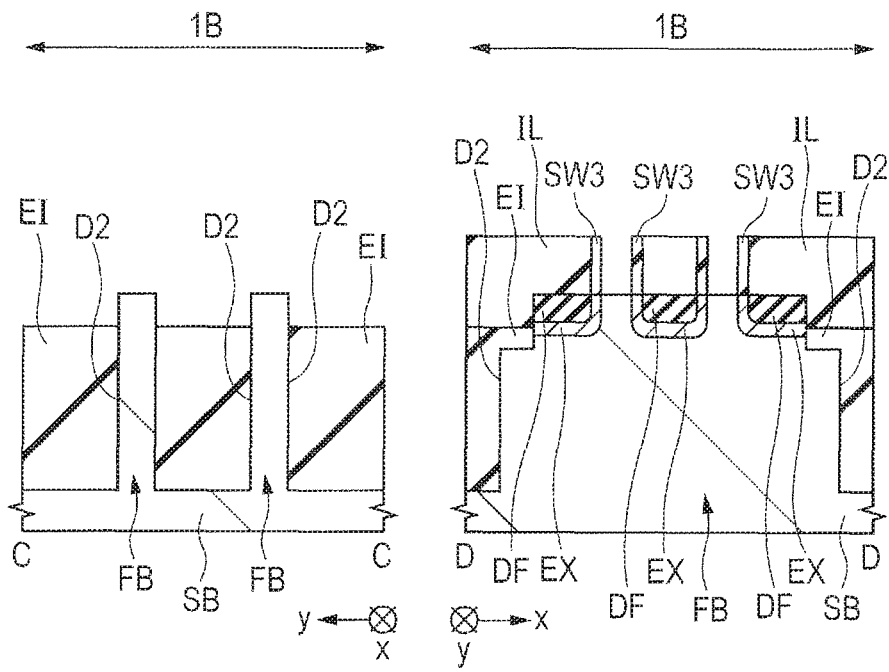
FIG. 53 is a cross-sectional view illustrating the manufacturing process of the semiconductor device, which is subsequent to FIG. 51.

Next, as shown in FIGS. 52 and 53, with the control gate electrodes CG and the memory gate electrodes MG in the memory cell region 1A being protected with a resist pattern (not shown), the dummy gate electrodes DG are removed by wet etching. Subsequently, the insulating films IF2 are removed. It may also be possible not to remove the insulating films IF2 and use the insulating films 12 as portions of the gate insulating films GI formed in the logic region 1B in the subsequent process step. By the foregoing removal step, in the logic region 1B, trenches are formed in the regions from which the dummy gate electrodes DG and the insulating films IF2 have been removed. Then, the foregoing resist pattern is removed from the memory cell region 1A.

Figure 54:
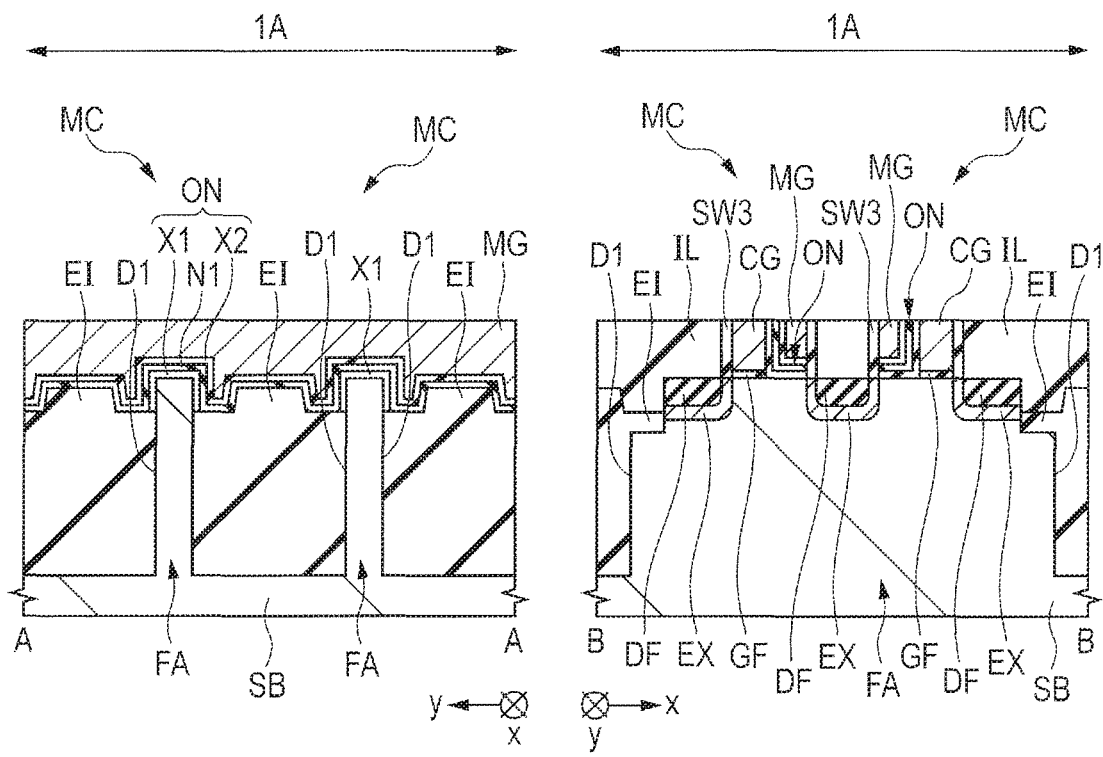
FIG. 54 is a cross-sectional view illustrating the manufacturing process of the semiconductor device, which is subsequent to FIG. 52.
Figure 55:
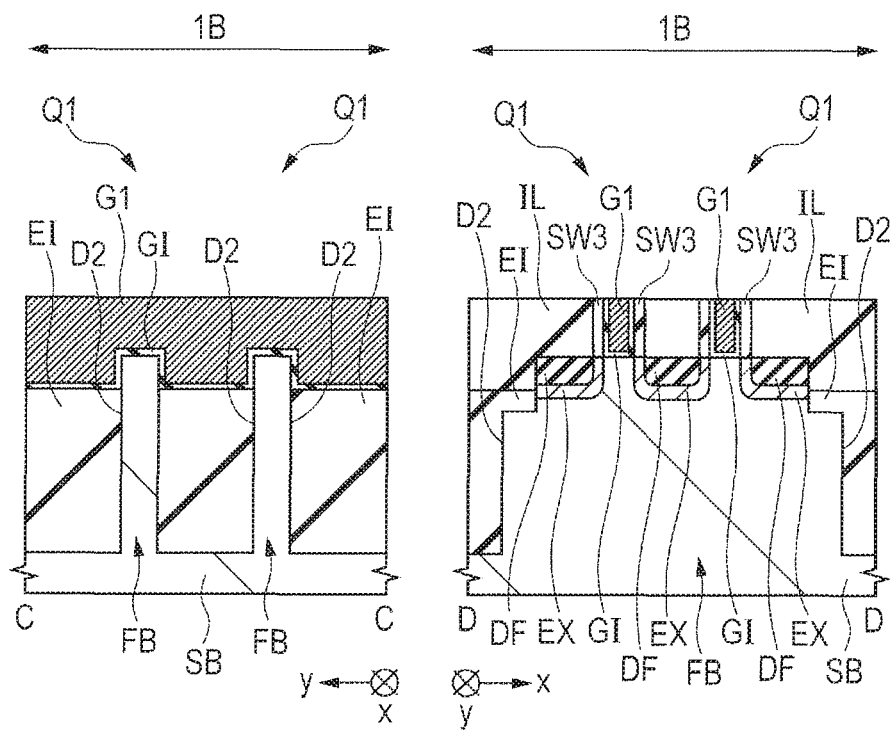
FIG. 55 is a cross-sectional view illustrating the manufacturing process of the semiconductor device, which is subsequent to FIG. 53.

Next, as shown in FIGS. 54 and 55, over the semiconductor substrate SB, an insulating film is formed using, e.g., an ALD (Atomic layer Deposition) method. Then, over the insulating film, a metal film is formed using, e.g., a sputtering method such that a multi-layer film including the insulating film and the metal film is embedded in the foregoing trenches. Then, using, e.g., a CMP method, polishing is performed to remove the extra insulating film and metal film each described above and located over the interlayer insulating film IL and expose the respective upper surfaces of the interlayer insulating films IL, the control gate electrodes CG, and the memory gate electrodes MG. Thus, the gate insulating films GI made of the insulating films embedded in the foregoing trenches and the gate electrodes G1 made of the metal films embedded in the foregoing trenches via the gate insulating films GI are formed.

Each of the gate electrodes G1 and the pair of source/drain regions formed in the fin FB lateral to the gate electrode G1 are included in the transistor Q1. The transistor Q1 is a lower-breakdown-voltage MISFET which is driven with a voltage lower than the respective voltages for driving the first and second transistors and has a metal gate electrode. Examples of the insulating film forming each of the gate insulating films GI include metal oxide films such as a hafnium oxide ($HfO_2$) film, a zirconium oxide ($ZrO_2$) film, an aluminum oxide ($Al_2O_3$) film, a tantalum oxide ($Ta_2O_5$) film, and a lanthanum oxide ($La_2O_3$) film. That is, the gate insulating film GI is a high-k film (high-dielectric-constant film) having a dielectric constant higher than that of a silicon dioxide film.

The foregoing metal film forming each of the gate electrodes G1 is formed of a multi-layer film including, e.g., two layers. The multi-layer film includes first and second metal films which are stacked in order of increasing distance from the semiconductor substrate SB. The first metal film is made of, e.g., a titanium aluminum (TiAl) film. The second metal film is made of, e.g., aluminum (Al). It may also be possible to interpose a titanium (Ti) film, a titanium nitride (TiN) film, or a multi-layer film thereof between the first and second metal films and adjust the threshold voltage of the transistor Q1. Note that, in FIG. 55, the first and second metal films described above are show as one metal film.

In each of the foregoing trenches, the gate insulating film GI covers the bottom surface and side walls of the gate electrode G1 and the bottom surface and side walls of the trench. In the case where the insulating films IF2 are removed in the process step described using FIGS. 52 and 53, an oxidation process may also be performed before the formation of the gate insulating films GI to thus form a new insulating film over the bottom surface of the trench and use the insulating film as a portion of the gate insulating film GI. The description has been given heretofore of the formation of the high-k film after the removal of the dummy gate electrodes DG. However, it may also be possible to form the high-k film before the formation of the polysilicon film SL2 (see FIG. 31) forming the dummy gate electrodes DG and after the process step described using FIG. 23 and leave the high-k film as each of the gate insulating films GI in the logic region 1B.

Figure 56:
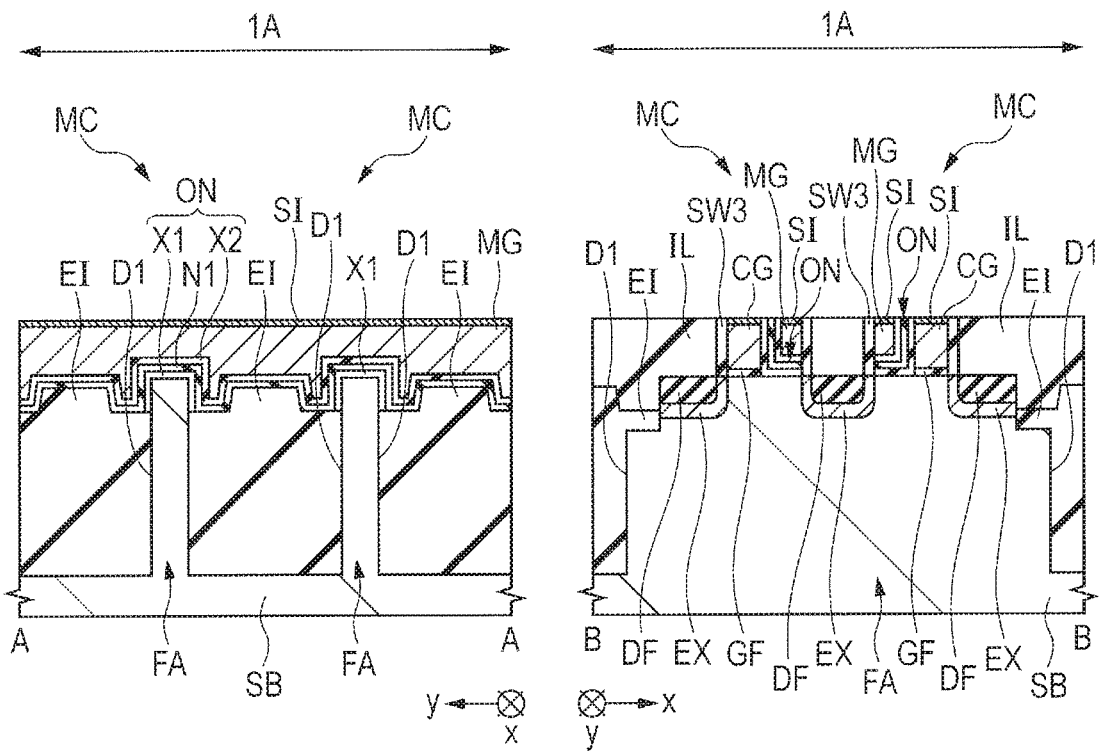
FIG. 56 is a cross-sectional view illustrating the manufacturing process of the semiconductor device, which is subsequent to FIG. 54.

Next, as shown in FIGS. 56 and 57, the upper surfaces of the gate electrodes G1 in the logic region 1B are covered with an insulating film IF4. Then, the silicide layers SI are formed to cover the respective upper surfaces of the control gate electrodes CG and the memory gate electrodes MG.

The insulating film 1F4 is made of silicon dioxide formed by, e.g., a CVD method. The insulating film IF4 is formed herein so as to cover the memory cell region 1A and the logic region 1B. Then, by performing patterning, the insulating film IF4 is removed from the memory cell region 1A. This leaves the insulating film IF4 covering the respective upper surfaces of the interlayer insulating films IL, the sidewalls SW3, and the gate electrodes G1 in the logic region 1B.

Subsequently, over the exposed control gate electrodes CG and the exposed metal gate electrodes MG, a metal film made of nickel (Ni) or cobalt (Co) is formed using, e.g., a sputtering method. Then, heat treatment is performed to cause the metal film to react with the respective upper surfaces of the control gate electrodes CG and the memory gate electrodes MG.

Thus, the silicide layers SI made of nickel silicide (NiSi) or cobalt silicide (CoSi) are formed to cover the respective upper surfaces of the control gate electrodes CG and the memory gate electrodes MG.

Subsequently, the unreacted metal film is removed by wet etching or the like. As a result, the interlayer insulating films IL and the insulating film IF4 are exposed. Since the gate electrodes G1 are covered with the insulating film IF4 herein, it is possible to prevent the gate electrodes G1 as the metal gate electrodes from being removed by the wet etching. Over the gate electrodes G1, the silicide layers SI are not formed.

Then, over the interlayer insulating films IL, the interlayer insulating film is further formed, though not shown. By forming the plurality of contact plugs (coupling portions) extending through these interlayer insulating films and coupled to the control gate electrodes CG, the memory gate electrodes MG, the source/drain regions, and the gate electrodes G1, the semiconductor device according to Embodiment 1 is completed.

Specifically, using, e.g., a CVD method, the interlayer insulating film made of silicon dioxide or the like is formed over the interlayer insulating film IL. Then, by dry etching using a resist pattern as a mask, the plurality of contact holes are formed to extend through a multi-interlayer insulating film including the interlayer insulating film IL and the interlayer insulating film formed thereover. The contact holes are openings which expose the respective upper surfaces of the diffusion layers DF forming the source/drain regions of the memory cells MC, the diffusion layers DF forming the source/drain regions of the transistors Q1, the control gate electrodes CG, the memory gate electrodes MG, and the gate electrodes G1 from the multi-interlayer insulating films. Note that, at the bottom surfaces of the contact holes immediately over the control gate electrodes CG and the memory gate electrodes MG, the upper surfaces of the silicide layers SI are exposed.

Subsequently, using, e.g., a sputtering method or the like, over the multi-interlayer insulating film, a metal film made mainly of, e.g., tungsten (W) is formed as a coupling conductive film to completely fill each of the contact holes. The metal film including a barrier conductor film and a main conductor film is formed herein by forming the barrier conductor film made of, e.g., titanium (Ti), titanium nitride (TiN), or a multi-layer film thereof and then forming the main conductor film made of a tungsten (W) film over the barrier conductor film.

Subsequently, the unneeded metal film over the multi-interlayer insulating film is removed by a CMP method or the like to form the contact plugs embedded in the individual contact holes. The contact plugs are electrically coupled to the control gate electrodes CG, the memory gate electrodes MG, the source/drain regions, and the gate electrodes G1.

Thus, according to Embodiment 1, the upper surfaces of the isolation regions EI in the memory cell region 1A are formed into projecting portions to elongate the path of the trapping insulating film between the memory cells MC adjacent to each other. This can suppress the influence of charge diffusion and improves the reliability of the semiconductor device.

(Modification)

Figure 58:
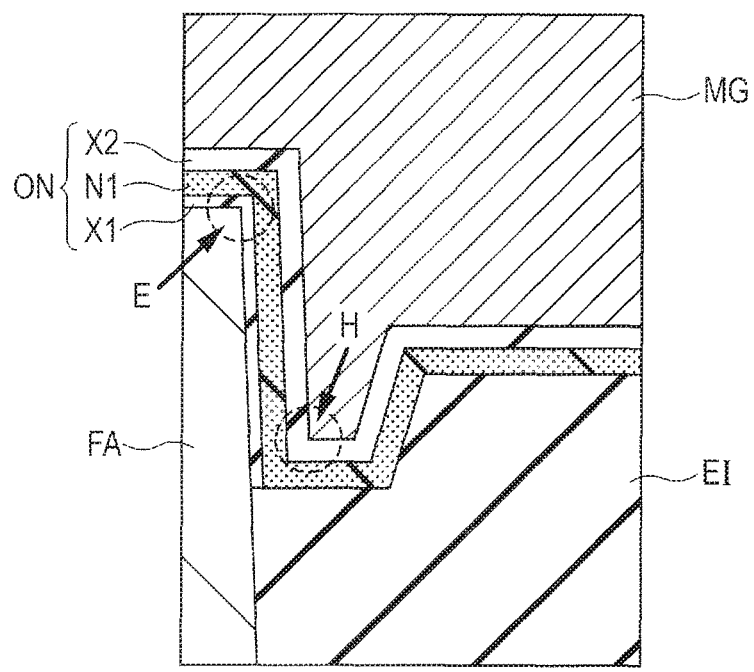
FIG. 58 is an enlarged cross-sectional view along the line A-A in FIG. 1, which shows the memory cell region in the semiconductor device according to Embodiment 1.
Figure 59:
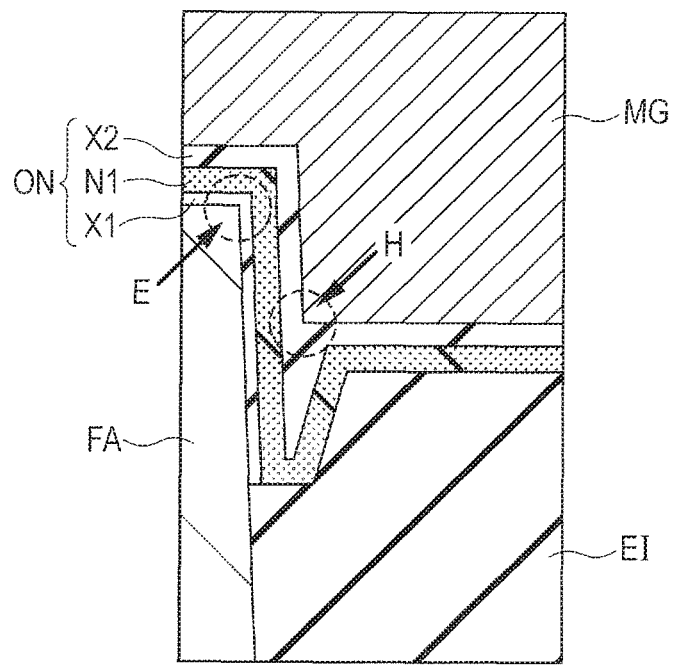
FIG. 59 is an enlarged cross-sectional view along the line A-A in FIG. 1, which shows a memory cell region in the semiconductor device according to a modification of Embodiment 1.

A semiconductor device according to a modification of Embodiment 1 will be described using FIGS. 58 and 59. FIG. 58 is an enlarged cross-sectional view along the line A-A, in FIG. 1, which shows the memory cell region in the semiconductor device according to Embodiment 1. FIG. 59 is an enlarged cross-sectional view along the line A-A in FIG. 1, which shows a memory cell region in the semiconductor device according to the modification of Embodiment 1.

In Embodiment 1 described, above, as shown in FIG. 3, each of the projecting portions formed at the upper surfaces of the isolation regions EI between the fins FA adjacent to each other is formed at a position corresponding to, e.g., a substantially middle portion between the two fins FA and spaced apart from the respective side walls of the two fins FA. Accordingly, as shown in FIG. 58, the upper surface of the ONO film ON has a shape conformal to that of the upper surface of the isolation region EI between the fins FA adjacent to each other. The end portion (region shown by the arrow H in FIG. 58) of the lower part of the memory gate electrode MG at a position opposed to the sidewall of the fin FA with the ONO film ON being interposed therebetween is located below the highest position of the projecting portion of the isolation region EI.

In the modification of Embodiment 1, as shown in FIG. 59, the upper surface of each of the isolation regions EI between the fins FA adjacent to each other has a projecting shape, but the ONO film ON is embedded between the fin FA and the isolation region EI. Consequently, the upper surface of the ONO film ON between the fins FA adjacent to each other is substantially planar. Also, the end portion (region shown by the arrow H in FIG. 59) of the lower part of the memory gate electrode MG at a position opposed to the side wall of the fin FA with the ONO film ON being interposed therebetween is above the highest position of the projecting portion of the isolation region EI.

As described above, to the operation method for performing the "Write" and "Erase" operations to the memory cell, the write operation in accordance with the SSI method and the erase operation in accordance with the FN method can be applied respectively. In the write method in accordance with the SSI method, an electric field and the positions where hot electrons are injected are concentrated on the upper part of the fin FA (region shown by the arrow E in FIGS. 58 and 59). On the other hand, in the erase operation in accordance with the FN method, an electric field and the positions where holes are injected are concentrated on the end portion of the lower part of the memory gate electrode MG (region shown by the arrow H in FIGS. 58 and 59).

However, when the distance between the fin FA and the projecting portion of the isolation region EI decreases and the space between the fin FA and the projecting portion of the isolation region EI is filled with the ONO film ON as in the modification, the end portion of the lower part of the memory gate electrode MG is closer to the upper part of the fin FA. This reduces the probability of a mismatch in rewriting and can improve the efficiency of the rewriting, while allowing a data variation to be suppressed by forming the projecting portions at the upper surfaces of the isolation regions EI.

Embodiment 2

<Structure of Semiconductor Device>

Figure 60:
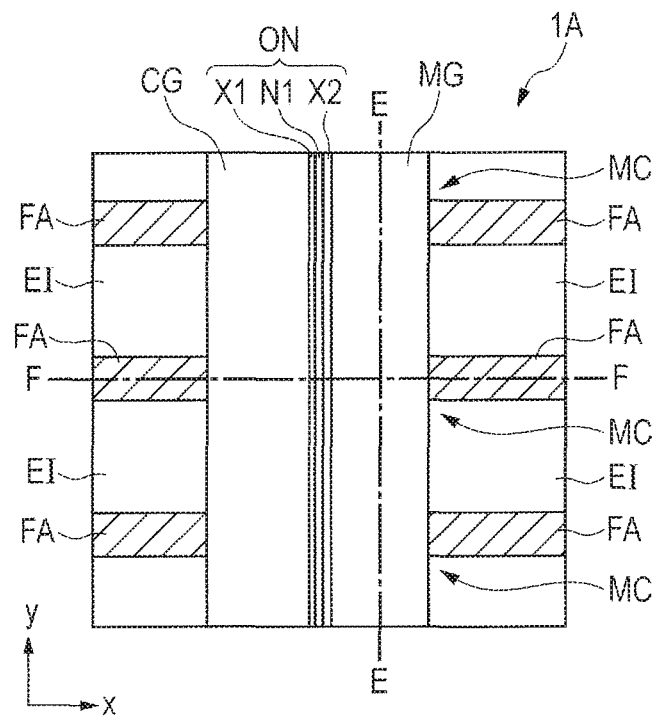
FIG. 60 is a plan view showing a memory cell region in a semiconductor device according to Embodiment 2.

A structure of a semiconductor device according to Embodiment 2 will be described using FIGS. 60 and 61. FIG. 60 is a plan view showing a memory cell region in the semiconductor device according to Embodiment 2. FIG. 6 is a cross-sectional view along the lines E-E and F-F in FIG. 60, which shows the memory cell region in the semiconductor device according to Embodiment 2.

Figure 61:
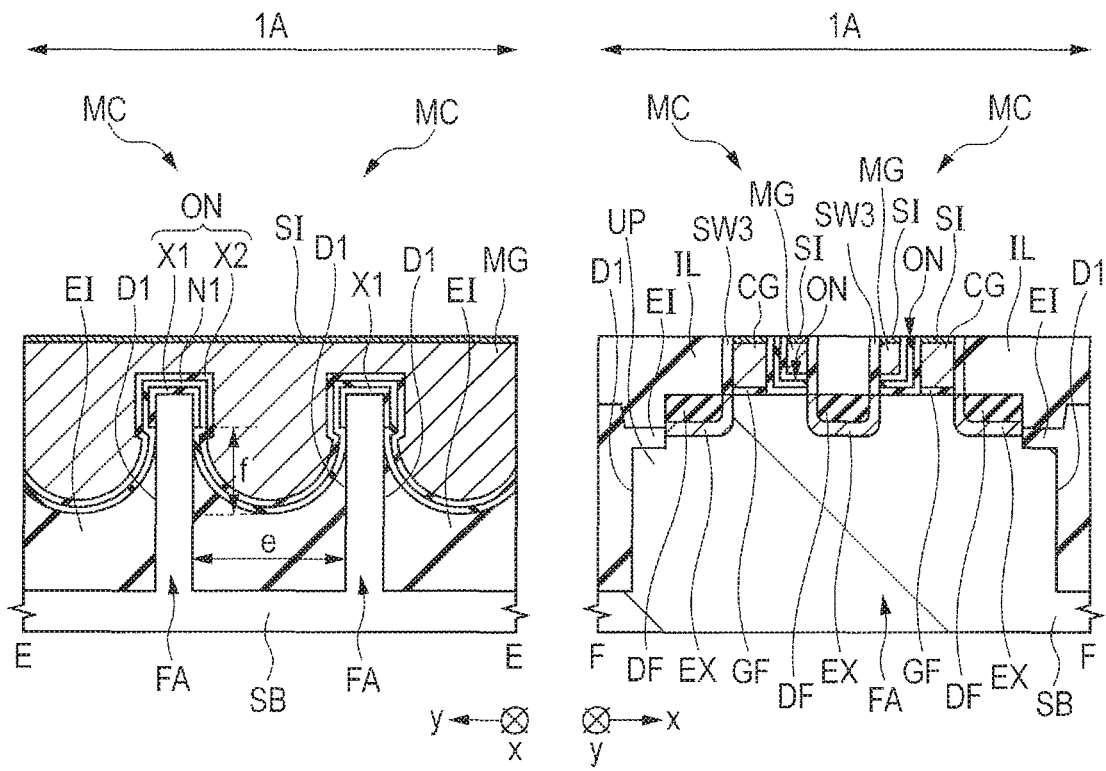
FIG. 61 is a cross-sectional view along the lines E-E and F-F in FIG. 60, which shows the memory cell region in the semiconductor device according to Embodiment 2.

The cross section along the line E-E in FIG. 61 shows a cross section along the extending direction of each of gate electrodes over fins in the memory cell region. The cross section along the line F-F in FIG. 61 shows a cross section along the extending direction of each of the fins in the memory cell region. Note that, in FIG. 60, the illustration of source/drain regions, interlayer insulating films, silicide layers over the respective gate electrodes, and the like is omitted.

The semiconductor device according to Embodiment 2 is different from the semiconductor device according Embodiment 1 described above in the shape of the upper surface of each of the isolation regions EI in the memory cell region 1A. That is, in the semiconductor device according to Embodiment 1 described above, the upper surface of each of the isolation regions EI in the memory cell region 1A has a projecting shape. By contrast, in the semiconductor device according to Embodiment 2, the upper surface of each of the isolation regions EI in the memory cell region 1A has a recessed shape. The configuration of the semiconductor device according to Embodiment 2 is substantially the same as that of the semiconductor device according to Embodiment 1 described above except for the shape of the upper surface of each of the isolation regions EI in the memory cell region 1A. Accordingly, a description will be given below with emphasis on the point different from that in Embodiment 1 described above.

As shown in FIGS. 60 and 61, in the memory cell region 1A, the memory cells MC are formed in and over the upper parts of the plate-like fins FA which are portions of the semiconductor substrate SB and formed in the upper part of the semiconductor substrate SB. Between the plurality of fins FA, the trenches D1 are formed in the upper surface of the semiconductor substrate SB.

The isolation regions EI are insulating films embedded in the trenches D1. However, the trenches DI are not fully filled with the isolation regions EI, and portions of the fins FA project above the upper surfaces of the isolation regions EI. The heights of the fins FA exposed from the upper surfaces of the isolation regions EI are, e.g., about 40 nm to 60 nm. The isolation regions EI are made of, e.g., silicon dioxide.

As shown in FIG. 61, the upper surface of each of the isolation regions EI has a recessed shape in a cross section along the y-direction. In other words, between the fins FA adjacent to each other in the y-direction, a part or the whole of the upper surface of the isolation region EI is at a position lower than that of a surface obtained by connecting the position of the upper surface of the isolation region EI which is in contact with the side wall of one of the fins FA to the position of the upper surface of the isolation region EI which is in contact with the side wall of the other fin FA.

However, when the depth of the recessed portion in the upper surface of each of the isolation regions EI is excessively large, a level difference in the upper surface of the isolation region EI is increased so that a processing process after the formation of the isolation regions EI is difficult. Accordingly, the depth of the recessed portion in the upper surface of the isolation region EI is preferably, e.g., about 40 nm to 80 nm. For example, when the space between the fins FA adjacent to each other in the y-direction is e and the depth of the recessed portion is f, f/e is preferably about 0.4 to 0.8. The depth of the recessed portion mentioned herein is the distance from a surface obtained by connecting the position of the upper surface of the isolation region EI which is in contact with the side wall of one of the fins FA adjacent to each other in the y-direction to the position of the upper surface of the isolation region EI which is in contact with the side wall of the other fin FA to the lowest position of the upper surface of the isolation region EI between the adjacent fins FA.

By thus forming the upper surface of each of the isolation regions EI in the memory cell region 1A into the recessed shape, the path of the trapping insulating film between the memory cells MC adjacent to each other in the y-direction is longer than in the case where the upper surface of the isolation region EI has a planar shape. This can suppress the influence of charge diffusion.

Note that, in Embodiment 2, the upper surface of each of the isolation regions EI in the logic region does not have a recessed shape, but is substantially planar, though the description thereof is omitted. That is, the planarity of the upper surface of the isolation region EI in the logic region 1B is lower than the planarity of the upper surface of the isolation region EI in the memory cell region 1A.

In addition, in the memory cell region 1A, immediately over the plurality of fins FA arranged in the y-direction, the control gate electrodes CG and the memory gate electrodes each extending in the y-direction are formed so as to pass over the fins FA.

The control gate electrodes CS are formed over the upper surfaces and side walls of the fins FA exposed from the upper surfaces of the isolation regions EI via the gate insulating films GF. The gate insulating films GF are made of, e.g., silicon dioxide. The control gate electrodes CG are made of, e.g., polysilicon.

One of the side walls of each of the control gate electrodes CG in the x-direction is covered with the sidewall SW3 while, over the other side wall thereof, the memory gate electrode MG is formed via the ONO film ON. The memory gate electrodes MG are formed over the upper surfaces and side walls of the fins FA exposed from the upper surfaces of the isolation regions EI via the ONO films ON. That is, each of the ONO films ON has an L-shaped cross section formed continuously along the upper surface of the fin FA and the side walls of the control gate electrodes CG. The memory gate electrodes MG are insulated from the control gate electrodes CG and the fins FA by the ONO films ON.

<Characteristic Features and Effects of Semiconductor Device>

The main characteristic feature of the semiconductor device according to Embodiment 2 is that the upper surface of each of the isolation regions EI in the memory cell region 1A is formed into a recessed shape.

In the semiconductor device according to Embodiment 2, the upper surface of each of the isolation regions EI in the memory cell region 1A is formed into the recessed shape. Thus, the path of the silicon nitride film N1 (trapping insulating film) between the memory cells MC adjacent to each other in the y-direction is elongated. That is, when the recessed portion is formed, the path of the silicon nitride film N1 is longer and the charge diffusion distance is longer than when the recessed portion is not formed. This can suppress a data variation via the path of the silicon nitride film N1 between the memory cells MC adjacent to each other in the y-direction. Therefore, the reliability of the semiconductor device can be improved.

(Manufacturing Method of Semiconductor Device)

A description will be given of a manufacturing method of the semiconductor device (memory cell region) according to Embodiment 2 using FIGS. 62 to 67. FIGS. 62 to 67 are cross-sectional views illustrating the manufacturing process of the semiconductor device (memory cell region) according to Embodiment 2, which are cross-sectional views along the line E-E in FIG. 60.

Figure 62:
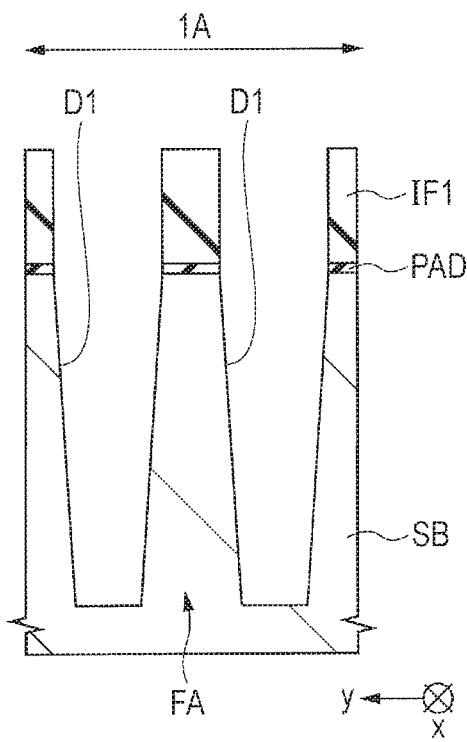
FIG. 62 is a cross-sectional view along the line E-E in FIG. 60, which illustrates the manufacturing process of the semiconductor device (memory cell region) according to Embodiment 2.

First, as shown in FIG. 62, in the memory cell region 1A, the fins FA made of portions of the semiconductor substrate SB including the upper surface thereof and the trenches D1 around the fins FA are formed. The depth of each of the trenches D1 is, e.g., about 120 nm to 250 nm.

Note that the manufacturing process up to the formation of the trenches D1 is substantially the same as in Embodiment 1 described above (see FIGS. 6 to 12) so that a description thereof is omitted.

Figure 63:
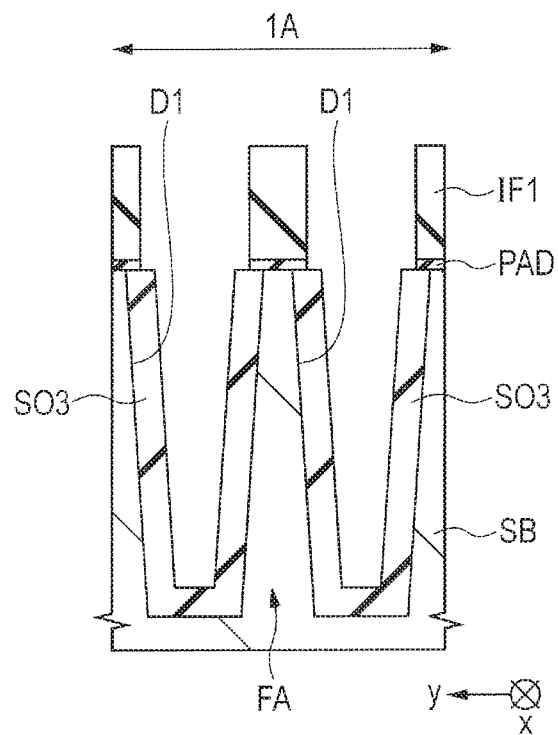
FIG. 63 is a cross-sectional view illustrating the manufacturing process of the semiconductor device, which is subsequent to FIG. 62.
Figure 64:
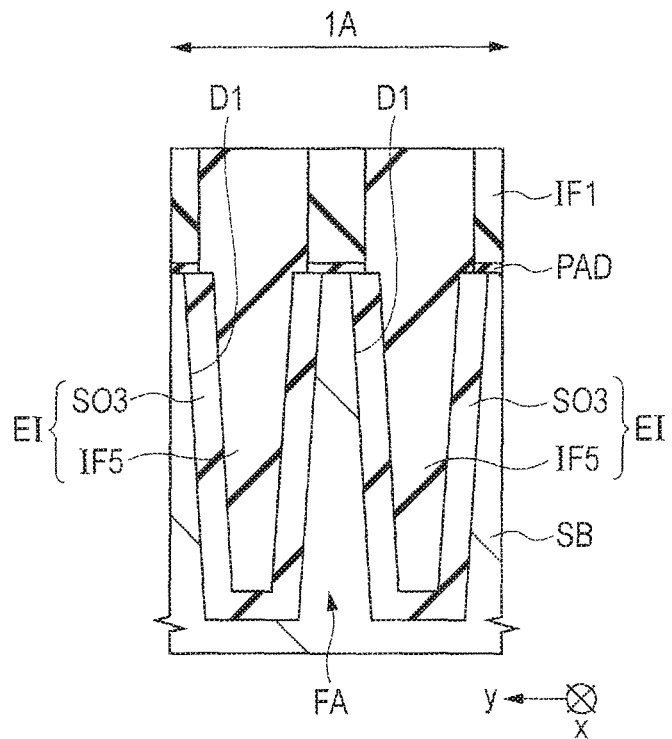
FIG. 64 is a cross-sectional view illustrating the manufacturing process of the semiconductor device, which is subsequent to FIG. 63.

Next, as shown in FIG. 63, over the bottom surface and side wall of each of the trenches D1, an oxide film SO3 is formed using, e.g., a thermal oxidation method. The oxide film SO3 is made of, e.g., silicon dioxide and has a thickness of, e.g., about 10 nm to 20 nm.

Next, as shown in FIG. 54, an insulating film IF5 is embedded in the trenches D1 using, e.g., a CVD method. The insulating film IF5 is made of, e.g., silicon dioxide. Then, using, e.g., a CMP method, the insulating film IF5 is polished. Thus, the upper surface of the insulating film IF1 is exposed and the upper surface of the insulating film IF1 and the upper surface of the insulating film IF5 embedded in the trenches D1 are planarized. The oxide film SO3 and the insulating film IF5 embedded in the trenches D1 form the isolation regions EI.

Figure 65:
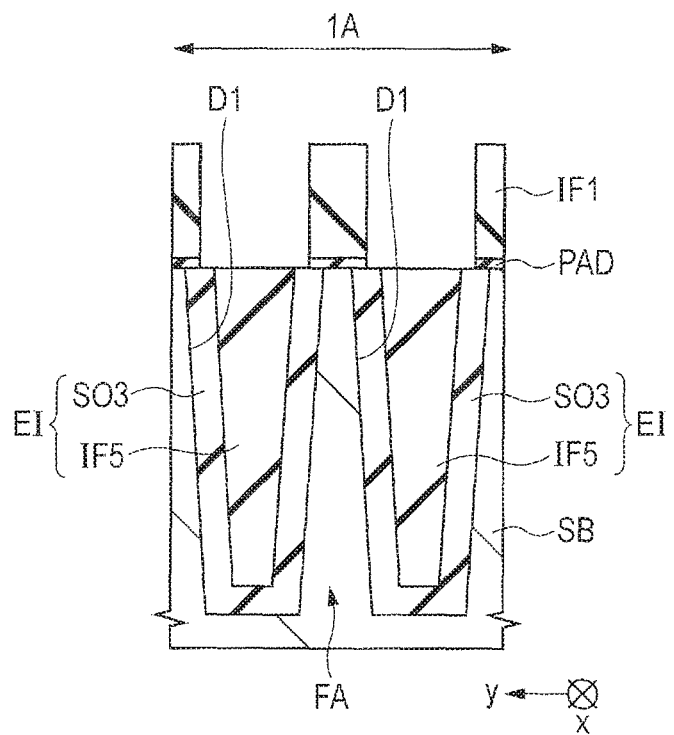
FIG. 65 is a cross-sectional view illustrating the manufacturing process of the semiconductor device, which is subsequent to FIG. 64.

Next, as shown in FIG. 65, the upper surfaces of the insulating films IF5 are recessed by an etch-back process to expose the side walls of the insulating film IF1 from the isolation regions EI. For the etch-back process, either wet etching or dry etching may be used.

Figure 66:
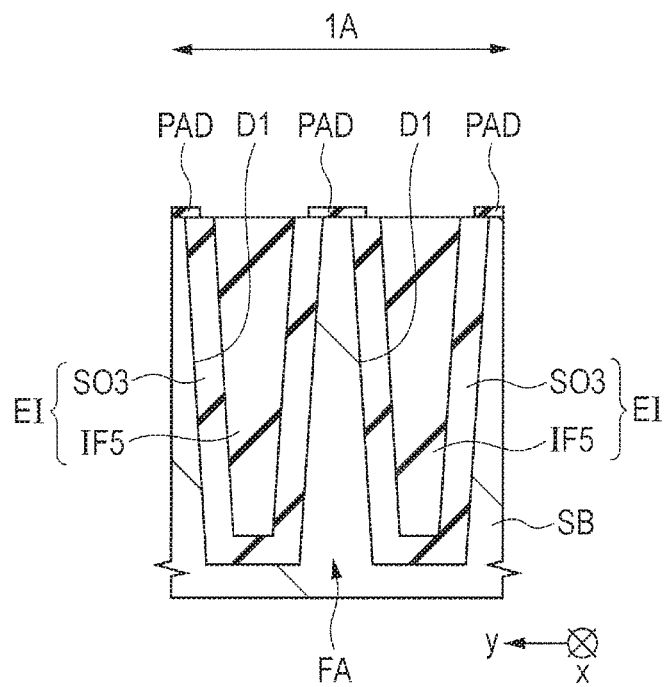
FIG. 66 is a cross-sectional view illustrating the manufacturing process of the semiconductor device, which is subsequent to FIG. 65.

Next, as shown in FIG. 66, the insulating film IF1 is removed by wet etching to expose the oxide films PAD over the upper surfaces of the fins FA. At this process stage, in the memory cell region 1A, the width of each of the fins FA in the y-direction is, e.g., about 20 nm to 50 nm and the width of each of the isolation regions EI in the y-direction is, e.g., 90 nm.

Figure 67:
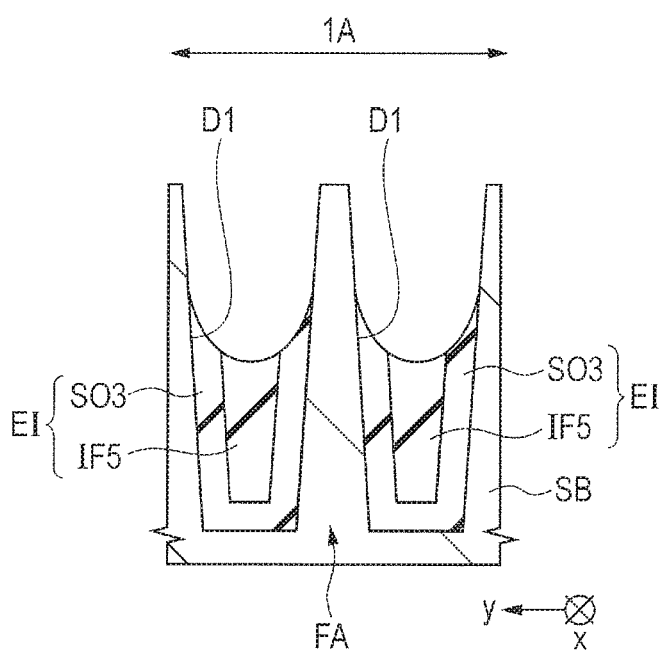
FIG. 67 is a cross-sectional view illustrating the manufacturing process of the semiconductor device, which is subsequent to FIG. 66.

Next, as shown in FIG. 67, the oxide pads PAD are removed using wet etching to recess the upper surfaces of the isolation regions EI and thus expose the side walls of the fins FA from the isolation regions EI.

The etching rate of the oxide film SO3 formed using the thermal oxidation method is lower than the etching rate of the insulating films IF5 formed using the CVD method. Accordingly, the wet etching of the insulating films IF5 proceeds faster than the wet etching of the oxide films SO3. As a result, the upper surface of each of the isolation regions EI has a recessed shape in a cross section along the y-direction. However, when the depth of the recessed portion in the upper surface of the isolation region EI is excessively large, a level difference in the upper surface of the isolation region EI increases so that, after the formation of the isolation regions EI, a processing process is difficult. Accordingly, the depth of the recessed portion in the upper surface of each of the isolation regions EI is preferably, e.g., about 40 nm to 80 nm. The height of each of the fins FA exposed from the upper surfaces of the isolation regions EI e.g., about 40 nm to 60 nm.

One of the main characteristic features of Embodiment 2 is that, by forming the upper surface of each of the isolation regions EI in the memory cell region 1A into the recessed shape, the path of the trapping insulating film between the memory cells adjacent to each other in the y-direction in the memory cell region 1A is elongated to suppress the influence of charge diffusion.

Subsequently, by forming the control gate electrodes CG, the gate insulating films GF, the memory gate electrodes MG, the ONO films ON, the source/drain regions, the silicide layers SI, and the like in the same manner as in Embodiment 1 described above, the semiconductor device is generally completed.

Thus, according to Embodiment by forming the upper surface of each of the isolation regions ET in the memory cell region 1A into the recessed shape, between the memory cells MC adjacent to each other, the path of the trapping insulating film is elongated. This can suppress the influence of charge diffusion and improves the reliability of the semiconductor device.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

The present invention includes at least the following embodiments.

(Note 1)

A method of manufacturing a semiconductor device, including the steps of:

(a) forming a first insulating film over a main surface of a semiconductor substrate;

(b) sequentially processing the first insulating film and the semiconductor substrate to form a plurality of trenches and thus form a plurality of projecting portions which are made of portions of the semiconductor substrate extending in a first direction along the main surface of the semiconductor substrate and spaced apart from each other in a second direction orthogonal to the first direction along the main surface of the semiconductor substrate;

(c) forming a first oxide film over a top surface of the semiconductor substrate exposed in each of the trenches using a thermal oxidation method;

(d) embedding a second oxide film in each of the trenches using a CVD method;

(e) planarizing an upper surface of the first insulating film and an upper surface of the second oxide film;

(f) recessing the second oxide film to expose a side wall of the first insulating film;

(g) removing the first insulating film;

(h) recessing respective upper surfaces of the first and second oxide films using wet etching to expose side walls of the projecting portions;

(i) forming a first gate electrode extending in the second direction such that a second insulating film is interposed between the first gate electrode and each of respective upper surfaces and side walls of upper parts of the projecting portions which are exposed from the respective upper surfaces of the first and second oxide films; and (j) forming a second gate electrode extending in the second direction such that a third insulating film including a trapping insulating film is interposed between the second gate electrode and each of the respective upper surfaces and side walls of the upper parts of the projecting portions which are exposed from the respective upper surfaces of the first and second oxide films and one of side walls of the first gate electrode, wherein, between the projecting portions adjacent to each other in the second direction, an upper surface of the second oxide film is lower in level than a first surface obtained by connecting a position of the upper surface of the first oxide film which is in contact with a side wall of one of the projecting portions to a position of the upper surface of the first oxide film which is in contact with a side wall of the other projecting portion.

(Note 2)

The method of manufacturing the semiconductor device according to Note 1, wherein, when a width of the first surface in the second direction is W and a distance from the first surface to a lowest position of the upper surface of the second oxide film is D, D/W is 0.4 to 0.8.

(Note 3)

The method of manufacturing the semiconductor device according to Note 1, wherein a distance from the first surface to a lowest position of the upper surface of the second oxide film is 40 nm to 60 nm.

What is claimed is:

1. A method of manufacturing a semiconductor device, the method comprising:

(a) forming a first insulating film having a first thickness over a main surface of a semiconductor substrate and then forming a second insulating film having a second thickness larger than the first thickness over the first insulating film;

(b) sequentially processing the second insulating film, the first insulating film, and the semiconductor substrate to form a plurality of trenches and to form a plurality of projecting portions which include portions of the semiconductor substrate extending in a first direction along the main surface of the semiconductor substrate and are spaced apart from each other in a second direction orthogonal to the first direction along the main surface of the semiconductor substrate;

(c) depositing a third insulating film over the main surface of the semiconductor substrate such that the third insulating film is embedded in the trenches;

(d) planarizing an upper surface of the third insulating film and an upper surface of the second insulating film;

(e) removing the second insulating film;
(f) performing isotropic dry etching to remove the first insulating film, expose respective upper surfaces of the projecting portions, recess an upper surface and a side surface of the third insulating film, and expose respective side walls of the projecting portions from the upper surface of the third insulating film;
(g) forming a first gate electrode extending in the second direction such that a fourth insulating film is interposed between the first gate electrode and each of the respective upper surfaces and side walls of the projecting portions which are exposed from the upper surface of the third insulating film; and
(h) forming a second gate electrode extending in the second direction such that a fifth insulating film including a trapping insulating film is interposed between the second gate electrode and each of the respective upper surfaces and side walls of the projecting portions which are exposed from the upper surface of the third insulating film and one of side walls of the first gate electrode,
wherein, between the projecting portions adjacent to each other in the second direction, a portion of the upper surface of the third insulating film is higher in level than a first surface obtained by connecting a position of the upper surface of the third insulating film which is in contact with the side wall of one of the projecting portions to a position of the upper surface of the third insulating film which is in contact with the side wall of other projecting portion.

2. The method of manufacturing the semiconductor device according to claim 1, wherein, in the (a), the second insulating film having a multi-layer structure including a first silicon nitride film, a silicon dioxide film, and a second silicon nitride film is formed, and
wherein the (e) includes:
(e1) removing the second silicon nitride film;
(e2) performing isotropic dry etching to remove the silicon dioxide film and recess the upper surface and side surface of the third insulating film; and
(e3) removing the first silicon nitride film.

3. The method of manufacturing the semiconductor device according to claim 1, further including, between the (e) and the (f):
(i) performing etching to recess the upper surface of the third insulating film.

4. The method of manufacturing the semiconductor device according to claim 1, wherein, when a width of the first surface in the second direction is W and a distance from the first surface to a highest position of the upper surface of the third insulating film is H, H/W is in a range from 0.2 to 0.5.

5. The method of manufacturing the semiconductor device according to claim 1, wherein a distance from the first surface to a highest position of the upper surface of the third insulating film is in a range from 20 nm to 30 nm.

* * * * *